US012690335B2

(12) United States Patent
Okazaki et al.

(10) Patent No.: US 12,690,335 B2
(45) Date of Patent: Jul. 21, 2026

(54) DISPLAY DEVICE COMPRISING A FIRST EL LAYER AND A SECOND EL LAYER

(71) Applicant: SEMICONDUCTOR ENERGY LABORATORY CO., LTD., Atsugi (JP)

(72) Inventors: Kenichi Okazaki, Atsugi (JP); Shingo Eguchi, Atsugi (JP); Hiroki Adachi, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 282 days.

(21) Appl. No.: 18/260,847

(22) PCT Filed: Jan. 6, 2022

(86) PCT No.: PCT/IB2022/050072
§ 371 (c)(1),
(2) Date: Jul. 10, 2023

(87) PCT Pub. No.: WO2022/153143
PCT Pub. Date: Jul. 21, 2022

(65) Prior Publication Data
US 2024/0057402 A1 Feb. 15, 2024

(30) Foreign Application Priority Data

| | | |
|---|---|---|
| Jan. 14, 2021 | (JP) | 2021-004031 |
| Jan. 28, 2021 | (JP) | 2021-011800 |
| Oct. 20, 2021 | (JP) | 2021-171640 |

(51) Int. Cl.
*H10K 59/124* (2023.01)
*H10K 59/122* (2023.01)
(Continued)

(52) U.S. Cl.
CPC ......... *H10K 59/122* (2023.02); *H10K 59/124* (2023.02); *H10K 59/351* (2023.02);
(Continued)

(58) Field of Classification Search
CPC .. H10K 59/122; H10K 59/124; H10K 59/351; H10K 50/10; H10K 59/8722
See application file for complete search history.

(56) References Cited

U.S. PATENT DOCUMENTS

| | | | |
|---|---|---|---|
| 5,953,985 A | 9/1999 | Kobayashi | |
| 6,120,338 A | 9/2000 | Hirano et al. | |
| | (Continued) | | |

FOREIGN PATENT DOCUMENTS

| | | |
|---|---|---|
| CN | 101322440 A | 12/2008 |
| CN | 102738077 A | 10/2012 |
| | (Continued) | |

OTHER PUBLICATIONS

International Search Report (Application No. PCT/IB2022/050072) Dated May 17, 2022.
(Continued)

*Primary Examiner* — Tracie Y Green
(74) *Attorney, Agent, or Firm* — Fish & Richardson P.C.

(57) ABSTRACT

A display device with high display quality is provided. A highly reliable display device is provided. A display device with low power consumption is provided. A display device that can easily achieve a higher resolution is provided. A display device with both high display quality and a high resolution is provided. A display device with high contrast is provided. The display device includes an insulating layer, a first lower electrode, a first EL layer over the first lower electrode, a second lower electrode, a second EL layer over the second lower electrode, and an upper electrode over the first EL layer, over the second EL layer, and over the
(Continued)

insulating layer. The first EL layer includes a first light-emitting layer, the second EL layer includes a second light-emitting layer, the first EL layer and the second EL layer are adjacent to each other, the insulating layer includes a resin or a precursor of the resin, and the insulating layer includes a region sandwiched between a first end face of the first EL layer and a second end face of the second EL layer.

20 Claims, 39 Drawing Sheets

(51) Int. Cl.
| | | |
|---|---|---|
| *H10K 59/35* | (2023.01) | |
| *H10K 50/10* | (2023.01) | |
| *H10K 59/80* | (2023.01) | |

(52) U.S. Cl.
CPC ........... *H10K 50/10* (2023.02); *H10K 59/871* (2023.02); *H10K 59/8722* (2023.02); *H10K 59/873* (2023.02)

(56) References Cited

U.S. PATENT DOCUMENTS

| | | | |
|---|---|---|---|
| 7,399,991 B2 | 7/2008 | Seo et al. | |
| 7,663,149 B2 | 2/2010 | Seo et al. | |
| 7,923,926 B2 | 4/2011 | Terada et al. | |
| 8,877,532 B2 | 11/2014 | Hiroki et al. | |
| 10,141,525 B2 | 11/2018 | Ito et al. | |
| 10,879,327 B2 | 12/2020 | Tanaka et al. | |
| 2002/0072139 A1 | 6/2002 | Kashiwabara | |
| 2009/0278443 A1 | 11/2009 | Terada et al. | |
| 2011/0148290 A1 | 6/2011 | Oota | |
| 2012/0252149 A1 | 10/2012 | Hiroki et al. | |
| 2012/0252150 A1 | 10/2012 | Hiroki et al. | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2014/0197394 A1 | 7/2014 | Otsuka et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0126500 A1* | 5/2016 | Uesaka | H10K 50/131 |
| | | | 257/89 |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0190908 A1 | 7/2018 | Ke et al. | |
| 2019/0157619 A1 | 5/2019 | Lee et al. | |
| 2019/0305066 A1* | 10/2019 | Inoue | H01L 23/544 |
| 2020/0013839 A1 | 1/2020 | Tanaka et al. | |
| 2020/0043998 A1 | 2/2020 | Choi et al. | |
| 2020/0057330 A1* | 2/2020 | Yamazaki | H10K 59/50 |
| 2020/0176521 A1 | 6/2020 | Cho et al. | |
| 2020/0203662 A1 | 6/2020 | Mollard et al. | |
| 2020/0373459 A1* | 11/2020 | Han | H10K 59/80521 |
| 2022/0130918 A1 | 4/2022 | Yamazaki et al. | |
| 2023/0309334 A1* | 9/2023 | Zhang | H10K 50/15 |

FOREIGN PATENT DOCUMENTS

| | | |
|---|---|---|
| CN | 102738201 A | 10/2012 |
| CN | 106847858 A | 6/2017 |
| CN | 110854155 A | 2/2020 |
| CN | 111261791 A | 6/2020 |
| DE | 102016111712 | 5/2017 |
| JP | 2000-036385 A | 2/2000 |
| JP | 2002-324673 A | 11/2002 |
| JP | 2003-059663 A | 2/2003 |
| JP | 2008-098106 A | 4/2008 |
| JP | 2008-147072 A | 6/2008 |
| JP | 2008-251270 A | 10/2008 |
| JP | 2009-087623 A | 4/2009 |
| JP | 2011-210614 A | 10/2011 |
| JP | 2012-216501 A | 11/2012 |
| JP | 2014-120218 A | 6/2014 |
| JP | 2014-133727 A | 7/2014 |
| JP | 2014-135251 A | 7/2014 |
| JP | 2014-150057 A | 8/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-140940 A | 9/2020 |
| JP | 2020-160305 A | 10/2020 |
| KR | 2012-0112074 A | 10/2012 |
| KR | 2012-0112075 A | 10/2012 |
| KR | 2017-0049146 A | 5/2017 |
| KR | 2020-0014463 A | 2/2020 |
| KR | 2020-0066773 A | 6/2020 |
| TW | 201240077 | 10/2012 |
| TW | 201240078 | 10/2012 |
| TW | 202042423 | 11/2020 |
| WO | WO-2007/066573 | 6/2007 |
| WO | WO-2018/087625 | 5/2018 |

OTHER PUBLICATIONS

Written Opinion (Application No. PCT/IB2022/050072) Dated May 17, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW'20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

(56) References Cited

OTHER PUBLICATIONS

Taiwanese Office Action (Application No. 110149387) Dated Dec. 12, 2025.

* cited by examiner 101          112Rf          144a          146a          111f 101   145a   147a   112R          111f 101   145a   147a   112R          144b   146b   112Gf          111f 101   145a   147a   112R   145b   147b   112G          111f 101   145a   147a   112R   145b   147b   112G   144c   146c   112Bf   111f 101   145a   147a   112R   145b   147b   112G   145c   147c   112B   111f 101   145a  112R  111R  145b  112G  111G  145c  112B  111B 101   145a  112R  111R  145b  112G  111G  145c  112B  111B 101   145a  112R  111R  145b  112G  111G  145c  112B  111B 101   112R  111R   112G  111G   112B  111B 101   112R  111R   112G  111G   112B  111B 101          111R          111G          111B 147a          147b          147c 101  145a  112R  111R  145b  112G  111G  145c  112B  111B 147a          131          147b          147c 101  145a  112R  111R  145b  112G  111G  145c  112B  111B

131

101          112R  111R          112G  111G          112B  111B

100

131          121          113

101          112R  111R          112G  111G          112B  111B

100

100A

FIG. 8A
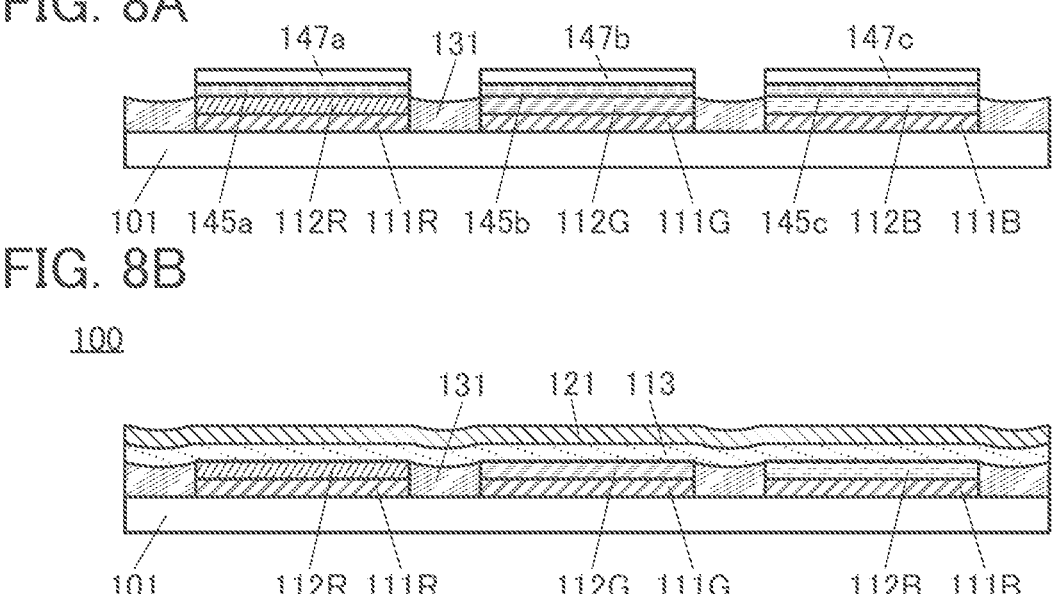
101  145a  112R  111R  145b  112G  111G  145c  112B  111B
FIG. 8B
100
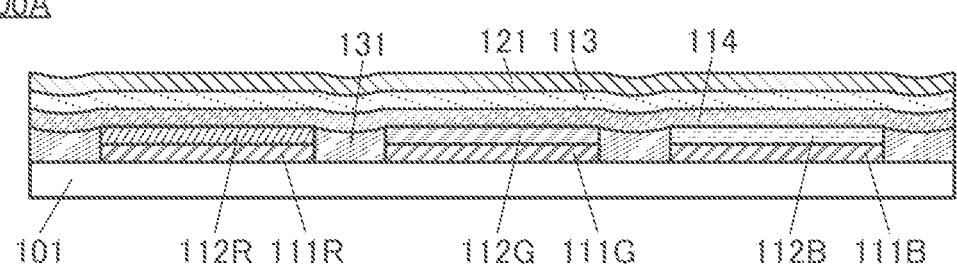
101  112R  111R  112G  111G  112B  111B
FIG. 8C
100A
101  112R  111R  112G  111G  112B  111B

100

100A

100B 131    121    113

101    115R    112R    111R    115G    112G    111G    115B    112B    111B

100C 131    121    113        114

101    115R    112R    111R    115G    112G    111G    115B    112B    111B

100

100

101     112Rf     144a    146a       111f 101   145a   147a   112R       111f 101   145a   147a   112R    144b   146b   112Gf     111f 101   145a   147a   112R   145b   147b   112G     111f 101   145a   147a   112R   145b   147b   112G   144c   146c   112Bf 111f 101   145a   147a   112R   145b   147b   112G   145c   147c   112B   111f 147a　147b　147c 101　145a　112R　111R　145b　112G　111G　145c　112B　111B 147a　147b　147c　130f 101　145a　112R　111R　145b　112G　111G　145c　112B　111B 147a　131f　147b　147c　130f 101　145a　112R　111R　145b　112G　111G　145c　112B　111B 147a　131　147b　130　147c 101　145a　112R　111R　145b　112G　111G　145c　112B　111B 131　130

101　112R　111R　112G　111G　112B　111B

100

131　121　130　113

101　112R　111R　112G　111G　112B　111B

FIG. 15A
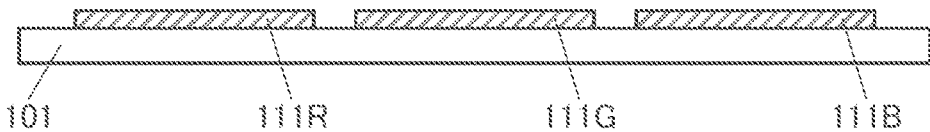
101　　　　　111R　　　　　111G　　　　　111B
FIG. 15B
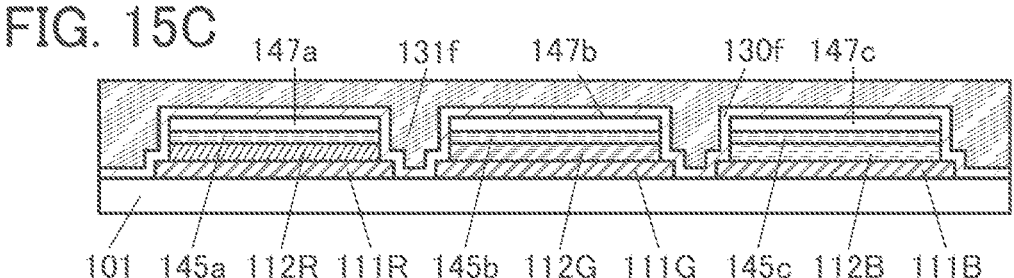
147a　　　　　147b　　　　　147c
101　145a　112R　111R　145b　112G　111G　145c　112B　111B
FIG. 15C
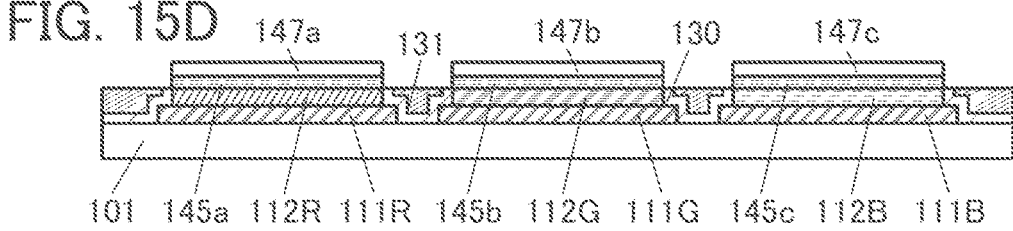
147a　131f　147b　130f　147c
101　145a　112R　111R　145b　112G　111G　145c　112B　111B
FIG. 15D
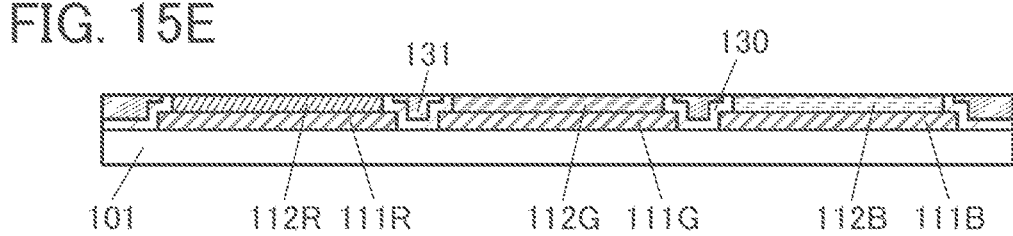
147a　131　147b　130　147c
101　145a　112R　111R　145b　112G　111G　145c　112B　111B
FIG. 15E
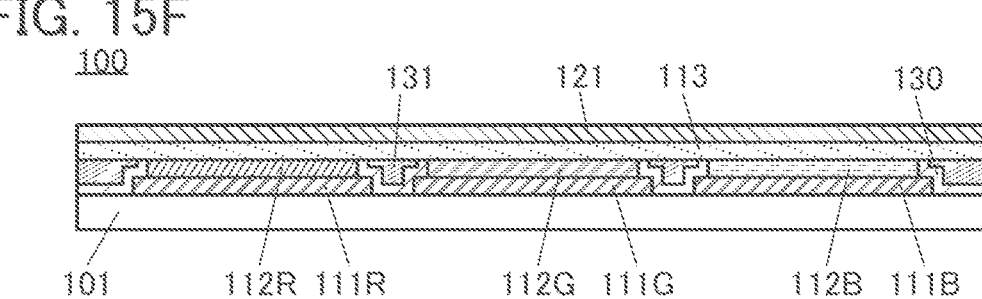
131　　　　　130
101　　　112R　111R　　　112G　111G　　　112B　111B
FIG. 15F
100　　131　121　113　　130
101　　　112R　111R　　　112G　111G　　　112B　111B 101  145a  112R  111R  145b  112G  111G  145c  112B  111B 101  145a  112R  111R  145b  112G  111G  145c  112B  111B 101  145a  112R  111R  145b  112G  111G  145c  112B  111B 101  112R  111R  112G  111G  112B  111B

FIG. 37A
FIG. 37B
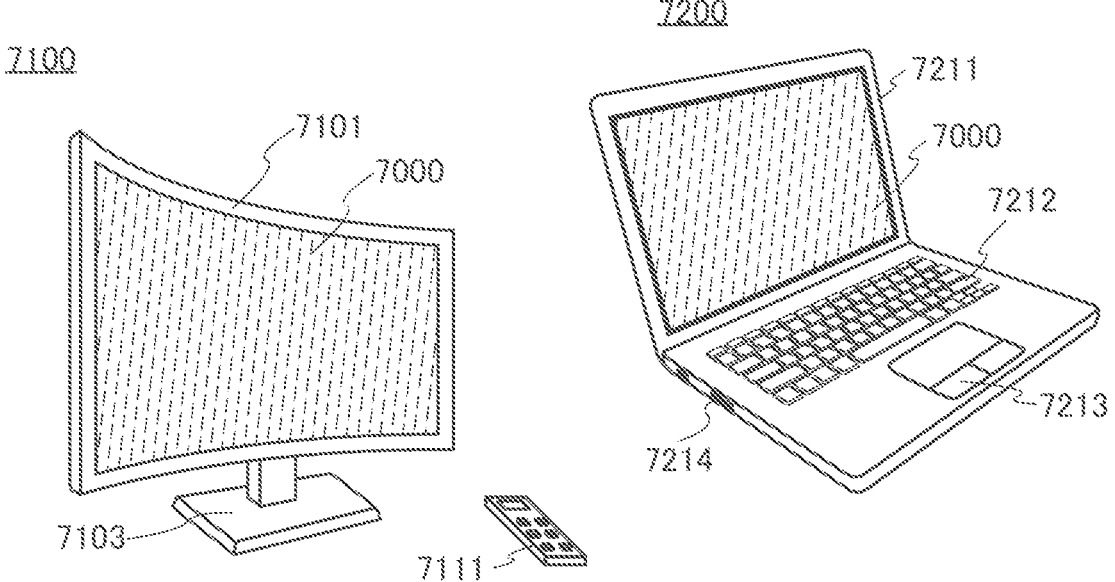
FIG. 37C
FIG. 37D
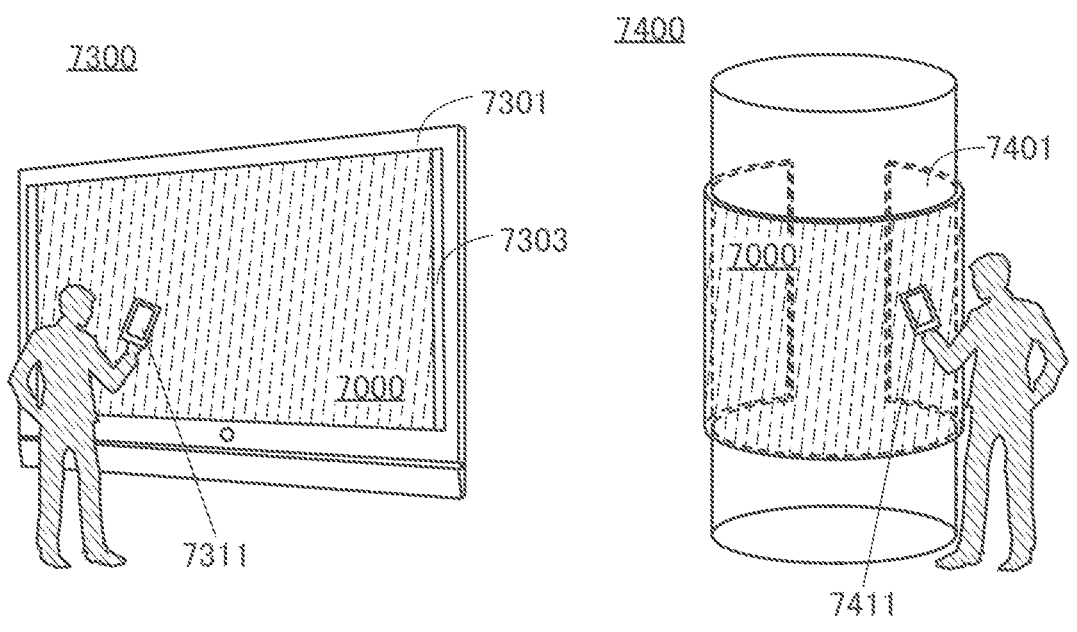

FIG. 38A
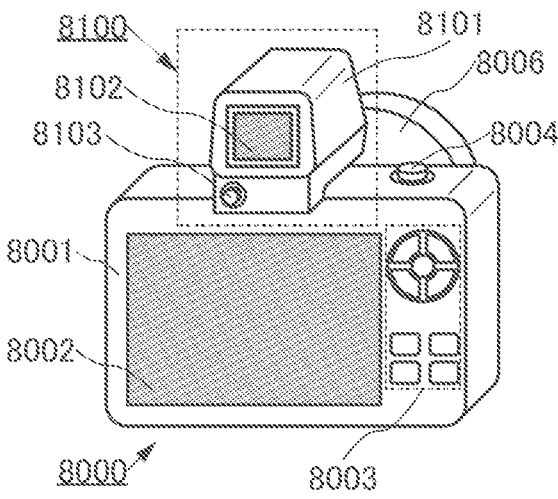
FIG. 38B
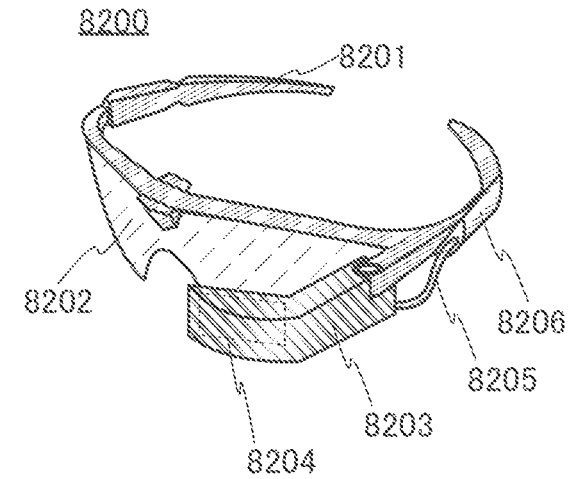
FIG. 38C
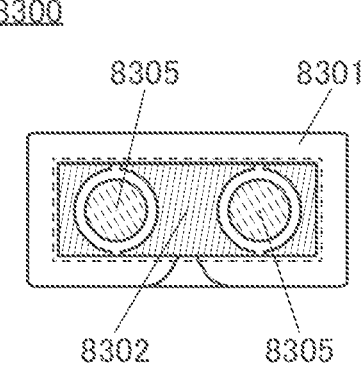
FIG. 38D
FIG. 38E
FIG. 38F
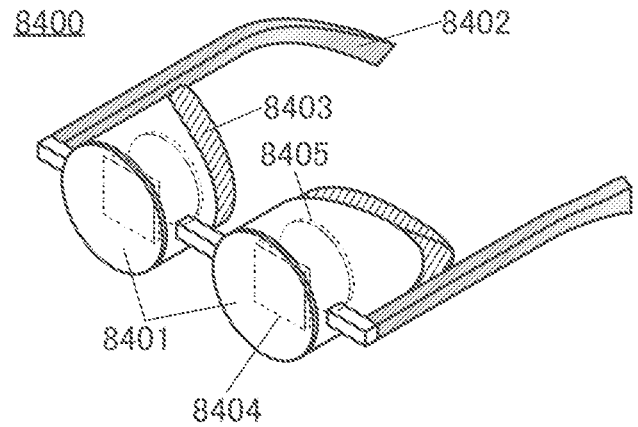

9101

9102

9200

9201

9201

9201

DISPLAY DEVICE COMPRISING A FIRST EL LAYER AND A SECOND EL LAYER

CROSS REFERENCE TO RELATED APPLICATIONS

This application is a U.S. National Phase Application under 35 U.S.C. § 371 of International Application PCT/IB2022/050072, filed on Jan. 6, 2022, which is incorporated by reference and claims the benefit of a foreign priority applications filed in Japan on Jan. 14, 2021, as Application No. 2021-004031, on Jan. 28, 2021, as Application No. 2021-011800, and on Oct. 20, 2021, as Application No. 2021-171640.

TECHNICAL FIELD

One embodiment of the present invention relates to a display device. One embodiment of the present invention relates to a method for manufacturing a display device.

Note that one embodiment of the present invention is not limited to the above technical field. Examples of a technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a notebook computer. Furthermore, higher resolution has been required for a stationary display device such as a television device or a monitor device along with an increase in definition. An example of a device required to have the highest resolution is a device for virtual reality (VR) or augmented reality (AR).

Examples of a display device that can be used for a display panel include, typically, a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By voltage application to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

Patent Document 2 discloses a display device using an organic EL device for VR.

REFERENCE

Patent Document

[Patent Document 1] Japanese Published Patent Application No. 2002-324673

[Patent Document 2] PCT International Publication No. 2018/087625

SUMMARY OF THE INVENTION

Problems to be Solved by the Invention

An object of one embodiment of the present invention is to provide a display device with high display quality. An object of one embodiment of the present invention is to provide a highly reliable display device. An object of one embodiment of the present invention is to provide a display device with low power consumption. An object of one embodiment of the present invention is to provide a display device that can easily achieve a higher resolution. An object of one embodiment of the present invention is to provide a display device with both high display quality and a high resolution. An object of one embodiment of the present invention is to provide a display device with high contrast.

An object of one embodiment of the present invention is to provide a display device having a novel structure or a method for manufacturing a display device. An object of one embodiment of the present invention is to provide a method for manufacturing the above-described display device with high yield. An object of one embodiment of the present invention is to at least reduce at least one of problems of the conventional technique.

Note that the description of these objects does not preclude the existence of other objects. One embodiment of the present invention does not have to achieve all of these objects. Note that objects other than these can be derived from the description of the specification, the drawings, the claims, and the like.

Means for Solving the Problems

One embodiment of the present invention is a display device including an insulating layer, a first lower electrode, a first EL layer over the first lower electrode, a second lower electrode, a second EL layer over the second lower electrode, and an upper electrode over the first EL layer, over the second EL layer, and over the insulating layer. The first EL layer includes a first light-emitting layer, the second EL layer includes a second light-emitting layer, the first EL layer and the second EL layer are adjacent to each other, the insulating layer includes a resin or a precursor of the resin, and the insulating layer includes a region sandwiched between a first end face of the first EL layer and a second end face of the second EL layer.

In the above-described structure, the resin preferably includes one or more selected from an acrylic resin, a polyimide resin, an epoxy resin, a polyamide resin, a poly-imide-amide resin, a siloxane resin, a benzocyclobutene-based resin, and a phenol resin, and the precursor of the resin is preferably a precursor of a resin including one or more selected from an acrylic resin, a polyimide resin, an epoxy resin, a polyamide resin, a polyimide-amide resin, a siloxane resin, a benzocyclobutene-based resin, and a phenol resin.

In the above-described structure, the insulating layer is preferably in contact with the first end face and the second end face.

In the above-described structure, a top surface of the first EL layer, a top surface of the second EL layer, and a top surface of the insulating layer are preferably substantially aligned.

In the above-described structure, a region where a top surface of the insulating layer is lower in height than a top surface of the first EL layer and a top surface of the second EL layer is preferably included.

In the above-described structure, the top surface of the insulating layer preferably includes a concave.

In the above-described structure, a top surface of the insulating layer preferably includes a convex.

In the above-described structure, a common layer including an electron-injection layer or a hole-injection layer is preferably included, and the common layer is preferably in contact with the top surface of the first EL layer, the top surface of the second EL layer, and the top surface of the insulating layer.

In the above-described structure, a common layer including an electron-injection layer is preferably included, the first EL layer preferably includes a first electron-transport layer sandwiched between the first light-emitting layer and the common layer, the second EL layer preferably includes a second electron-transport layer sandwiched between the second light-emitting layer and the common layer, and the common layer is preferably in contact with the top surface of the first EL layer, the top surface of the second EL layer, and the top surface of the insulating layer.

In the above-described structure, a common layer including an electron-injection layer and an electron-transport layer is preferably included, and the common layer is preferably in contact with the top surface of the first EL layer, the top surface of the second EL layer, and the top surface of the insulating layer.

In the above-described structure, the first light-emitting layer preferably includes a light-emitting substance that emits light of one color selected from blue, purple, bluish purple, green, yellowish green, yellow, orange, and red, and the second light-emitting layer preferably includes a light-emitting substance that emits light of another one color which is selected from blue, purple, bluish purple, green, yellowish green, yellow, orange, and red.

One embodiment of the present invention is a display device including a plurality of pixels over a substrate. Each of the plurality of pixels includes a light-emitting element; the light-emitting element includes a pixel electrode, an EL layer over the pixel electrode, and a common electrode over the EL layer; the common electrode in the plurality of pixels is shared by the light-emitting elements in the plurality of pixels; the pixel electrodes of adjacent pixels in the plurality of pixels are separated by a first insulating layer including an inorganic material and a second insulating layer including an organic material; a side surface of the pixel electrode and a side surface of the EL layer include a region in contact with the first insulating layer; and the second insulating layer is in contact with a top of the first insulating layer and is positioned below the common electrode.

One embodiment of the present invention is a display device including a first pixel and a second pixel positioned adjacent to the first pixel. The first pixel includes a first light-emitting element including a first pixel electrode, a first EL layer over the first pixel electrode, and a common electrode over the first EL layer; the second pixel includes a second light-emitting element including a second pixel electrode, a second EL layer over the second pixel electrode, and the common electrode over the second EL layer; a side surface of the first pixel electrode, a side surface of the first EL layer, a side surface of the second pixel electrode, and a side surface of the second EL layer include a region in contact with a first insulating layer; a second insulating layer provided in contact with a top of the first insulating layer and positioned below the common electrode is included, the first insulating layer includes an inorganic material, and the second insulating layer includes an organic material.

One embodiment of the present invention is a display device including a first pixel and a second pixel positioned adjacent to the first pixel. The first pixel includes a first light-emitting element including a first pixel electrode, a first EL layer over the first pixel electrode, and a common electrode over the first EL layer; the second pixel includes a second light-emitting element including a second pixel electrode, a second EL layer over the second pixel electrode, and the common electrode over the second EL layer; a side surface of the first pixel electrode, a side surface of the first EL layer, a side surface of the second pixel electrode, and a side surface of the second EL layer include a region in contact with a first insulating layer; a second insulating layer provided in contact with a top of the first insulating layer and positioned below the common electrode is included; the first insulating layer includes an inorganic material, the second insulating layer includes an organic material; and a top surface of the first EL layer, a top surface of the second EL layer, atop surface of the first insulating layer, and atop surface of the second insulating layer include a region in contact with the common electrode.

One embodiment of the present invention is a display device including a first pixel and a second pixel positioned adjacent to the first pixel. The first pixel includes a first light-emitting element including a first pixel electrode, a first EL layer over the first pixel electrode, a common layer over the first EL layer, and a common electrode over the common layer; the second pixel includes a second light-emitting element including a second pixel electrode, a second EL layer over the second pixel electrode, the common layer over the second EL layer, and the common electrode over the common layer; a side surface of the first pixel electrode, a side surface of the first EL layer, a side surface of the second pixel electrode, and a side surface of the second EL layer include a region in contact with a first insulating layer; a second insulating layer provided in contact with a top of the first insulating layer and positioned below the common electrode is included; the first insulating layer includes an inorganic material; the second insulating layer includes an organic material; and a top surface of the first EL layer, a top surface of the second EL layer, a top surface of the first insulating layer, and a top surface of the second insulating layer include a region in contact with the common layer.

In the above, in a cross-sectional view of the display device, the first insulating layer may include a region protruding above the top surface of the first EL layer or the top surface of the second EL layer.

In the above, in a cross-sectional view of the display device, the first EL layer or the second EL layer may include a region protruding above the top surface of the first insulating layer.

In the above, in a cross-sectional view of the display device, the top surface of the second insulating layer may have a concave shape.

In the above, in a cross-sectional view of the display device, the top surface of the second insulating layer may have a convex shape.

Effect of the Invention

With one embodiment of the present invention, a display device with high display quality can be provided. A highly reliable display device can be provided. A display device with low power consumption can be provided. A display device that can easily achieve a higher resolution can be provided. A display device with both high display quality and a high resolution can be provided. A display device with high contrast can be provided.

With one embodiment of the present invention, a display device having a novel structure or a method for manufacturing a display device can be provided. A method for manufacturing the above-described display device with high yield can be provided. According to one embodiment of the present invention, at least one of problems of the conventional technique can be at least reduced.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 8A and FIG. 8B are diagrams illustrating an example of a method for manufacturing a display device. FIG. 8C is a diagram illustrating a structure example of a display device.

FIG. 15A to FIG. 15F are diagrams illustrating an example of a method for manufacturing a display device and a structure example of the display device.

FIG. 27 is a cross-sectional view illustrating an example of the display device.

FIG. 37A to FIG. 37D are diagrams illustrating examples of electronic devices.

FIG. 38A to FIG. 38F are diagrams illustrating examples of electronic devices.

MODE FOR CARRYING OUT THE INVENTION

Figure 1A:
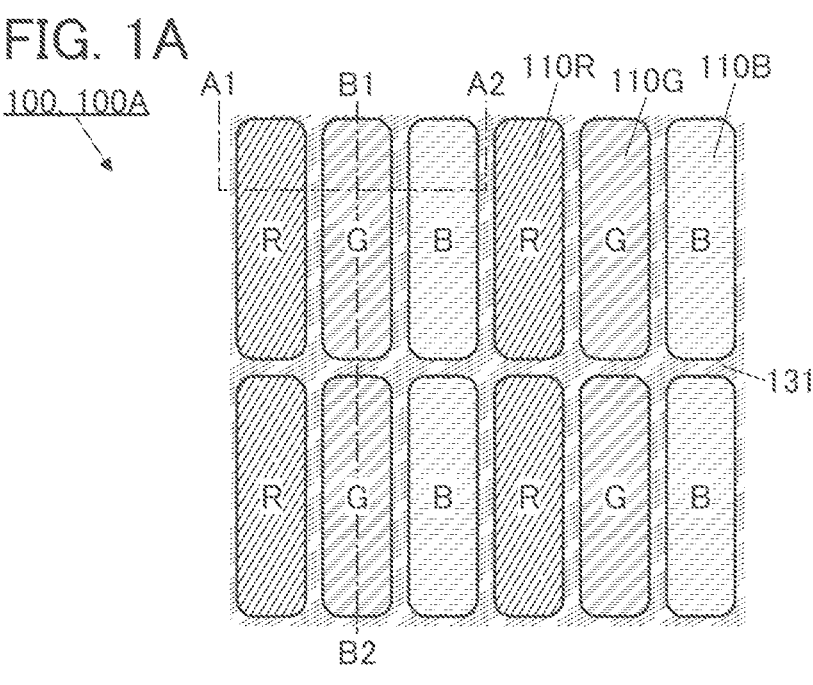
FIG. 1A to FIG. 1C are diagrams illustrating a structure example of a display device.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as "first," "second," and the like are used in order to avoid confusion among components and do not limit the number.

In this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

A light-emitting element of one embodiment of the present invention may include layers containing a substance with a high hole-injection property, a substance with a high hole-transport property, a substance with a high electron-transport property, a substance with a high electron-injection property, a substance with a bipolar property, and the like.

Note that the light-emitting layer and the layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, when used for the light-emitting layer, the quantum dots can function as a light-emitting material.

Note that as the quantum dot material, a colloidal quantum dot material, an alloyed quantum dot material, a core-shell quantum dot material, a core quantum dot material, or the like can be used. A material containing elements belonging to Group 12 and Group 16, elements belonging to Group 13 and Group 15, or elements belonging to Group 14 and Group 16, may be used. Alternatively, a quantum dot material containing an element such as cadmium, selenium, zinc, sulfur, phosphorus, indium, tellurium, lead, gallium, arsenic, or aluminum may be used.

In this specification and the like, a device formed using a metal mask or an FMM (fine metal mask, high-resolution mask) may be referred to as a device having an MM (metal mask) structure. In this specification and the like, a device formed without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display device.

Structures of light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the light-emitting units can be combined to be white light. Note that a structure for obtaining white light emission is similar to a structure in the case of a single structure. In the device having a tandem structure, it is suitable that an intermediate layer such as a charge-generation layer is provided between a plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

Embodiment 1

In this embodiment, a structure example of a display device of one embodiment of the present invention and an example of a method for manufacturing the display device will be described.

One embodiment of the present invention is a display device including a light-emitting element (also referred to as a light-emitting device). The display device includes at least two light-emitting elements which emit light of different colors. The light-emitting elements each include a pair of electrodes and an EL layer between them. As the light-emitting elements, electroluminescent elements such as organic EL elements or inorganic EL elements can be used. Besides, light-emitting diodes (LEDs) can be used. The light-emitting elements of one embodiment of the present invention are preferably organic EL elements (organic electroluminescent elements). The two or more light-emitting elements emitting different colors include respective EL layers containing different materials. For example, three kinds of light-emitting elements emitting red (R), green (G), and blue (B) light are included, whereby a full-color display device can be obtained.

Here, as a way of forming EL layers separately between light-emitting elements of different colors, an evaporation method using a shadow mask such as a metal mask is known. However, this method causes a deviation from the designed shape and position of an island-shaped organic film due to various influences such as the low accuracy of the metal mask position, the positional deviation between the metal mask and a substrate, a warp of the metal mask, and the vapor-scattering-induced expansion of outline of the deposited film; accordingly, it is difficult to achieve high resolution and a high aperture ratio. In addition, dust derived from a material attached to the metal mask in evaporation is generated in some cases. Such dust might cause defective patterning of the light-emitting elements. In addition, a short circuit derived from the dust may occur. A step of cleaning the material attached to the metal mask is necessary. Thus, a measure has been taken for pseudo improvement in resolution (also referred to pixel density) by, for example, employing a unique pixel arrangement such as a PenTile arrangement.

In one embodiment of the present invention, fine patterning of an EL layer is performed without a shadow mask such as a metal mask. With this, a display device with high resolution and a high aperture ratio, which has been difficult to achieve, can be fabricated. Moreover, EL layers can be formed separately, enabling the display device to perform extremely clear display with high contrast and high display quality.

Here, a description is made on a case where EL layers in light-emitting elements of two colors are separately formed, for simplicity. First, a stack of a first EL film and a first sacrificial film is formed to cover pixel electrodes. Next, a resist mask is formed over the first sacrificial film. Then, part of the first sacrificial film and part of the first EL film are etched using the resist mask, so that a first EL layer and a first sacrificial layer over the first EL layer are formed.

Next, a stack of a second EL film and a second sacrificial film is formed. Then, part of the second sacrificial film and part of the second EL film are etched using the resist mask, so that a second EL layer and a second sacrificial layer over the second EL layer are formed. Next, the pixel electrode is processed using the first sacrificial layer and the second sacrificial layer as a mask, so that a first pixel electrode overlapping with the first EL layer and a second pixel electrode overlapping with the second EL layer are formed. In this manner, the first EL layer and the second EL layer can be formed separately. Finally, the first sacrificial layer and the second sacrificial layer are removed, and a common electrode is formed, whereby light-emitting elements of two colors can be formed separately.

Furthermore, by repeating the above-described steps, EL layers in light-emitting elements of three or more colors can be separately formed; accordingly, a display device including light-emitting elements of three color or four or more colors can be achieved.

At an end portion of the EL layer, a step is generated owing to a region where the pixel electrode and the EL layer are provided and a region where the pixel electrode and the EL layer are not provided. At the time of forming the common electrode over the EL layer, coverage with the common electrode is degraded owing to the step at the end portion of the EL layer, which might cause disconnection of the common electrode. Furthermore, the common electrode might become thinner, whereby electric resistance might be increased.

In the case where an end portion of the pixel electrode is substantially aligned with the end portion of the EL layer and the case where the end portion of the pixel electrode is positioned on an outer side than the end portion of the EL layer, the common electrode and the pixel electrode are sometimes short-circuited when the common electrode is formed over the EL layer.

In one embodiment of the present invention, an insulating layer is provided between the first EL layer and the second EL layer, whereby unevenness on the surface where the common electrode is provided can be reduced. Thus, the coverage with the common electrode can be increased at the end portion of the first EL layer and the end portion of the second EL layer, which allows favorable conductivity of the common electrode. In addition, a short circuit between the common electrode and the pixel electrode can be inhibited.

Moreover, in one embodiment of the present invention, the sacrificial layer is formed using a resist mask, and the EL layer and the pixel electrode can be processed using the formed sacrificial layer; thus, a light-emitting element can be formed without use of different resist masks for processing the pixel electrode and processing the EL layer. Accordingly, a margin for the positions of the end portions of the pixel electrode and the EL layer is not necessarily provided for forming a light-emitting element. With a reduction in the margin for the positions, a light-emitting region can be extended, whereby the aperture ratio of the light-emitting element can be increased. Moreover, with a reduction in the margin for the positions, a reduction in the pixel size is possible, whereby the display device can have higher resolution. Furthermore, the number of uses of the resist masks can be reduced, whereby the process can be simplified. This enables a reduction in cost and an improvement in yield.

In the case where EL layers for different colors are adjacent to each other, it is difficult to set the distance between the EL layers adjacent to each other to be less than 10 μm with a formation method using a metal mask, for example; however, with use of the above method, the distance can be decreased to be less than or equal to 3 μm, less than or equal to 2 μm, or less than or equal to 1 μm. For example, with use of an exposure apparatus for LSI, the distance can be decreased to be less than or equal to 500 nm, less than or equal to 200 nm, less than or equal to 100 nm, or less than or equal to 50 nm. Accordingly, the area of anon-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern. This causes a reduction in an effective area that can be used as a light-emitting region with respect to the entire pattern area. In contrast, in the above manufacturing method, a pattern is formed by processing a film deposited to have a uniform thickness, which enables a uniform thickness in the pattern; thus, even with a fine pattern, almost the entire area can be used as a light-emitting region. Therefore, the above manufacturing method makes it possible to achieve both a high resolution and a high aperture ratio.

As described above, with the above manufacturing method, a display device in which minute light-emitting elements are integrated can be obtained, and it is not necessary to conduct a pseudo improvement in resolution with a unique pixel arrangement such as a PenTile arrangement; therefore, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction.

More specific examples of the structure and manufacturing method of the display device of one embodiment of the present invention are described below with reference to drawings.

<Structure Including Insulating Layer 131>

Examples of the structure of the display device of one embodiment of the present invention are described below with reference to FIG. 1A to FIG. 1C, FIG. 2A and FIG. 2B, FIG. 10A and FIG. 10B, and the like.

Structure Example 1

FIG. 1A is a schematic top view of a display device 100 of one embodiment of the present invention. The display device 100 includes a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 1A illustrates what is called a stripe arrangement, in which the light-emitting elements of the same color are arranged in one direction. Note that the arrangement method of the light-emitting elements is not limited thereto; another arrangement method such as a delta arrangement or a zigzag arrangement may be used or a PenTile arrangement may also be used.

As the light-emitting elements 110R, the light-emitting elements 110G, and the light-emitting element 110B, EL elements such as OLEDs (Organic Light Emitting Diodes) or QLEDs (Quantum-dot Light Emitting Diodes) are preferably used. As a light-emitting substance contained in the EL element, a substance that emits fluorescence (a fluorescent material), a substance that emits phosphorescence (a phosphorescent material), an inorganic compound (e.g., a quantum dot material), and a substance that exhibits thermally activated delayed fluorescence (a thermally activated delayed fluorescent (TADF) material) can be given, for example.

Figure 1B:
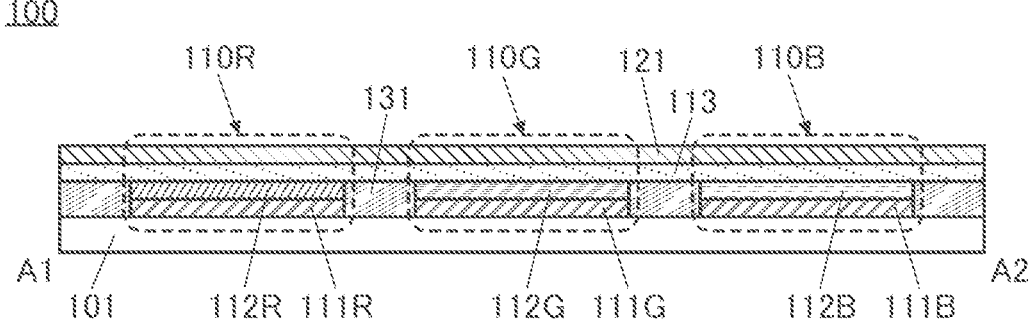
Figure 1C:
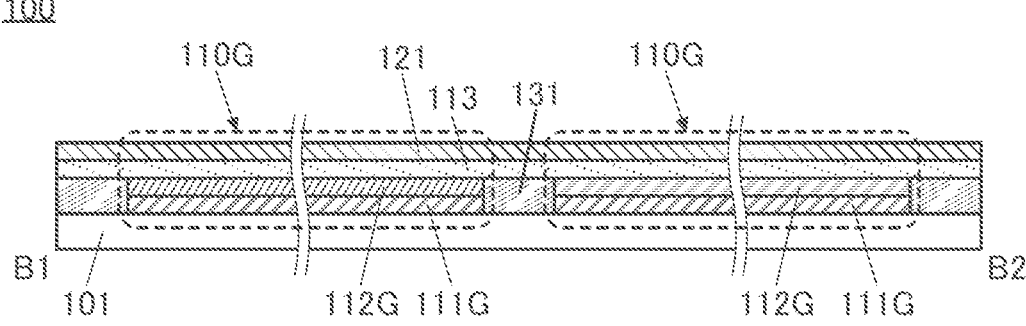

FIG. 1B is a schematic cross-sectional view taken along the dashed-dotted line A1-A2 in FIG. 1A, and FIG. 1C is a schematic cross-sectional view taken along the dashed-dotted line B1-B2.

The light-emitting device 100 includes, over a substrate, the light-emitting element 110R, the light-emitting element 110G, and the light-emitting element 110B. FIG. 1B illustrates cross sections of the light-emitting element 110R, the light-emitting element 110G, and the light-emitting element 1101B. The light-emitting element 110R includes a pixel electrode 111R, an EL layer 112R, and a common electrode 113. The light-emitting element 110G includes a pixel electrode 111G, an EL layer 112G, and the common electrode 113. The light-emitting element 110B includes a pixel electrode 111B, an EL layer 112B, and the common electrode 113.

The light-emitting element 110R includes the EL layer 112R between the pixel electrode 111R and the common electrode 113. The EL layer 112R contains at least a light-emitting organic compound that emits light with intensity in the red wavelength range. The light-emitting element 110G includes the EL layer 112G between the pixel electrode 111G and the common electrode 113. The EL layer 112G contains at least a light-emitting organic compound that emits light with intensity in the green wavelength range. The light-emitting element 1101B includes the EL layer 112B between the pixel electrode 111B and the common electrode 113. The EL layer 112B contains at least a light-emitting organic compound that emits light with intensity in the blue wavelength range.

The EL layer 112R, the EL layer 112G, and the EL layer 112B each include a layer containing a light-emitting organic compound (light-emitting layer). The light-emitting layer may contain one or more kinds of compounds (e.g., a host material and an assist material) in addition to the light-emitting substance (a guest material). As the host material and the assist material, one or more kinds of substances having a larger energy gap than the light-emitting substance (guest material) can be selected and used. As the host material and the assist material, compounds which form an exciplex are preferably used in combination. To form an exciplex efficiently, it is particularly preferable to combine a compound that easily accepts holes (hole-transport material) and a compound that easily accepts electrons (electron-transport material).

Either a low molecular compound or a high molecular compound can be used for the light-emitting element, and an inorganic compound (e.g., quantum dot material) may also be contained.

The EL layer 112R, the EL layer 112G, and the EL layer 112B may each include one or more of an electron-injection layer, an electron-transport layer, a hole-injection layer, and a hole-transport layer in addition to the light-emitting layer.

The pixel electrode 111R, the pixel electrode 111G, and the pixel electrode 111B are provided for the respective light-emitting elements. The common electrode 113 is provided as a continuous layer shared by the light-emitting elements. A conductive film that has a property of transmitting visible light is used for either the respective pixel electrodes or the common electrode 113, and a reflective conductive film is used for the other. When the pixel electrodes are light-transmitting electrodes and the common electrode 113 is a reflective electrode, a bottom-emission display device can be obtained; in contrast, when the respective pixel electrodes are reflective electrodes and the common electrode 113 is a light-transmitting electrode, a top-emission display device can be obtained. Note that when both the respective pixel electrodes and the common electrode 113 transmit light, a dual-emission display device can be obtained.

Note that in the following description common to the light-emitting element 110R, the light-emitting element 110G, and the light-emitting element 110B, the alphabets added to the reference numerals are omitted and the term "light-emitting element 110" is used in some cases. Similarly, the term "pixel electrode 111" is used in some cases to represent the pixel electrode 111R, the pixel electrode 111G, and the pixel electrode 111B. Similarly, the term "EL layer 112" is used in some cases to represent the EL layer 112R, the EL layer 112G, and the EL layer 112B. The same applies to the other layers.

An insulating layer 131 is provided between adjacent light-emitting elements 110. The insulating layer 131 is positioned between the EL layers 112 included in the light-emitting elements 110. The common electrode 113 is provided over the insulating layer 131.

The insulating layer 131 is provided, for example, between two EL layers 112 exhibiting different colors. Alternatively, the insulating layer 131 is provided, for example, between two EL layers 112 exhibiting the same color. Alternatively, the following structure may be employed: the insulating layer 131 is provided between two EL layers 112 exhibiting different colors and is not provided between two EL layers 112 exhibiting the same color.

The insulating layer 131 is provided, for example, between two EL layers 112 in a top view.

It is preferable that the EL layer 112R, the EL layer 112G, and the EL layer 112B each include a region in contact with the top surface of the pixel electrode and a region in contact with the side surface of the insulating layer 131. The end portions of the EL layer 112R, the EL layer 112G, and the EL layer 112B are preferably in contact with the side surface of the insulating layer 131.

When the insulating layer 131 is provided between the light-emitting elements of different colors, the EL layer 112R, the EL layer 112G, and the EL layer 112G can be inhibited from being in contact with each other. This suitably prevents unintentional light emission due to a current flow through two adjacent EL layers. As a result, the contrast can be increased to achieve a display device with high display quality.

The top surface of the insulating layer 131 is preferably substantially aligned with the top surface of the EL layer 112. The top surface of the insulating layer 131 has a flat shape, for example.

Figure 6A:
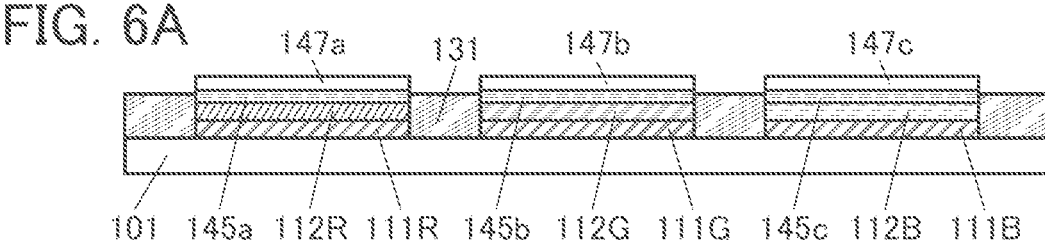
FIG. 6A to FIG. 6C are diagrams illustrating an example of a method for manufacturing a display device.
Figure 6B:
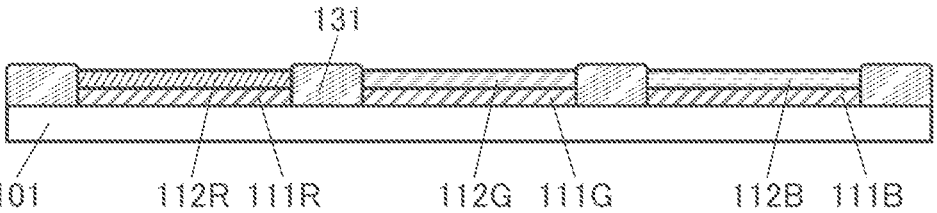
Figure 6C:
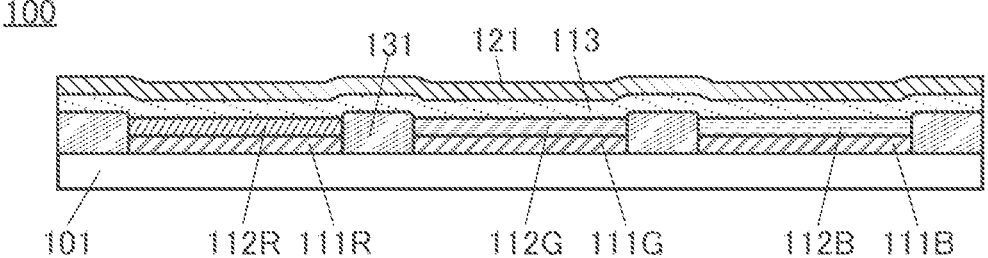
Figure 6D:
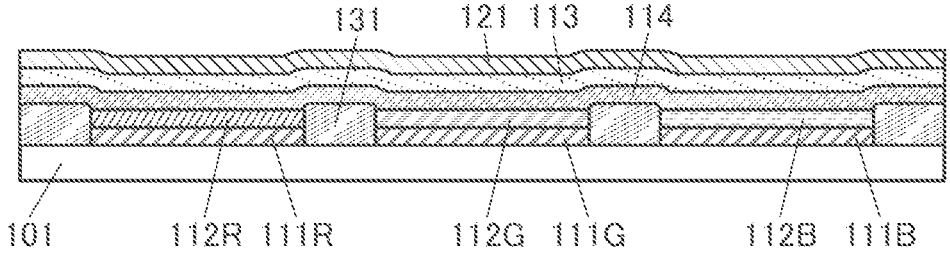
FIG. 6D is a diagram illustrating a structure example of a display device.
Figure 7A:
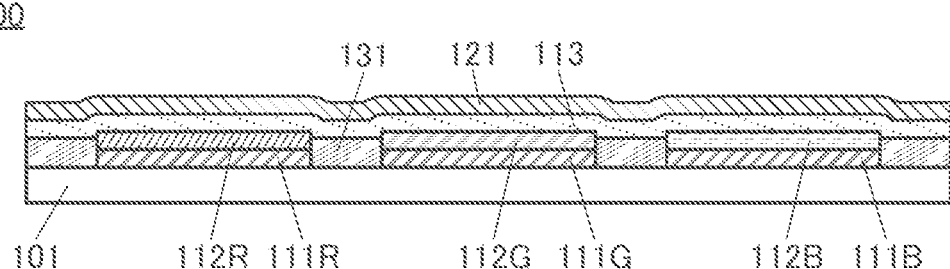
FIG. 7A and FIG. 7B are diagrams illustrating structure examples of the display device.

The top surface of the insulating layer 131 is higher than the top surface of the EL layer 112 in some cases (FIG. 6C described later or the like). In addition, the top surface of the insulating layer 131 is lower than the top surface of the EL layer 112 in some cases (FIG. 7A described later or the like).

Figure 9A:
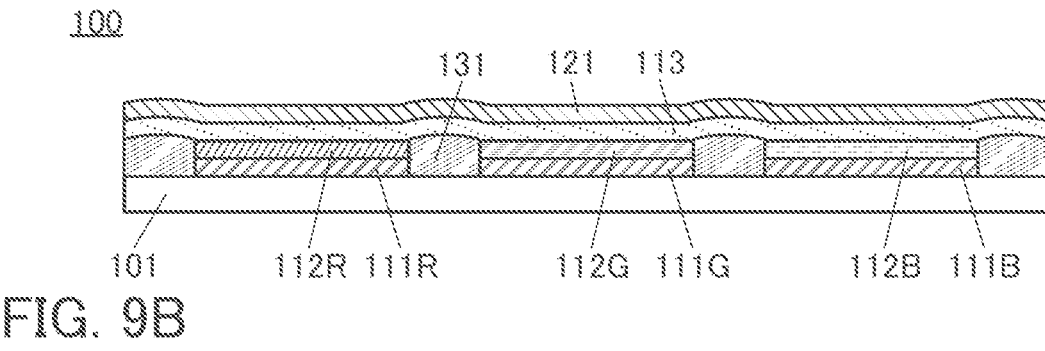
FIG. 9A and FIG. 9B are diagrams illustrating structure examples of the display device.

The shape of the top surface of the insulating layer 131 includes a concave in some cases (FIG. 8B described later or the like). Moreover, the shape of the top surface of the insulating layer 131 includes a convex in some cases (FIG. 9A described later or the like).

For example, the difference in height between the top surface of the insulating layer 131 and the top surface of the EL layer 112 is preferably less than or equal to 0.5 times, further preferably less than or equal to 0.3 times as larger as the thickness of the insulating layer 131. In addition, for example, the insulating layer 131 may be provided so that the top surface of the EL layer 112 is higher than the top surface of the insulating layer 131. Furthermore, for example, the insulating layer 131 may be provided so that the top surface of the insulating layer is higher than the top surface of the light-emitting layer included in the EL layer 112. The thickness of the insulating layer 131 is, for example, substantially equal to a thickness from the bottom surface of the pixel electrode 111 to the top surface of the EL layer 112. It is preferable that the thickness of the insulating layer 131 be, for example, greater than or equal to 0.3 times, greater than or equal to 0.5 times, or greater than or equal to 0.7 times as large as the thickness from the bottom surface of the pixel electrode 111 to the top surface of the EL layer 112.

As the insulating layer 131, an acrylic resin, a polyimide resin, an epoxy resin, a polyamide resin, a polyimide-amide resin, a siloxane resin, a benzocyclobutene-based resin, a phenol resin, and precursors of these resins can be given, for example.

A protective layer 121 is provided over the common electrode 113 so as to cover the light-emitting element 110R, the light-emitting element 110G, and the light-emitting element 1101B. The protective layer 121 has a function of preventing diffusion of impurities such as water into the light-emitting elements from above.

The protective layer 121 can have, for example, a single-layer structure or a stacked-layer structure at least including an inorganic insulating film. As the inorganic insulating film, for example, an oxide film or a nitride film, such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

As the protective layer 121, a stacked-layer film of an inorganic insulating film and an organic insulating film can be used. For example, a structure in which an organic insulating film is sandwiched between a pair of inorganic insulating films is preferable. Furthermore, the organic insulating film preferably functions as a planarization film. With this, the top surface of the organic insulating film can be flat, and accordingly, coverage with the inorganic insulating film thereover is improved, leading to an improvement in barrier properties. Moreover, the top surface of the protective layer 121 is flat; therefore, when a component (e.g., a color filter, an electrode of a touch sensor, a lens array, or the like) is provided above the protective layer 121, the component is less affected by an uneven shape caused by the lower structure.

Structure Example 2

Figure 2A:
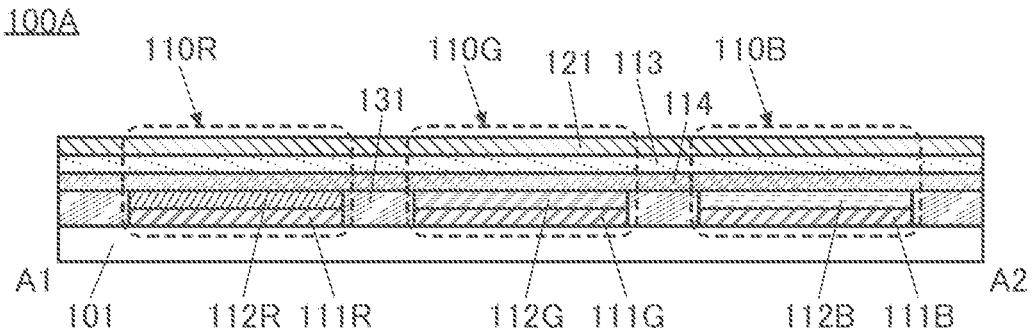
FIG. 2A and FIG. 2B are diagrams illustrating a structure example of a display device.
Figure 2B:
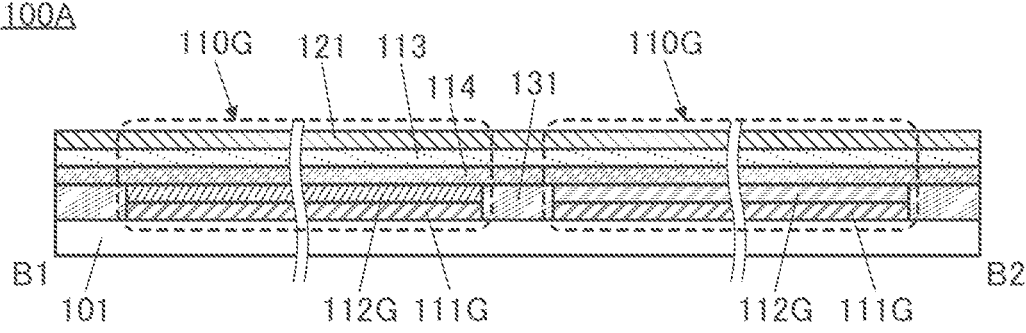

A display device 100A illustrated in FIG. 2A and FIG. 2B is different from the display device 100 illustrated in FIG. 1B and FIG. 1C in including a common layer 114. FIG. 2A is a schematic cross-sectional view taken along the dashed-dotted line A1-A2 in FIG. 1A, and FIG. 2B is a schematic cross-sectional view taken along the dashed-dotted line B1-B2.

Like the common electrode 113, the common layer 114 is provided across a plurality of light-emitting elements. The common layer 114 is provided to cover the EL layer 112R, the EL layer 112G, and the EL layer 112B. The manufacturing process can be simplified by including the common layer 114, reducing the manufacturing cost. The common layer 114 and the common electrode 113 can be formed successively without an etching step or the like between formations of the common layer 114 and the common electrode 113. Thus, the interface between the common layer 114 and the common electrode can be clean, and the light-emitting element can have favorable characteristics.

The common layer 114 is preferably in contact with one or more of the top surfaces of the EL layer 112R, the EL layer 112G, and the EL layer 112B.

Each of the EL layer 112R, the EL layer 112G, and the EL layer 112B preferably includes at least a light-emitting layer containing a light-emitting material emitting light of one color, for example. The common layer 114 preferably includes one or more of an electron-injection layer, an electron-transport layer, a hole-injection layer, and a hole-transport layer, for example. In the light-emitting element in which the pixel electrode serves as an anode and the common electrode serves as a cathode, a structure including the electron-injection layer or a structure including the electron-injection layer and the electron-transport layer can be used as the common layer 114.

Structure Example 3

The optical path lengths of the light-emitting elements are set different from each other using a microcavity structure, whereby light of a specific wavelength can be intensified. This enables a display device with increased color purity.

For example, the thickness of the EL layer 112 is set different among the light-emitting elements, whereby a micorcavity structure can be obtained. For example, the EL layer 112R of the light-emitting element 110R emitting light whose wavelength is the longest can be made to have the largest thickness, and the EL layer 112B of the light-emitting element 110B emitting light whose wavelength is the shortest can be made to have the smallest thickness. Without limitation to this, the thickness of each EL layer can be adjusted in consideration of the wavelength of light emitted by the light-emitting element, the optical characteristics of the layer included in the light-emitting element, the electrical characteristics of the light-emitting element, and the like.

For example, by using a layer transmitting visible light as the optical adjustment layer, the optical path length can be set different among the light-emitting elements. For example, an optical adjustment layer may be provided between the pixel electrode 111 and the EL layer 112. As the optical adjustment layer, a conductive material that transmits visible light can be used, for example. For example, a conductive oxide such as indium oxide, indium tin oxide, indium zinc oxide, zinc oxide, zinc oxide containing gallium, indium-tin oxide containing silicon, or indium zinc oxide containing silicon can be used.

The optical adjustment layers can be formed after the formation of conductive films to be the pixel electrode 111R, the pixel electrode 111G, and the pixel electrode 111B and before the formation of an EL film 112Rf illustrated in FIG. 13A or the like described later. The optical adjustment layers are formed to have different thicknesses, whereby the optical path length can differ among the light-emitting elements. The optical adjustment layers may be formed using conductive films with different thicknesses from each other or may have a single-layer structure, a two-layer structure, or a three-layer structure, in the order of thin thickness.

Alternatively, the optical adjustment layer and the EL layer formed to have a different thickness depending on emitted colors may be used in combination.

For example, the thicknesses of the optical adjustment layers and the EL layers may be adjusted so that the total thickness of the optical adjustment layer and the EL layer is substantially the same between the light-emitting elements. In that case, the formation surface of the common electrode 113 can be planarized more.

Figure 10A:
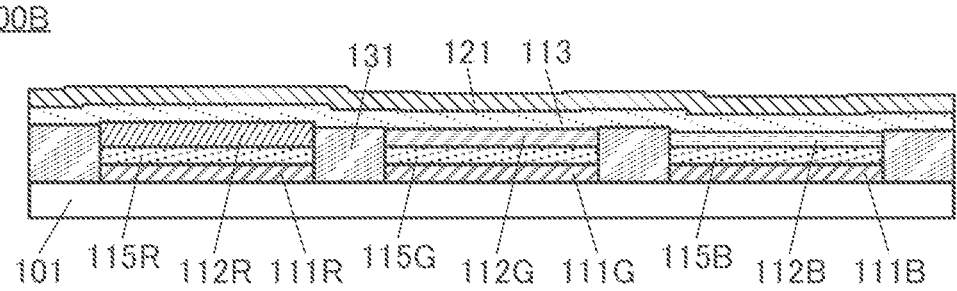
FIG. 10A and FIG. 10B are diagrams illustrating structure examples of the display device.

In a display device 100B illustrated in FIG. 10A, the light-emitting element 110R includes an optical adjustment layer 115R between the pixel electrode 111R and the EL layer 112R. The light-emitting element 110G includes an optical adjustment layer 115G between the pixel electrode 111G and the EL layer 112G. The light-emitting element 110B includes an optical adjustment layer 115B between the pixel electrode 111B and the EL layer 112B.

Figure 10B:
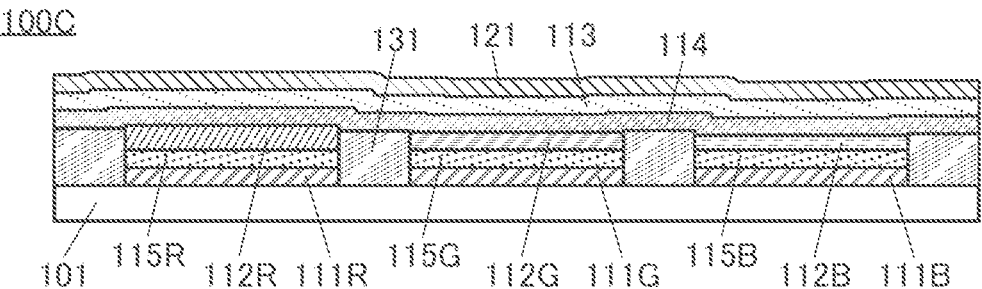

A display device 100C illustrated in FIG. 10B is different from the display device 100B illustrated in FIG. 10A mainly in including the common layer 114 between the EL layer 112 and the common electrode 113 in the structure of the light-emitting element.

Manufacturing Method Example 1

An example of a method for manufacturing the display device of one embodiment of the present invention is described below with reference to drawings. In the following description, the display device 100A described in the above structure example is taken as an example. FIG. 3A to FIG. 4E are schematic cross-sectional views in steps of the method for manufacturing the display device described below as an example.

Note that thin films that form the display device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. As an example of the thermal CVD method, a metal organic chemical vapor deposition (MOCVD) method can be given.

Alternatively, thin films that form the display device (insulating films, semiconductor films, conductive films, and the like) can be formed by a method such as spin coating, dipping, spray coating, ink-jetting, dispensing, screen printing, offset printing, a doctor knife method, a slit coater, a roll coater, a curtain coater, or a knife coater.

When the thin films that form the display device are processed, a photolithography method or the like can be used. Besides, a nanoimprinting method, a sandblasting method, a lift-off method, or the like may be used for the processing of the thin films. Island-shaped thin films may be directly formed by a deposition method using a blocking mask such as a metal mask.

There are two typical examples of a photolithography method. In one of the methods, a resist mask is formed over a thin film that is to be processed, the thin film is processed by etching or the like, and the resist mask is removed. In the other method, after a photosensitive thin film is formed, exposure and development are performed, so that the thin film is processed into a desired shape.

As the light used for exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion exposure technique. As the light used for the exposure, extreme ultraviolet (EUV) light or X-rays may be used. Furthermore, instead of the light used for the exposure, an electron beam can also be used. It is preferable to use extreme ultraviolet light, X-rays, or an electron beam because extremely minute processing can be performed. Note that when light exposure is performed by scanning of a beam such as an electron beam, a photomask is unnecessary.

For etching of the thin films, a dry etching method, a wet etching method, a sandblast method, or the like can be used.

[Preparation for Substrate 101]

As a substrate 101, a substrate having at least heat resistance high enough to withstand heat treatment performed later can be used. In the case where an insulating substrate is used as the substrate 101, a glass substrate, a quartz substrate, a sapphire substrate, a ceramic substrate, an organic resin substrate, or the like can be used. Alternatively, a single crystal semiconductor substrate using silicon or silicon carbide, a polycrystalline semiconductor substrate, a compound semiconductor substrate of silicon germanium or the like, or a semiconductor substrate such as an SOI substrate can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

Then, a conductive film 111f to be the pixel electrode 111 is formed over the substrate 101.

In the case where a conductive film having a property of reflecting visible light is used as the pixel electrode, a material that has a reflectance as high as possible in the whole wavelength range of visible light (e.g., silver, aluminum, or the like) is preferably used. This can increase color reproducibility as well as light extraction efficiency of the light-emitting elements.

[Formation of EL Film 112Rf]

Next, the EL film 112Rf that is to be the EL layer 112R later is formed over the conductive film 111f.

The EL film 112Rf includes at least a film containing a light-emitting compound. Besides, a structure in which one or more of films functioning as an electron-injection layer, an electron-transport layer, a charge-generation layer, a hole-transport layer, and a hole-injection layer are stacked may be employed. The EL film 112Rf can be formed by, for example, an evaporation method, a sputtering method, an inkjet method, or the like. Without limitation to this, the above-described deposition method can be used as appropriate.

[Formation of Sacrificial Film 144a]

Next, a sacrificial film 144a is formed to cover the EL film 112Rf.

The sacrificial film 144a can be formed by a sputtering method, an ALD method (a thermal ALD method or a PEALD method), or a vacuum evaporation method, for example. A formation method that gives less damage to an EL layer is preferred, and an ALD method or a vacuum evaporation method is more suitable for the formation of the first sacrificial film 144a than a sputtering method. Aluminum oxide is particularly suitably used as the sacrificial film 144a in terms of low manufacturing cost. Compared with a sputtering method, an ALD method enables deposition with little deposition damage to an underlying layer.

As the sacrificial film 144a, it is possible to use a film highly resistant to etching treatment performed on various EL films such as the EL film 112Rf, i.e., a film having high etching selectivity. Furthermore, as the sacrificial film 144a, it is possible to use a film having high etching selectivity with respect to a protective film such as a protective film 146a described later. Moreover, as the sacrificial film 144a, it is possible to use a film that can be removed by a wet etching method that is less likely to cause damage to the EL film. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, a chemical solution containing a mixed solution thereof, or the like, for example.

The sacrificial film 144a can be formed using an inorganic film such as a metal film, an alloy film, a metal oxide film, a semiconductor film, or an inorganic insulating film, for example.

For the sacrificial film 144a, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

Alternatively, the sacrificial film 144a can be formed using a metal oxide such as an indium gallium zinc oxide (In—Ga—Zn oxide, also referred to as IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon or the like can also be used.

Note that an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of gallium, aluminum, and yttrium.

Furthermore, an inorganic insulating material such as aluminum oxide, hafnium oxide, or silicon oxide can be used for the sacrificial film 144a. An aluminum oxide film formed by an ALD method is particularly suitable for the sacrificial film 144a because damage to an underlying layer (especially EL layer or the like) can be reduced.

The sacrificial film 144a may have a single-layer structure or a stacked-layer structure of two or more layers. As the stacked-layer structure, a two-layer structure of In—Ga—Zn oxide formed by a sputtering method and a silicon nitride film formed by a sputtering method, a two-layer structure of In—Ga—Zn oxide formed by a sputtering method and aluminum oxide formed by an ALD method, a two-layer structure of aluminum oxide formed by an ALD method and In—Ga—Zn oxide formed by a sputtering method, and the like are typically given.

A structure in which the sacrificial film 144a is formed by an ALD method or a sputtering method while being heated may be employed. In the case of the structure, a range in which the underlying material (the EL film 112Rf here) does not deteriorate is preferable, and the substrate temperature at the time of forming the sacrificial film 144a is higher than or equal to room temperature and lower than or equal to 200° C., preferably higher than or equal to 50° C. and lower than or equal to 150° C., further preferably higher than or equal to 70° C. and lower than or equal to 100° C., typically a temperature in the vicinity of 80° C. With the above-described structure, the adhesiveness between the underlying material and the sacrificial film 144a can be increased.

Note that the sacrificial film 144a is not necessarily formed, and the protective film 146a may be formed over and in contact with the EL film 112Rf. The same applies to the pixels exhibiting the other colors.

[Formation of Protective Film 146a]

Next, the protective film 146a is formed over the sacrificial film 144a.

The protective film 146a is a film used as a hard mask when the sacrificial film 144a is etched later. In a later step of processing the protective film 146a, the sacrificial film 144a is exposed. Thus, the combination of films having high etching selectivity therebetween is selected for the sacrificial film 144a and the protective film 146a. It is thus possible to select a film that can be used for the protective film 146a depending on an etching condition of the sacrificial film 144a and an etching condition of the protective film 146a.

For example, in the case where dry etching using a gas containing fluorine (also referred to as a fluorine-based gas) is used for the etching of the protective film 146a, silicon, silicon nitride, silicon oxide, tungsten, titanium, molybdenum, tantalum, tantalum nitride, an alloy containing molybdenum and niobium, an alloy containing molybdenum and tungsten, or the like can be used for the protective film 146a. Here, a metal oxide film such as IGZO or ITO is given as a film having high etching selectivity (that is, enabling low etching rate) in dry etching using the fluorine-based gas, and such a film can be used as the sacrificial film 144a.

Without being limited to the above, a material of the protective film 146a can be selected from a variety of materials depending on etching conditions of the sacrificial film 144a and the protective film 146a. For example, any of the films that can be used for the sacrificial film 144a can be used.

As the protective film 146a, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

Alternatively, as the protective film 146a, an organic film that can be used for the EL film 112Rf or the like can be used. For example, the organic film that is used as the EL film 112Rf, an EL film 112Gf, or an EL film 112Bf can be used for the protective film 146a. The use of such an organic film is preferable, in which case the deposition apparatus for the EL film 112Rf or the like can be used in common.

[Formation of Resist Mask 143a]

Figure 3A:
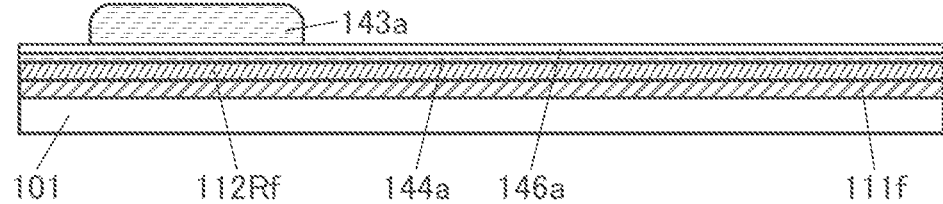
FIG. 3A to FIG. 3F are diagrams illustrating an example of a method for manufacturing a display device.

Next, a resist mask 143a is formed over the protective film 146a (FIG. 3A).

For the resist mask 143a, a resist material containing a photosensitive resin such as a positive type resist material or a negative type resist material can be used.

Here, in the case where the protective film 146a is not provided and the resist mask 143a is formed over the sacrificial film 144a, if a defect such as a pinhole exists in the sacrificial film 144a, there is a risk of dissolving the EL film 112Rf due to a solvent of the resist material. Such a defect can be prevented by using the protective film 146a.

[Etching of Protective Film 146a]

Next, part of the protective film 146a that is not covered with the resist mask 143a is removed by etching, so that an island-shaped or band-shaped protective layer 147a is formed.

In the etching of the protective film 146a, an etching condition with high selectively is preferably employed so that the sacrificial film 144a is not removed by the etching. Either wet etching or dry etching can be performed for the etching of the protective film 146a; with use of dry etching, shrinking of a pattern of the protective film 146a can be inhibited.

[Removal of Resist Mask 143a]

Next, the resist mask 143a is removed.

The removal of the resist masks 143a can be performed by wet etching or dry etching. It is particularly preferable to perform dry etching (also referred to as plasma ashing) using an oxygen gas as an etching gas to remove the resist masks 143a.

At this time, the removal of the resist mask 143a is performed in a state where the EL film 112Rf is covered with the sacrificial film 144a; thus, the EL film 112Rf is less affected by the removal. In particular, when the EL film 112Rf is exposed to oxygen, the electrical characteristics are adversely affected in some cases; therefore, it is preferable that the EL film 112Rf be covered with the sacrificial film 144a when etching using an oxygen gas, such as plasma ashing, is performed.

[Etching of Sacrificial Film 144a]

Next, part of the sacrificial film 144a that is not covered with the protective layer 147a is removed by etching with use of the protective layer 147a as a mask, so that an islands-shaped or band-shaped sacrificial layer 145a is formed.

Either wet etching or dry etching can be performed for the etching of the sacrificial film 144a; the use of a dry etching method is preferable, in which case shrinking of the pattern can be inhibited.

[Etching of EL Film 112Rf]

Figure 3B:
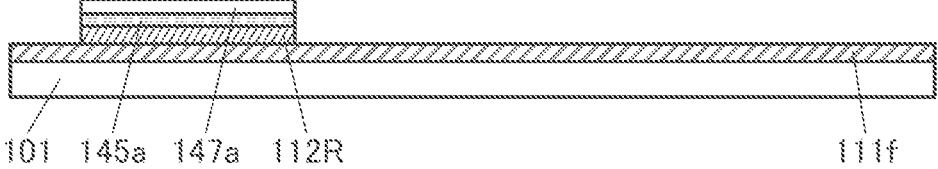

Next, part of the EL film 112Rf that is not covered with the sacrificial layer 145a is removed by etching, so that the island-shaped or band-shaped EL layer 112R is formed (FIG. 3B).

For the etching of the EL film 112Rf, it is preferable to use dry etching using an etching gas that does not contain oxygen as its main component. This can inhibit the alteration of the EL film 112Rf to achieve a highly reliable display device. Examples of the etching gas that does not contain oxygen as its main component include $CF_4$, $C_4F_8$, $SF_6$, $CHF_3$, $Cl_2$, $H_2O$, $BCl_3$, and a rare gas such as He. Alternatively, a mixed gas of the above gas and a dilute gas that does not contain oxygen can be used as the etching gas. In the etching of the EL film 112Rf, the protective layer 147a may be removed.

[Formation of EL Layer 112G and EL Layer 112B]

Next, the EL film 112Gf that is to be the EL layer 112G is formed over the sacrificial layer 145a, the protective layer 147a, and the exposed conductive film 111f. For the EL film 112Gf, the description of the EL film 112Rf can be referred to.

Then, a sacrificial film 144b is formed over the EL film 112Gf, and a protective film 146b is formed over the sacrificial film 144b. For the sacrificial film 144b, the description of the sacrificial film 144a can be referred to. For the protective film 146b, the description of the protective film 146a can be referred to.

Figure 3C:
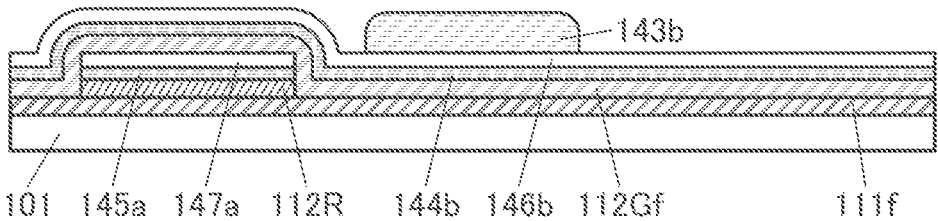

Next, a resist mask 143b is formed over the protective film 146b (FIG. 3C).

Then, the protective film 146b is etched with use of the resist mask 143b, so that a protective layer 147b is formed. After that, the resist mask 143b is removed.

Figure 3D:
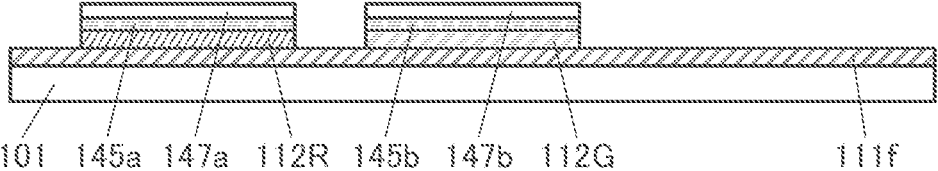

Next, the sacrificial film 144b and the EL film 112Gf are each etched with use of the protective layer 147b as a mask, so that a sacrificial layer 145b and the EL layer 112G are formed (FIG. 3D).

Next, the EL film 112Bf that is to be the EL layer 112B is formed over the sacrificial layer 145a, the sacrificial layer 145b, the protective layer 147a, the protective layer 147b, and the exposed conductive film 1/1f. For the EL film 112Bf, the description of the EL film 112Rf can be referred to.

Next, a sacrificial layer 144c is formed over the EL film 112Bf, and a protective film 146c is formed over the sacrificial layer 144c. For the sacrificial layer 144c, the description of the sacrificial film 144a can be referred to. For the protective film 146c, the description of the protective film 146a can be referred to.

Figure 3E:
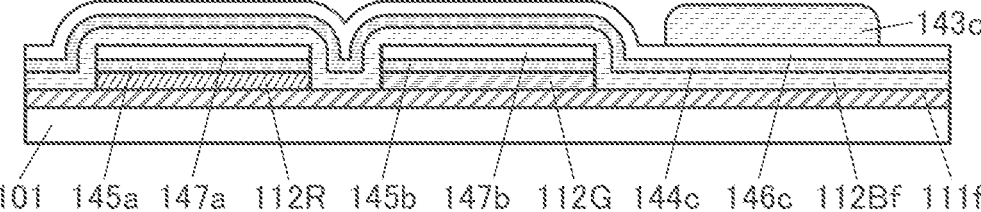

Next, a resist mask 143c is formed over the protective film 146c (FIG. 3E).

Then, the protective film 146c is etched with use of the resist mask 143c, so that a protective layer 147c is formed. After that, the resist mask 143c is removed.

Figure 3F:
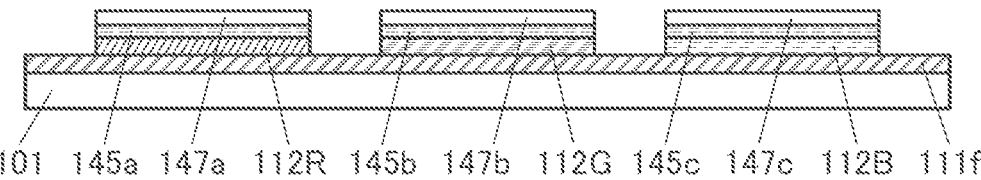

Next, the sacrificial layer 144c and the EL film 112Bf are each etched with use of the protective layer 147c as a mask, so that a sacrificial layer 145c and the EL layer 112B are formed (FIG. 3F).

[Formation of Pixel Electrode 111R, Pixel Electrode 111G, and Pixel Electrode 1111B]

Figure 4A:
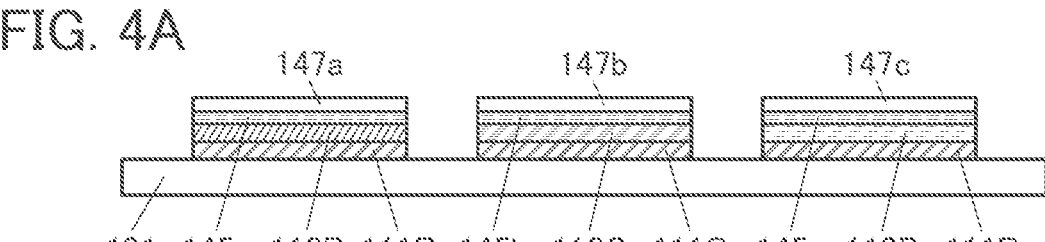
FIG. 4A to FIG. 4E are diagrams illustrating the example of the method for manufacturing the display device and a structure example of the display device.

Next, part of the conductive film 11 if that is not covered with the EL layer 112R, the EL layer 112G, the EL layer 112B, the sacrificial layer 145a, the sacrificial layer 145b, the sacrificial layer 145c, the protective layer 147a, the protective layer 147b, or the protective layer 147c is etched, so that the pixel electrode 111R, the pixel electrode 111G, and the pixel electrode 111B are formed (FIG. 4A).

The etching of the conductive film 11 if can be performed by wet etching or dry etching. Here, dry etching with the use of an etching gas not containing oxygen as its main component is used for the etching conditions of the conductive film 111f, whereby damage to the EL layer 112 can be reduced. Furthermore, as described later with reference to FIG. 5A to FIG. 5E, damage to the EL layer 112 can be reduced in some cases when the pixel electrode 111R, the pixel electrode 111G, and the pixel electrode 111B are formed in advance.

[Formation of Insulating Layer 131]

Figure 4B:
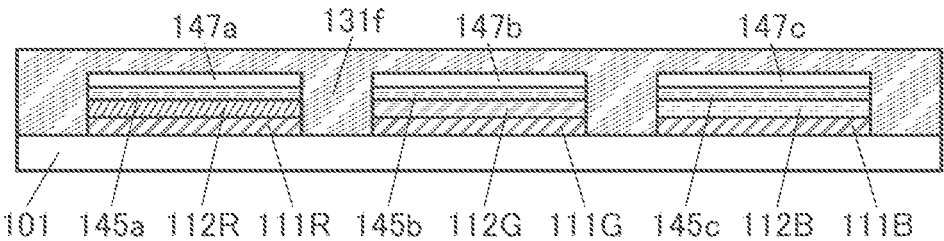

Next, an insulating film 131f to be the insulating layer 131 is formed (FIG. 4B). The insulating film 131f is provided so as to cover the protective layer 147, the sacrificial layer 145, the EL layer 112, and the pixel electrode 111. The insulating film 131f is preferably a planarization film.

A resin is preferably used for the insulating film 131f. The insulating film 131f is an organic insulating film, for example.

As a material that can be used for the insulating film 131f, an acrylic resin, a polyimide resin, an epoxy resin, a poly-amide resin, a polyimide-amide resin, a siloxane resin, a benzocyclobutene-based resin, a phenol resin, and precursors of these resins can be given, for example.

Figure 4C:
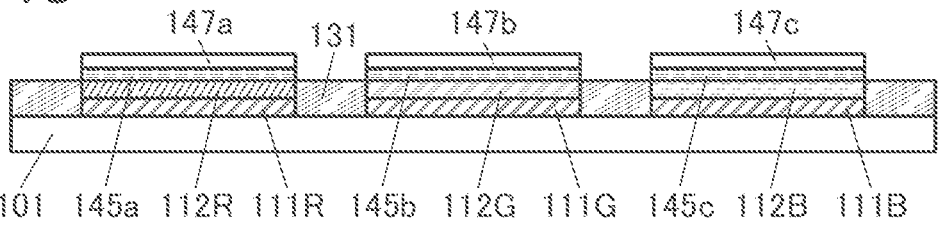

Next, the insulating film 131f is etched to expose the top surface of the protective layer 147 (FIG. 4C). The etching of the insulating film 131f is performed substantially uniformly on the top surface of the insulating film 131f. Such uniform etching for planarization is also referred to as etch back.

A dry etching method or a wet etching method can be used for the etching of the insulating film 131f. The etching of the insulating film 131f may be performed by ashing using oxygen plasma or the like. Note that the ashing using oxygen plasma has advantages such as high controllability, good in-plane uniformity, and high suitability for treatment using a large-sized substrate and thus can be suitably used for removal of part of the insulating film 131f. Chemical mechanical polishing (CMP) may be used for the etching of the insulating film 131f.

Note that it is preferable to reduce damage to the EL layer 112 due to etching at the time of etching the insulating film 131f. For this reason, the insulating film 131f is preferably etched so that an exposed portion of the side surface of the EL layer 112 is small, for example.

Furthermore, it is possible to reduce damage to the top surface of the EL layer 112 due to etching by performing the etching of the insulating film 131f in the state where the sacrificial layer 145 is provided over the EL layer 112.

As illustrated in FIG. 4C, the etching of the insulating film 131f is performed so that the top surface of the insulating layer 131 is substantially aligned with the top surface of the EL layer 112. When the insulating layer 131 is provided so that the top surface of the insulating layer 131 is aligned with the top surface of the EL layer, unevenness of the surface where the common electrode 113 is provided can be made small at the time of formation of the common electrode 113, which is illustrated in FIG. 4E described later, and coverage can be increased.

FIG. 4C illustrates an example where the insulating layer 131 is formed so that the top surface and the side surface of the protective layer 147 and the side surface of the sacrificial layer 145 are exposed.

The surface planarity of the insulating film 131f may change due to unevenness of the formation surface and the sparseness and density of the pattern formed on the formation surface. The planarity of the insulating film 131f may change due to the viscosity or the like of a material used for the insulating film 131f.

The thickness of the insulating film 131f is smaller, for example, in a region between a plurality of EL layers 112 than in a region over the EL layer 112. In such a case, for example, etch back of the insulating film 131f is performed, whereby the height of the top surface of the insulating layer 131 becomes lower than the height of the top surface of the protective layer 147 or the height of the top surface of the sacrificial layer 145 in some cases.

The insulating film 131f has a hollow shape, a bulging shape, or the like in a region between the plurality of EL layers 112 in some cases.

FIG. 4C illustrates an example where the insulating layer 131 is provided so that the top surface of the insulating layer 131 is substantially aligned with the top surface of the EL layer; however, as described in detail later with reference to FIG. 6A to FIG. 6D or the like, the insulating layer 131 may be provided so that the top surface of the insulating layer 131 is higher than the top surface of the EL layer 112. Alternatively, as described in detail later with reference to FIG. 7A and FIG. 7B or the like, the insulating layer 131 may be provided so that the top surface of the insulating layer 131 is lower than the top surface of the EL layer 112.

Figure 9B:
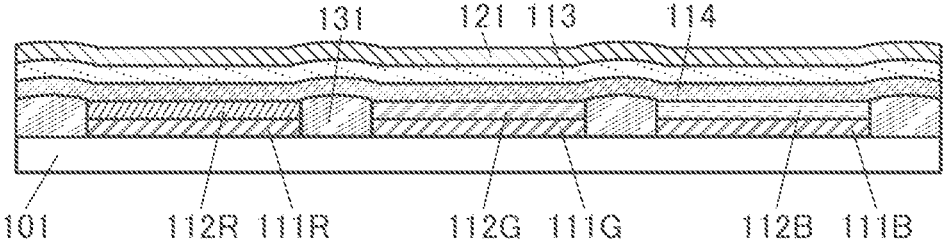

The shape of the top surface of the insulating layer 131 may have a concave as described in detail later with reference to FIG. 8A to FIG. 8C or the like. The shape of the top surface of the insulating layer 131 may have a convex as described in detail later with reference to FIG. 9A and FIG. 9B or the like.

The shape and height of the top surface of the insulating layer 131 may change due to removal of the protective layers and the sacrificial layers, which is described later with reference to FIG. 4D.

[Removal of Protective Layers and Sacrificial Layers]

Figure 4D:
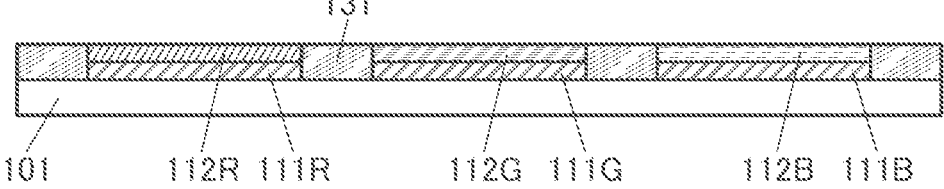
Figure 4E:
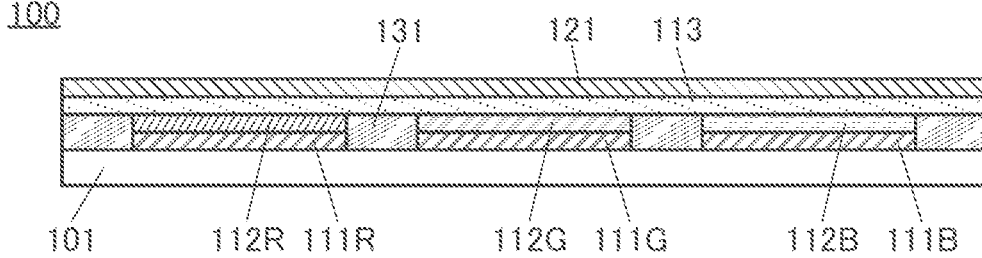

Next, the protective layer 147a, the protective layer 147b, the protective layer 147c, the sacrificial layer 145a, the sacrificial layer 145b, and the sacrificial layer 145c are removed to expose the top surfaces of the EL layer 112R, the EL layer 112G, and the EL layer 112B (FIG. 4D).

In the example illustrated in FIG. 4D, the insulating layer 131 is provided so that the height of the top surface of the insulating layer 131 is substantially the same as the height of the top surface of the EL layer 112. In FIG. 4D, the top surface of the EL layer 112 is exposed, and the side surface of the EL layer 112 is covered with the insulating layer 131. The side surface of the EL layer 112 is covered with the insulating layer 131, whereby damage to the EL layer due to etching of the protective layer 147 can be reduced.

The protective layer 147a, the protective layer 147b, and the protective layer 147c can be removed by wet etching or dry etching.

The sacrificial layer 145a, the sacrificial layer 145b, and the sacrificial layer 145c can be removed by wet etching or dry etching. At this time, a method that causes damage to the EL layer 112R, the EL layer 112G, and the EL layer 112B as little as possible is preferably employed. In particular, a wet etching method is preferably used. For example, wet etching using an aqueous solution of tetramethylammonium hydroxide (TMAH), diluted hydrofluoric acid, oxalic acid, phosphoric acid, acetic acid, nitric acid, or a mixed solution thereof is preferably performed. With use of these conditions of wet etching, for example, damage to the insulating layer can be reduced.

In this manner, the EL layer 112R, the EL layer 112G, and the EL layer 112B can be formed separately.

[Formation of Common Electrode 113]

Next, the common electrode 113 is formed to cover the EL layer 112R, the EL layer 112G, and the EL layer 112B. The common electrode 113 can be formed by a sputtering method or a vacuum evaporation method, for example.

Through the above steps, the light-emitting element 110R, the light-emitting element 110G, and the light-emitting element 110B can be manufactured.

[Formation of Protective Layer 121]

Next, the protective layer 121 is formed over the common electrode 113 (FIG. 4E). An inorganic insulating film used for the protective layer 121 is preferably deposited by a sputtering method, a PECVD method, or an ALD method. In particular, an ALD method is preferable because a film deposited by an ALD method has good step coverage and is less likely to cause a defect such as pinhole. An organic insulating film is preferably formed by an inkjet method because a uniform film can be formed in a desired area.

Through the above steps, the display device 100 illustrated in FIG. 1B and FIG. 1C can be manufactured.

Since process damage to the EL layer 112R, the EL layer 112G, and the EL layer 112B can be reduced with the use of the above manufacturing method, an extremely highly reliable display device can be achieved.

[Formation of Common Layer 114]

Note that the display device 100A illustrated in FIG. 2A and FIG. 2B can be manufactured when the common layer 114 is formed to cover the EL layer 112R, the EL layer 112G, and the EL layer 112B before the common electrode 113 is formed and then the common electrode 113 is formed.

[Modification Example of Structure Example 1]

Note that the pixel electrode 111R, the pixel electrode 111G, and the pixel electrode 111B may be formed before the EL film 112Rf is formed.

Figure 5A:
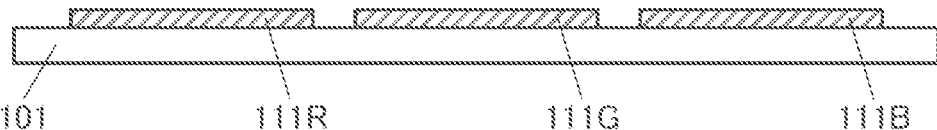
FIG. 5A to FIG. 5E are diagrams illustrating an example of a method for manufacturing a display device and a structure example of the display device.
Figure 5B:
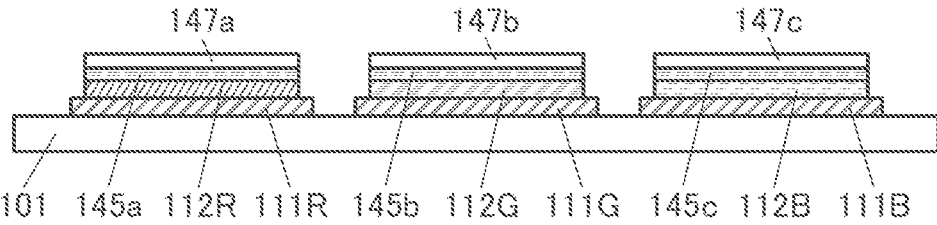
Figure 5C:
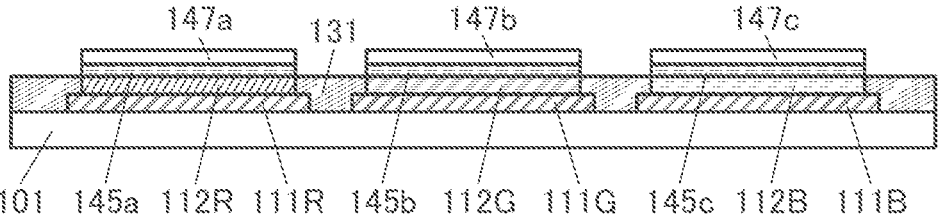
Figure 5D:
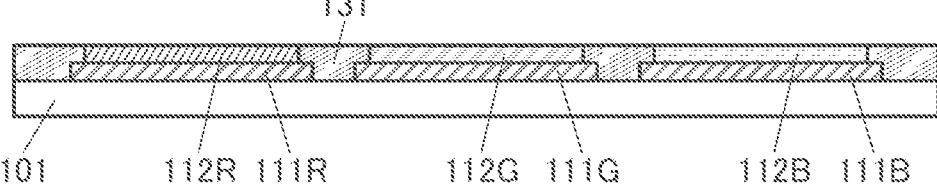

First, as illustrated in FIG. 5A, the pixel electrode 111R, the pixel electrode 111G, and the pixel electrode 111B are formed. After that, as described with reference to FIG. 3A to FIG. 3F, the EL layer 112, the sacrificial layer 145, and the protective layer 147 which correspond to each of the light-emitting elements 110 are formed using a resist mask or the like (FIG. 5B). Then, the insulating layer 131 is formed (FIG. 5C), the sacrificial layer 145 and the protective layer 147 are removed (FIG. 5D), and the common electrode 113 and the protective layer 121 are formed to obtain the display device 100 illustrated in FIG. 5E.

Figure 5E:
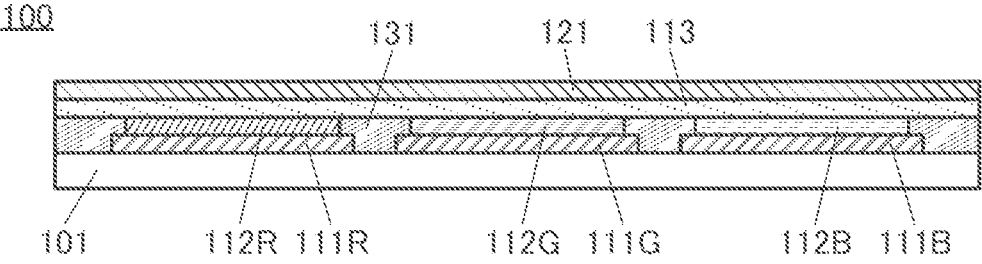

In each of the light-emitting elements 110 illustrated in FIG. 5E, the end portion of the pixel electrode 111 is positioned outside the end portion of the EL layer 112. In the top surface of the pixel electrode 111, the end portion and its vicinity are covered with the insulating layer 131.

Structure Example 3

Note that the insulating layer 131 may be provided so that the top surface of the insulating layer 131 is higher than the top surface of the EL layer 112.

The structure illustrated in FIG. 6A is different from the structure illustrated in FIG. 4C in that the insulating layer 131 is provided so that the top surface of the insulating layer 131 is higher than the top surface of the EL layer 112.

In the structure illustrated in FIG. 6A, the protective layer 147 and the sacrificial layer 145 are removed to obtain the structure illustrated in FIG. 6B. In FIG. 6B, the insulating layer 131 is provided so that the top surface of the insulating layer 131 is higher than the top surface of the EL layer 112, and the side surface of the insulating layer 131 is partly exposed. Note that part of the insulating layer 131 may be etched by the removal of the protective layer 147 and the sacrificial layer 145 to change the shape of the insulating layer 131. For example, the thickness of the insulating layer 131 may be reduced. Furthermore, for example, a corner formed by the top surface and the side surface of the insulating layer 131 may be rounded. Moreover, for example, the shape of the top surface of the insulating layer 131 may change into a convex shape, a concave shape, or the like. When the corner formed by the top surface and the side surface of the insulating layer 131 is rounded, coverage with the common electrode 113 or the common layer 114 is improved in some cases.

In the step illustrated in FIG. 6B, the common electrode 113 and the protective layer 121 are formed to obtain the display device 100 illustrated in FIG. 6C. In addition, in the step illustrated in FIG. 6B, the common layer 114, the common electrode 113, and the protective layer 121 are formed to obtain the display device 100A illustrated in FIG. 6D.

When the top surface of the insulating layer 131 is made higher than the top surface of the EL layer 112, the side surface of the EL layer 112 can be covered with the insulating layer 131. Accordingly, damage to the EL layer 112 in the removal of the protective layer 147 can be reduced.

Structure Example 4

Figure 7B:
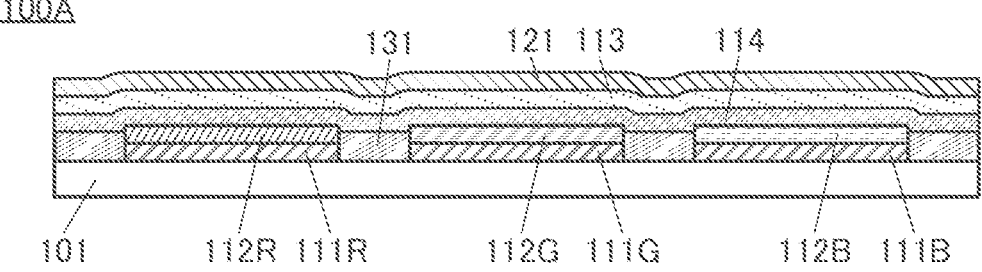

When the insulating layer 131 is provided so that the top surface of the insulating layer 131 is lower than the top surface of the EL layer 112, the display device 100 illustrated in FIG. 7A and the display device 100A illustrated in FIG. 7B are obtained.

The insulating layer 131 is provided so that the top surface of the insulating layer 131 is lower than the top surface of the EL layer 112, whereby coverage of the top surface of the EL layer 112 with the common electrode 113 or the common layer 114 is improved in some cases.

Structure Example 5

The top surface of the insulating layer 131 has a concave in some cases.

FIG. 8A illustrates a structure after etch back of the insulating film 131f is performed. As illustrated in FIG. 8A, the shape of the top surface of the insulating layer 131, which is formed by the etch back, has a concave in some cases. The shape of the top surface of the insulating layer 131 has a gently sloping depression, for example.

In the structure of FIG. 8A, the common electrode 113 and the protective layer 121 are formed to obtain the display device 100 illustrated in FIG. 8B. Alternatively, in the structure of FIG. 8A, the common layer 114, the common electrode 113, and the protective layer 121 are formed to obtain the display device 100A illustrated in FIG. 8C.

Structure Example 6

The shape of the top surface of the insulating layer 131 has a convex in some cases. The shape of the top surface of the insulating layer 131 illustrated in FIG. 9A and FIG. 9B has a gently curved surface projecting upward.

In the display device 100 illustrated in FIG. 9A, the common electrode 113 is provided over the EL layers 112 and the insulating layer 131 that is provided between the plurality of EL layers and has a top surface shape with a convex. In the display device 100 illustrated in FIG. 9B, the common layer 114 is provided over the EL layers 112 and the insulating layer 131 that is provided between the plurality of EL layers and has a top surface shape with a convex.

<Structure Including Insulating Layer 131 and Insulating Layer 130>

Examples of the structure of the display device of one embodiment of the present invention are described below with reference to FIG. 11A and FIG. 11B, FIG. 12A and FIG. 12B, FIG. 20A and FIG. 20B, and the like.

Structure Example 1-2

A structure including an insulating layer 130 in addition to the above-described insulating layer 131 as the insulating layer provided between the adjacent light-emitting elements in the display device 100 is described below.

Figure 11A:
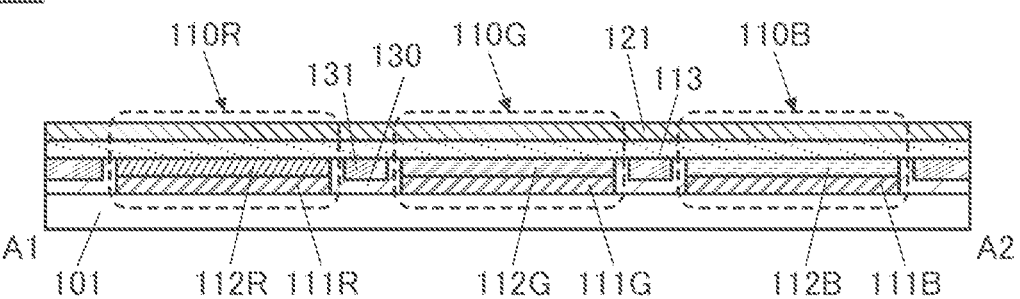
FIG. 11A and FIG. 11B are diagrams illustrating a structure example of the display device.
Figure 11B:
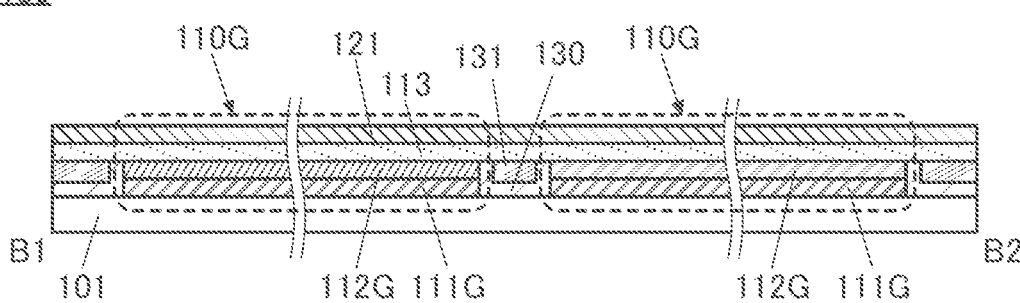

The display device 100 illustrated in FIG. 11A is different from that illustrated in FIG. 1B or the like in including the insulating layer 130. FIG. 11A is a schematic cross-sectional view taken along the dashed-dotted line A1-A2 in FIG. 1A, and FIG. 11B is a schematic cross-sectional view taken along the dashed-dotted line B1-B2.

FIG. 11A illustrates cross sections of the light-emitting element 110R, the light-emitting element 110G, and the light-emitting element 110B. The light-emitting element 110R includes the pixel electrode 111R, the EL layer 112R, and the common electrode 113. The light-emitting element 110G includes the pixel electrode 111G, the EL layer 112G, and the common electrode 113. The light-emitting element 110B includes the pixel electrode 111B, the EL layer 112B, and the common electrode 113.

The light-emitting element 110R includes the EL layer 112R between the pixel electrode 111R and the common electrode 113. The light-emitting element 110G includes the EL layer 112G between the pixel electrode 111G and the common electrode 113. The light-emitting element 110B includes the EL layer 112B between the pixel electrode 111B and the common electrode 113.

The insulating layer 130 and the insulating layer 131 are provided so as to fill a space between a stack of the pixel electrode 111 and the EL layer 112 and an adjacent stack of the pixel electrode T 11 and the EL layer 112. The insulating layer 130 is provided in contact with side surfaces of each of the pixel electrodes 111 and the EL layers 112 included in the light-emitting elements 110. Furthermore, the insulating layer 131 is provided over and in contact with the insulating layer 130 so as to fill a depression portion of the insulating layer 130 in a cross-sectional view.

In the top view of FIG. 1A, the insulating layer 130 and the insulating layer 131 are positioned between the pixel electrodes T 11 and/or the EL layers 112 of the adjacent pixels so as to have a mesh (also referred to as grid or matrix) shape.

As illustrated in FIG. 11B, when the insulating layer 130 and the insulating layer 131 are provided between the light-emitting elements of different colors, the EL layer 112R, the EL layer 112G, and the EL layer 112B can be inhibited from being in contact with each other. This suitably prevents unintentional light emission due to a current flow through two adjacent EL layers. As a result, the contrast can be increased to achieve a display device with high display quality.

The insulating layer 130 and the insulating layer 131 may be provided not between adjacent pixels exhibiting the same color but only between pixels exhibiting different colors. In this case, the insulating layer 130 and the insulating layer 131 can have a stripe shape in atop view. When the insulating layer 130 and the insulating layer 131 have a stripe shape, the space necessary to form the insulating layer 130 and the insulating layer 131 becomes unnecessary and a high aperture ratio can be achieved compared with the case where the insulating layer 130 and the insulating layer 131 have a grid shape. In the case where the insulating layer 130 and the insulating layer 131 have a stripe shape, the adjacent EL layers for the same color may be processed in a band shape so as to be continuous in a column direction.

The common electrode 113 is provided in contact with the top surface of the EL layer 112, a top surface of the insulating layer 130, and the top surface of the insulating layer 131. Between the adjacent light-emitting elements, a step is generated at the end portions of the pixel electrode 111 and the EL layer 112 owing to the region where the pixel electrode 111 and the EL layer 112 are provided and the region where the pixel electrode 111 and the EL layer 112 are not provided. By including the insulating layer 130 and the insulating layer 131 in the display device of one embodiment of the present invention, the step can be planarized and coverage with the common electrode can be improved as compared with the case where the common electrode 113 is provided in contact with the substrate 101 between the adjacent light-emitting elements. Thus, connection failures due to the disconnection at the step can be inhibited. Alternatively, it is possible to inhibit an increase in electric resistance due to local thinning of the common electrode 113 by the step.

In the case where the end portion of the pixel electrode 111 is substantially aligned with the end portion of the EL layer 112, the common electrode 113 and the pixel electrode 111 are sometimes short-circuited at the time of forming the common electrode 113 over the EL layer 112. In one embodiment of the present invention, provision of the insulating layer 130 and the insulating layer 131 between the adjacently positioned EL layers 112 can make the unevenness on the formation surface of the common electrode 113 smaller, whereby coverage with the common electrode 113 at the end portion of the EL layer 112 can be increased and favorable conductivity of the common electrode 113 can be achieved. In addition, a short circuit between the common electrode 113 and the pixel electrode 111 can be inhibited.

For the formation surface of the common electrode 113 to have higher planarity, the top surface of the insulating layer 130 and the top surface of the insulating layer 131 are preferably substantially aligned with the top surface of the EL layer 112. The top surface of the insulating layer 131 preferably has a flat shape. Note that it is not always necessary that the top surface of the insulating layer 130, the top surface of the insulating layer 131, and the top surface of the EL layer 112 are aligned with each other.

The insulating layer 130 includes a region in contact with the side surface of the EL layer 112 and functions as a protective insulating layer of the EL layer 112. When the insulating layer 130 is provided, entry of oxygen, moisture, or constituent elements thereof from the side surface of the EL layer 112 into the inside can be inhibited, and thus a highly reliable display device can be obtained.

If the width of the insulating layer 130 in the region in contact with the side surface of the EL layer 112 is large in a cross-sectional view, the distance between the EL layers 112 is increased and the aperture ratio is lowered in some cases. If the width of the insulating layer 130 is small, the effect of inhibiting the entry of oxygen, moisture, or constituent elements thereof from the side surface of the EL layer 112 into the inside becomes small in some cases. The width of the insulating layer 130 in the region in contact with the side surface of the EL layer 112 is preferably greater than or equal to 3 nm and less than or equal to 200 nm, further preferably greater than or equal to 3 nm and less than or equal to 150 nm, further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet further preferably greater than or equal to 10 nm and less than or equal to 50 nm. When the width of the insulating layer 130 is within the above-described range, a highly reliable display device with a high aperture ratio can be obtained.

The insulating layer 130 can be an insulating layer containing an inorganic material. As the insulating layer 130, a single layer or a stacked layer of aluminum oxide, magnesium oxide, hafnium oxide, gallium oxide, indium gallium zinc oxide, silicon oxide, silicon oxynitride, silicon nitride, silicon nitride oxide, or the like can be used, for example.

Note that in this specification, an oxynitride refers to a material that contains more oxygen than nitrogen in its composition, and a nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

For the formation of the insulating layer 130, a sputtering method, a chemical vapor deposition (CVD) method, a molecular beam epitaxy (MBE) method, a pulsed laser deposition (PLD) method, an atomic layer deposition (ALD) method, or the like can be used. An ALD method with favorable coverage can be suitably used for forming the insulating layer 130.

The insulating layer 131 provided over the insulating layer 130 has a function of filling the concave of the insulating layer 130, which is formed between the adjacent light-emitting elements. In other words, the insulating layer 131 has an effect of improving the planarity of the formation surface of the common electrode 113. An insulating layer containing an organic material can be suitably used for the insulating layer 131. As the insulating layer 131, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used, for example.

For example, the difference in height between the top surface of the insulating layer 131 and the top surface of the EL layer 112 is preferably less than or equal to 0.5 times, further preferably less than or equal to 0.3 times as larger as the thickness of the insulating layer 131. In addition, for example, the insulating layer 131 may be provided so that the top surface of the EL layer 112 is higher than the top surface of the insulating layer 131. Furthermore, for example, the insulating layer 131 may be provided so that the top surface of the insulating layer 131 is higher than the top surface of the light-emitting layer included in the EL layer 112. It is preferable that the thickness of the insulating layer 131 be, for example, greater than or equal to 0.3 times, greater than or equal to 0.5 times, or greater than or equal to 0.7 times as large as the thickness from the bottom surface of the pixel electrode 111 to the top surface of the EL layer 112.

The protective layer 121 is provided over the common electrode 113 so as to cover the light-emitting element 110R, the light-emitting element 110G, and the light-emitting element 110B.

Structure Example 2-2

Figure 12A:
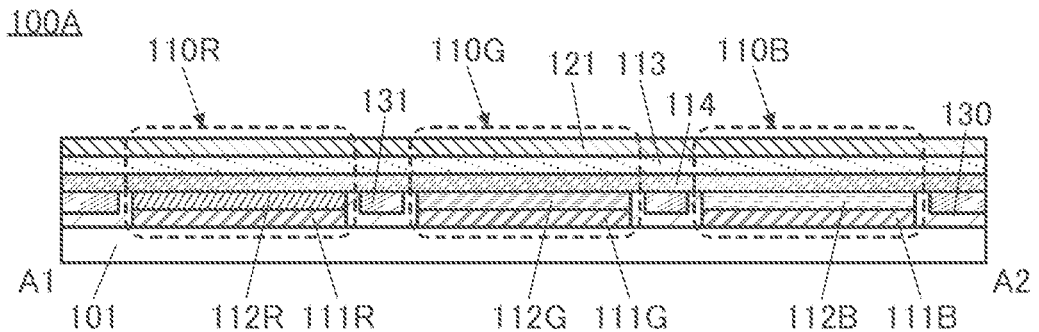
FIG. 12A and FIG. 12B are diagrams illustrating a structure example of the display device.
Figure 12B:
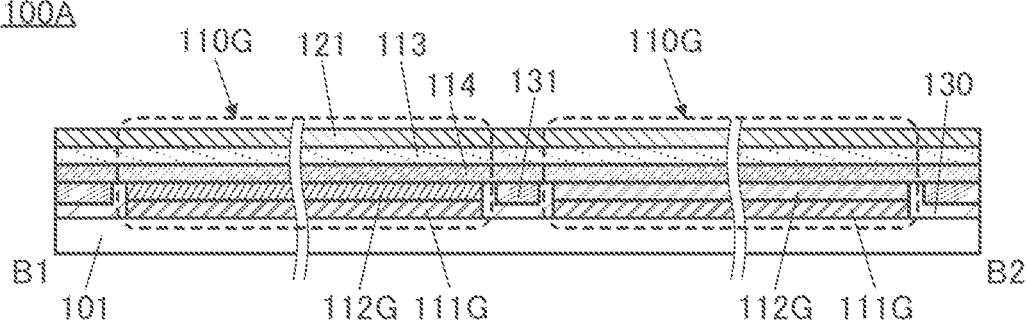

The display device 100A illustrated in FIG. 12A and FIG. 12B is different from the display device 100 illustrated in FIG. 11A and FIG. 11B mainly in including the common layer 114. FIG. 12A is a schematic cross-sectional view taken along the dashed-dotted line A1-A2 in FIG. 1A, and FIG. 12B is a schematic cross-sectional view taken along the dashed-dotted line B1-B2.

The display device 100A illustrated in FIG. 12A and FIG. 12B is different from that illustrated in FIG. 2A and FIG. 2B or the like in including the insulating layer 130.

Like the common electrode 113, the common layer 114 is provided across a plurality of light-emitting elements. The common layer 114 is provided to cover the EL layer 112R, the EL layer 112G, and the EL layer 112B. The manufacturing process can be simplified by including the common layer 114, reducing the manufacturing cost. The common layer 114 and the common electrode 113 can be formed successively without an etching step or the like between formations of the common layer 114 and the common electrode 113. Thus, the interface between the common layer 114 and the common electrode can be clean, and the light-emitting element can have favorable characteristics.

The common layer 114 is preferably in contact with one or more of the top surfaces of the EL layer 112R, the EL layer 112G, and the EL layer 112B.

Structure Example 3-2

Figure 20A:
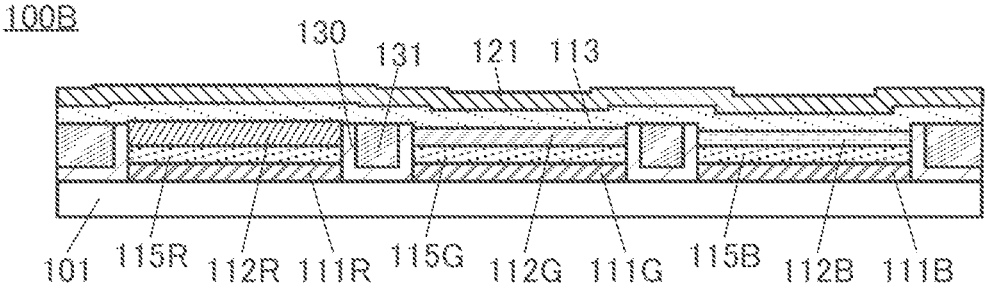
FIG. 20A and FIG. 20B are diagrams illustrating structure examples of the display device.

The display device 100B illustrated in FIG. 20A is different from the display device 100B illustrated in FIG. 10A mainly in including the insulating layer 130, for example. The display device 100C illustrated in FIG. 20B is different from the display device 100C illustrated in FIG. 10B mainly in including the insulating layer 130, for example.

In a display device 100B illustrated in FIG. 20A, the light-emitting element 110R includes the optical adjustment layer 115R between the pixel electrode 111R and the EL layer 112R. The light-emitting element 110G includes the optical adjustment layer 115G between the pixel electrode 111G and the EL layer 112G. The light-emitting element 1101B includes the optical adjustment layer 115B between the pixel electrode 111B and the EL layer 112B.

Figure 20B:
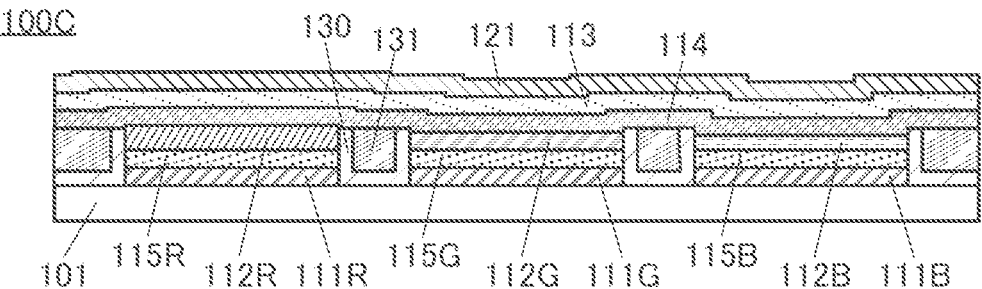

The display device 100C illustrated in FIG. 20B is different from the display device 100B illustrated in FIG. 20A mainly in including the common layer 114 between the EL layer 112 and the common electrode 113 and in the structure of the light-emitting element due to the common layer 114.

With the structures illustrated in FIG. 20A and FIG. 20B in which the optical adjustment layer 115 is included and a space between the light-emitting elements is filled with the insulating layer 130 and the insulating layer 131, the display device can achieve high color purity and higher reliability.

Since the display device of this embodiment described above can be manufactured not through formation of EL layers using a metal mask, an increase in size, definition, or resolution of the display device can be achieved.

The display device of this embodiment has a structure in which a space between the adjacently positioned EL layers or between the adjacently positioned pixel electrodes and EL layers is filled with the insulating layers having a stacked-layer structure; accordingly, the planarity of the formation surface of the common electrode can be improved and thus disconnection of the common electrode at the step or formation of a local thin region can be inhibited. This can improve reliability of the display device.

By particularly using the insulating layer containing the organic material as one of the insulating layers having the stacked-layer structure, the formation surface of the common electrode or the common layer can be effectively planarized. Furthermore, the provision of, as one of the insulating layers having the stacked-layer structure, the insulating layer containing the inorganic material so as to be in contact with the side surface of the EL layer can prevent entry of impurities to the EL layer, whereby the display device can achieve higher reliability.

With the structure and the manufacturing method of the display device of one embodiment of the present invention described above, the display device can include minute, high-luminance, and highly reliable organic EL elements.

Manufacturing Method Example 2

The display device 100 illustrated in FIG. 11A and FIG. 11B is taken as an example in the following description. FIG. 13A to FIG. 14F are schematic cross-sectional views in steps of the method for manufacturing the display device described below as an example.

[Preparation for Substrate 101]

First, the substrate 101 is prepared. For the substrate 101, the description in the above manufacturing method 1 can be referred to.

Then, the conductive film 11 if to be the pixel electrode 111 is formed over the substrate 101.

[Formation of EL Film 112Rf]

Next, the EL film 112Rf that is to be the EL layer 112R later is formed over the conductive film 111*f*. For the EL film 112Rf, the description in the above manufacturing method 1 can be referred to.

[Formation of Sacrificial Film 144*a*]

Next, the sacrificial film 144*a* is formed to cover the EL film 112Rf. For the sacrificial film 144*a*, the description in the above manufacturing method 1 can be referred to.

[Formation of Protective Film 146*a*]

Next, the protective film 146*a* is formed over the sacrificial film 144*a*. For the protective film 146*a*, the description in the above manufacturing method 1 can be referred to.

[Formation of Resist Mask 143*a*]

Figure 13A:
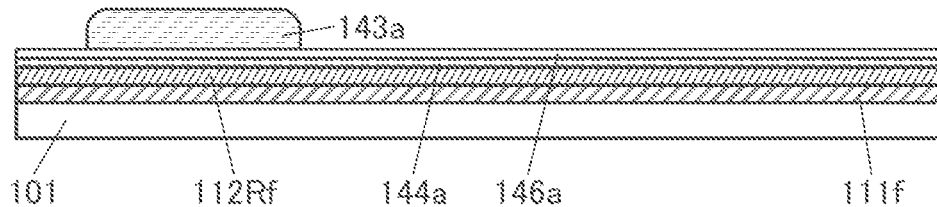
FIG. 13A to FIG. 13F are diagrams illustrating an example of a method for manufacturing the display device.

Next, the resist mask 143*a* is formed over the protective film 146*a* (FIG. 13A). For the resist mask 143*a*, the description in the above manufacturing method 1 can be referred to.

[Etching of Protective Film 146*a*]

Next, part of the protective film 146*a* that is not covered with the resist mask 143*a* is removed by etching, so that an island-shaped or band-shaped protective layer 147*a* is formed.

In the etching of the protective film 146*a*, an etching condition with high selectively is preferably employed so that the sacrificial film 144*a* is not removed by the etching. Either wet etching or dry etching can be performed for the etching of the protective film 146*a*; with use of dry etching, shrinking of a pattern of the protective film 146*a* can be inhibited.

[Removal of Resist Mask 143*a*]

Next, the resist mask 143*a* is removed.

The removal of the resist masks 143*a* can be performed by wet etching or dry etching. It is particularly preferable to perform dry etching (also referred to as plasma ashing) using an oxygen gas as an etching gas to remove the resist masks 143*a*.

At this time, the removal of the resist mask 143*a* is performed in a state where the EL film 112Rf is covered with the sacrificial film 144*a*; thus, the EL film 112Rf is less affected by the removal. In particular, when the EL film 112Rf is exposed to oxygen, the electrical characteristics are adversely affected in some cases; therefore, it is preferable that the EL film 112Rf be covered with the sacrificial film 144*a* when etching using an oxygen gas, such as plasma ashing, is performed.

[Etching of Sacrificial Film 144*a*]

Next, part of the sacrificial film 144*a* that is not covered with the protective layer 147*a* is removed by etching with use of the protective layer 147*a* as a mask, so that the islands-shaped or band-shaped sacrificial layer 145*a* is formed.

Either wet etching or dry etching can be performed for the etching of the sacrificial film 144*a*; the use of a dry etching method is preferable, in which case shrinking of the pattern can be inhibited.

[Etching of EL Film 112Rf]

Figure 13B:
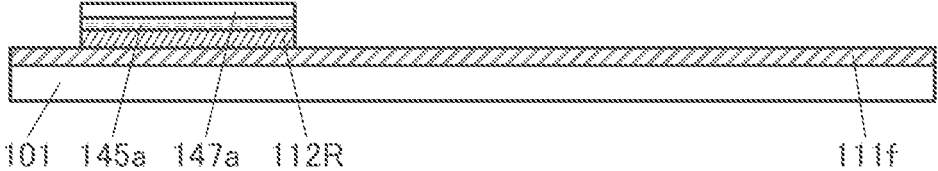

Next, part of the EL film 112Rf that is not covered with the sacrificial layer 145*a* is removed by etching, so that the island-shaped or band-shaped EL layer 112R is formed (FIG. 13B).

For the etching of the EL film 112Rf, it is preferable to use dry etching using an etching gas that does not contain oxygen as its main component. This can inhibit the alteration of the EL film 112Rf to achieve a highly reliable display device. Examples of the etching gas that does not contain oxygen as its main component include $CF_4$, $C_4F_8$, $SF_6$, $CHF_3$, $Cl_2$, $H_2O$, $BCl_3$, and a rare gas such as He. Alternatively, a mixed gas of the above gas and a dilute gas that does not contain oxygen can be used as the etching gas. In the etching of the EL film 112Rf, the protective layer 147*a* may be removed.

[Formation of EL Layer 112G and EL Layer 112B]

Next, the EL film 112Gf that is to be the EL layer 112G is formed over the sacrificial layer 145*a* and the exposed conductive film 111*f*. For the EL film 112Gf, the description of the EL film 112Rf can be referred to.

Then, the sacrificial film 144*b* is formed over the EL film 112Gf, and the protective film 146*b* is formed over the sacrificial film 144*b*. For the sacrificial film 144*b*, the description of the sacrificial film 144*a* can be referred to. For the protective film 146*b*, the description of the protective film 146*a* can be referred to.

Figure 13C:
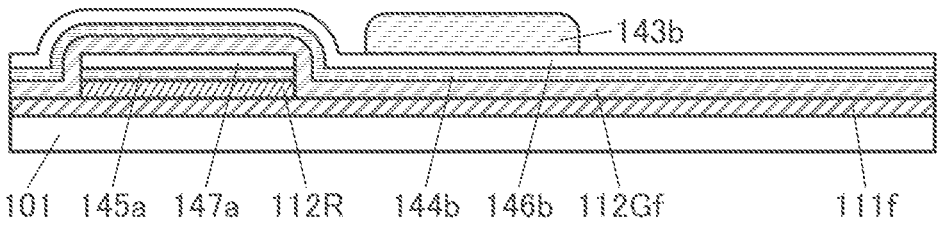

Next, the resist mask 143*b* is formed over the protective film 146*b* (FIG. 13C).

Then, the protective film 146*b* is etched with use of the resist mask 143*b*, so that the protective layer 147*b* is formed. After that, the resist mask 143*b* is removed.

Figure 13D:
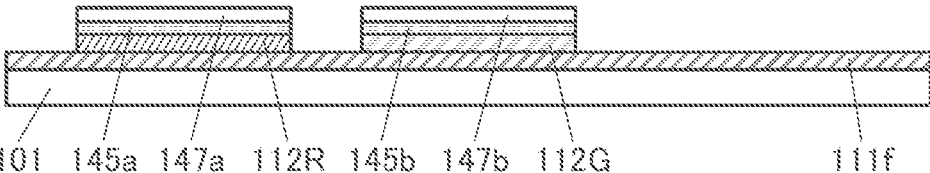

Next, the sacrificial film 144*b* and the EL film 112Gf are each etched with use of the protective layer 147*b* as a mask, so that the sacrificial layer 145*b* and the EL layer 112G are formed (FIG. 13D).

Next, the EL film 112Bf that is to be the EL layer 112B is formed over the sacrificial layer 145*a*, the sacrificial layer 145*b*, and the exposed conductive film 111*f*. For the EL film 112Bf, the description of the EL film 112Rf can be referred to.

Next, a sacrificial layer 144*c* is formed over the EL film 112Bf, and the protective film 146*c* is formed over the sacrificial layer 144*c*. For the sacrificial layer 144*c*, the description of the sacrificial film 144a can be referred to. For the protective film 146c, the description of the protective film 146a can be referred to.

Figure 13E:
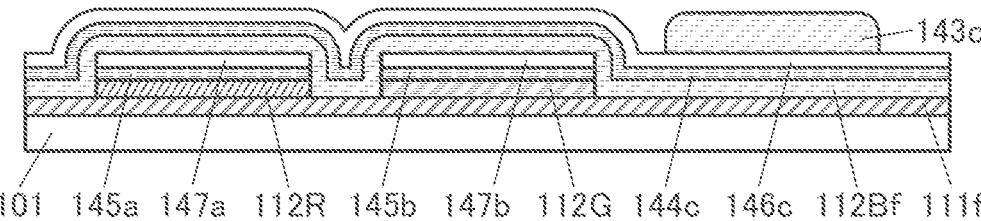

Next, the resist mask 143c is formed over the protective film 146c (FIG. 13E).

Then, the protective film 146c is etched with use of the resist mask 143c, so that the protective layer 147c is formed. After that, the resist mask 143c is removed.

Figure 13F:
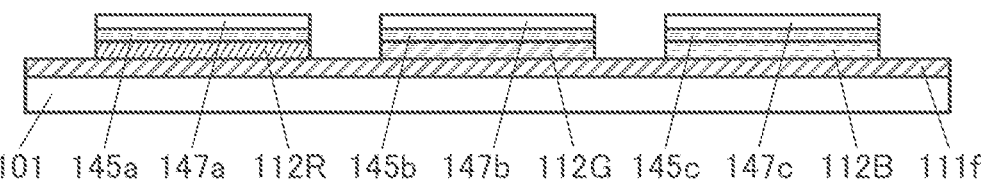

Next, the sacrificial layer 144c and the EL film 112Bf are each etched with use of the protective layer 147c as a mask, so that the sacrificial layer 145c and the EL layer 112B are formed (FIG. 13F).

[Formation of Pixel Electrode 111R, Pixel Electrode 111G, and Pixel Electrode 111B]

Figure 14A:
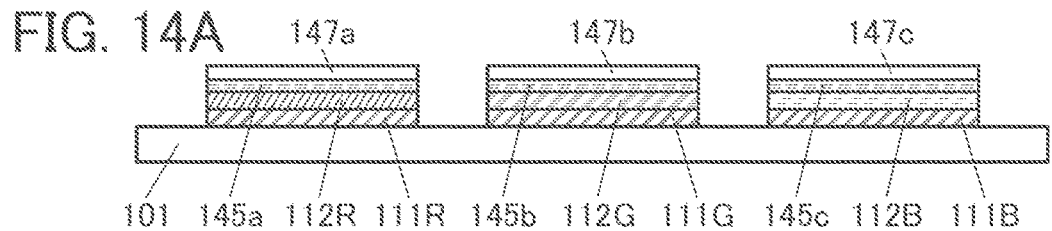
FIG. 14A to FIG. 14F are diagrams illustrating the example of the method for manufacturing the display device.

Next, part of the conductive film 11 if that is not covered with the EL layer 112R, the EL layer 112G, the EL layer 112B, the sacrificial layer 145a, the sacrificial layer 145b, the sacrificial layer 145c, the protective layer 147a, the protective layer 147b, or the protective layer 147c is etched, so that the pixel electrode 111R, the pixel electrode 111G, and the pixel electrode 111B are formed (FIG. 14A).

The etching of the conductive film 11 if can be performed by wet etching or dry etching. Here, dry etching with the use of an etching gas that does not contain oxygen as its main component is used for the etching conditions of the conductive film 111f, whereby damage to the EL layer 112 can be reduced.

[Formation of Insulating Layer 130]

Figure 14B:
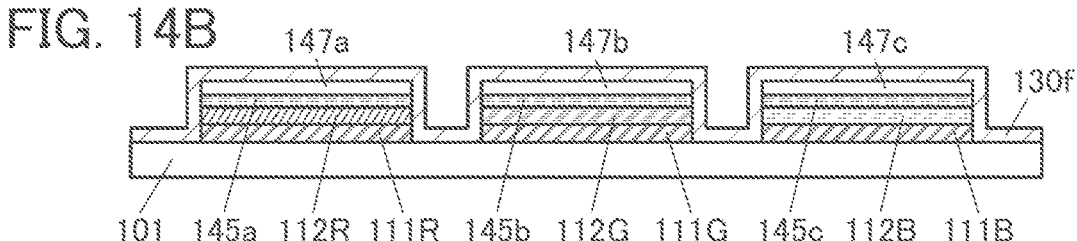

Next, an insulating film 130f to be the insulating layer 130 is formed (FIG. 14B). A film containing an inorganic material is preferably used as the insulating film 130f. For example, a single layer or stacked layers of a film containing aluminum oxide, magnesium oxide, hafnium oxide, gallium oxide, indium gallium zinc oxide, silicon oxide, silicon oxynitride, silicon nitride, silicon nitride oxide, or the like can be used.

For the formation of the insulating film 130f, a sputtering method, a chemical vapor deposition (CVD) method, a molecular beam epitaxy (MBE) method, a pulsed laser deposition (PLD) method, an atomic layer deposition (ALD) method, or the like can be used. An ALD method with favorable coverage can be suitably used for forming the insulating film 130f.

[Formation of Insulating Layer 131]

Figure 14C:
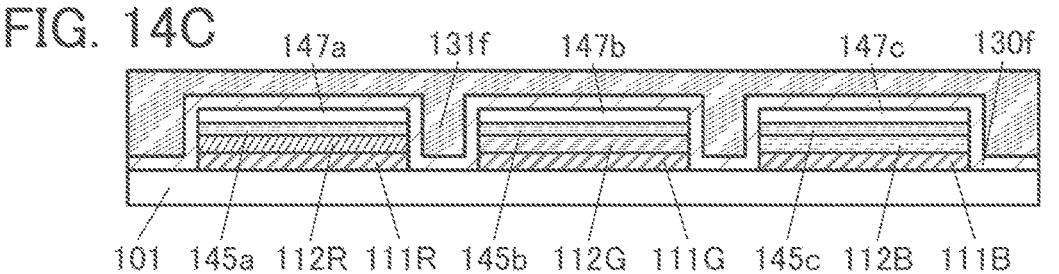

Next, an insulating film 131f to be the insulating layer 131 is formed (FIG. 14C). The insulating film 131f is provided so as to cover the protective layer 147, the sacrificial layer 145, the EL layer 112, and the pixel electrode 111. The insulating film 131f is preferably a planarization film.

As the insulating film 131f, an insulating film containing an organic material is preferably used, and a resin is preferably used as the organic material.

As a material that can be used for the insulating film 131f, an acrylic resin, a polyimide resin, an epoxy resin, a polyamide resin, a polyimide-amide resin, a siloxane resin, a benzocyclobutene-based resin, a phenol resin, and precursors of these resins can be given, for example.

Figure 14D:
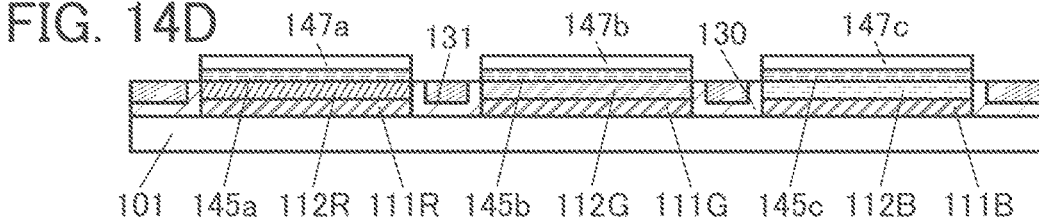

Next, the insulating film 130f and the insulating film 131f are etched to expose the top surface of the protective layer 147 (FIG. 14D). Thus, the insulating layer 130 and the insulating layer 131 that cover the side surfaces of the EL layer 112R, the EL layer 112G, and the EL layer 112B are formed. The etching of the insulating film 130f and the insulating film 131f is performed substantially uniformly on the top surfaces of the insulating film 130f and the insulating film 131f. Such uniform etching for planarization is also referred to as etch back.

A dry etching method or a wet etching method can be used for the etching of the insulating film 130f and the insulating film 131f. The etching may be performed by ashing using oxygen plasma or the like. Note that the ashing using oxygen plasma has advantages such as high controllability, good in-plane uniformity, and high suitability for treatment using a large-sized substrate and thus can be suitably used for removal of part of the insulating film 130f and part of the insulating film 131f. Chemical mechanical polishing (CMP) may be used for the etching of the insulating film 130f and the insulating film 131f.

Note that it is preferable to reduce damage to the EL layer 112 due to etching at the time of etching the insulating film 130f and the insulating film 131f. For this reason, the etching is preferably performed so that an exposed portion of the side surface of the EL layer 112 is small, for example. Furthermore, it is possible to reduce damage to the top surface of the EL layer 112 due to etching by performing the etching of the insulating film 130f and the insulating film 131f in the state where the sacrificial layer 145 and/or the protective layer 147 is provided over the EL layer 112.

The height of the top surface of the insulating layer 130 and/or the height of the top surface of the insulating layer 131 can be adjusted by the etching amount in formation of the insulating layer 130 and the insulating layer 131. Here, the etching amount is preferably adjusted so that the insulating layer 130 can cover the side surface of the EL layer 112. In particular, the etching amount is preferably adjusted so that the insulating layer 130 can cover the side surface of the light-emitting layer included in the EL layer 112.

In this embodiment, as illustrated in FIG. 14D, etching is performed so that the top surface of the insulating layer 130 and the top surface of the insulating layer 131 are substantially aligned with the top surface of the EL layer 112. FIG. 14D also illustrates an example where the insulating layer 130 and the insulating layer 131 are formed so that the top surface and the side surface of the protective layer 147 and the side surface of the sacrificial layer 145 are exposed. When the top surface of the insulating layer 130 and the top surface of the insulating layer 131 are substantially aligned with the top surface of the EL layer, unevenness on the surface where the common electrode 113 is provided can be made small at the time of forming the common electrode 113, which is illustrated in FIG. 14F described later, and coverage can be increased.

The surface planarity of the insulating film 131f containing an organic material may change due to unevenness of the formation surface and the sparseness and density of the pattern formed on the formation surface. The planarity of the insulating film 131f may change due to the viscosity or the like of a material used for the insulating film 131f. For example, in some cases, the thickness of the insulating film 131f in a region not overlapping with the EL layer 112 becomes smaller than the thickness of the insulating film 131f in a region overlapping with the EL layer 112. In such a case, for example, etch back of the insulating film 131f is performed, whereby the height of the top surface of the insulating layer 131 becomes lower than the height of the top surface of the protective layer 147 or the height of the top surface of the sacrificial layer 145 in some cases.

The insulating film 131f has a shape having a concave (a hollow shape), a shape having a convex (a bulging shape), or the like in a region between the plurality of EL layers 112 in some cases.

[Removal of Protective Layers and Sacrificial Layers]

Figure 14E:
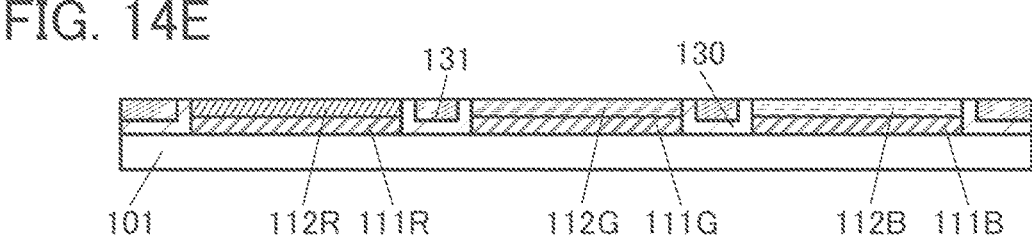
Figure 14F:
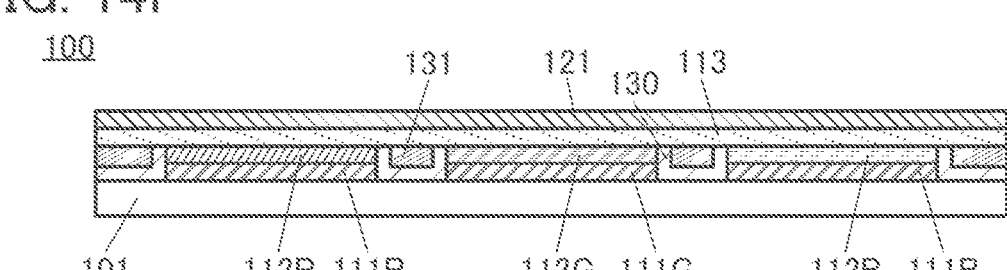

Next, the protective layer 147a, the protective layer 147b, the protective layer 147c, the sacrificial layer 145a, the sacrificial layer 145*b*, and the sacrificial layer 145*c* are removed to expose the top surfaces of the EL layer 112R, the EL layer 112G, and the EL layer 112B (FIG. 14E).

In the example illustrated in FIG. 14E, the insulating layer 130 is provided so that the height of the top surface of the insulating layer 130 is substantially the same as the height of the top surface of the EL layer 112. In FIG. 14E, the top surface of the EL layer 112 is exposed, and the side surface of the EL layer 112 is covered with the insulating layer 130. The side surface of the EL layer 112 is covered with the insulating layer 130, whereby deterioration due to moisture of the EL layer can be prevented and damage to the EL layer due to etching of the protective layer 147 can be reduced.

The shape or height of the top surface of the insulating layer 130 and/or the insulating layer 131 may change due to the step of removing the protective layers and the sacrificial layers.

The protective layer 147*a*, the protective layer 147*b*, and the protective layer 147*c* can be removed by wet etching or dry etching.

The sacrificial layer 145*a*, the sacrificial layer 145*b*, and the sacrificial layer 145*c* can be removed by wet etching or dry etching. At this time, a method that causes damage to the EL layer 112R, the EL layer 112G, and the EL layer 112B as little as possible is preferably employed. In particular, a wet etching method is preferably used. For example, wet etching using an aqueous solution of tetramethylammonium hydroxide (TMAH), diluted hydrofluoric acid, oxalic acid, phosphoric acid, acetic acid, nitric acid, or a mixed solution thereof is preferably performed. With use of these conditions of wet etching, for example, damage to the insulating layer can be reduced.

Although the case where the protective layers and the sacrificial layers are removed after etching back the insulating film 130*f* and the insulating film 131*f* is illustrated as an example in FIG. 14C to FIG. 14E, the embodiment of the present invention is not limited thereto. For example, the sacrificial layer 145, the protective layer 147, and the insulating film 130*f* and the insulating film 131*f* in the region overlapping with the protective layer 147 may be removed by a lift-off method or the like to form the insulating layer 130 and the insulating layer 131.

In this manner, the EL layer 112R, the EL layer 112G, and the EL layer 112B can be formed separately.

As a way of forming EL layers separately between light-emitting elements of different colors, an evaporation method using a shadow mask such as a metal mask is known. However, this method causes a deviation from the designed shape and position of an island-shaped organic film due to various influences such as the low accuracy of the metal mask position, the positional deviation between the metal mask and a substrate, a warp of the metal mask, and the vapor-scattering-induced expansion of outline of the deposited film; accordingly, it is difficult to achieve high resolution and a high aperture ratio. In addition, dust derived from a material attached to the metal mask in evaporation is generated in some cases. Such dust might cause defective patterning of the light-emitting elements. In addition, a short circuit derived from the dust may occur. A step of cleaning the material attached to the metal mask is necessary. Thus, a measure has been taken for pseudo improvement in resolution (also referred to pixel density) by, for example, employing a unique pixel arrangement such as a PenTile arrangement.

In one embodiment of the present invention, fine patterning of an EL layer is performed without a shadow mask such as a metal mask. With this, a display device with high resolution and a high aperture ratio, which has been difficult to achieve, can be fabricated. Moreover, EL layers can be formed separately, enabling the display device to perform extremely clear display with high contrast and high display quality.

Although the case where the light-emitting elements including any one of EL layers of three different colors are used as the light-emitting elements positioned in the pixels is described as an example in this embodiment, the embodiment of the present invention is not limited thereto. Light-emitting elements exhibiting two different colors may constitute pixels, or light-emitting elements of three or more colors may constitute pixels.

[Formation of Common Electrode 113]

Next, the common electrode 113 is formed to cover the EL layer 112R, the EL layer 112G, and the EL layer 112B. The common electrode 113 can be formed by a sputtering method or a vacuum evaporation method, for example.

Through the above steps, the light-emitting element 110R, the light-emitting element 110G, and the light-emitting element 110B can be manufactured.

[Formation of Protective Layer 121]

Next, the protective layer 121 is formed over the common electrode 113 (FIG. 14F). For deposition of an inorganic insulating film used for the protective layer 121, a sputtering method, a PECVD method, or an ALD method is preferably used. In particular, an ALD method is preferable because it provides excellent step coverage and is less likely to cause a defect such as pinhole. An organic insulating film is preferably formed by an inkjet method because a uniform film can be formed in a desired area.

Through the above-described steps, the display device 100 illustrated in FIG. 11A and FIG. 11B can be manufactured.

Since process damage to the EL layer 112R, the EL layer 112G, and the EL layer 112B can be reduced with the use of the above-described manufacturing method, an extremely highly reliable display device can be achieved.

[Formation of Common Layer 114]

Note that the display device 100A illustrated in FIG. 12A and FIG. 12B can be manufactured when the common layer 114 is formed to cover the EL layer 112R, the EL layer 112G, and the EL layer 112B before the common electrode 113 is formed and then the common electrode 113 is formed.

In the method for manufacturing the display device described in this embodiment, the sacrificial layer is formed using a resist mask, and the EL layer and the pixel electrode can be processed using the formed sacrificial layer; thus, a light-emitting element can be formed without use of different resist masks for processing the pixel electrode and processing the EL layer. Accordingly, a margin for the positions of the end portions of the pixel electrode and the EL layer is not necessarily provided for forming a light-emitting element. With a reduction in the margin for the positions, a light-emitting region can be extended, whereby the aperture ratio of the light-emitting element can be increased. Moreover, with a reduction in the margin for the positions, a reduction in the pixel size is possible, whereby the display device can have higher resolution. Furthermore, the number of uses of the resist masks can be reduced, whereby the process can be simplified. This enables a reduction in cost and an improvement in yield.

In the case where EL layers for different colors are adjacent to each other, it is difficult to set the distance between the EL layers adjacent to each other to be less than 10 μm with a formation method using a metal mask, for example; however, with use of the above method, the distance can be decreased to be less than or equal to 3 μm, less than or equal to 2 μm, or less than or equal to 1 μm. For example, with use of an exposure apparatus for LSI, the distance can be decreased to be less than or equal to 500 nm, less than or equal to 200 nm, less than or equal to 100 nm, or less than or equal to 50 nm. Accordingly, the area of anon-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern. This causes a reduction in an effective area that can be used as a light-emitting region with respect to the entire pattern area. In contrast, in the above manufacturing method, a pattern is formed by processing a film deposited to have a uniform thickness, which enables a uniform thickness in the pattern; thus, even with a fine pattern, almost the entire area can be used as a light-emitting region. Therefore, the above manufacturing method makes it possible to achieve both a high resolution and a high aperture ratio.

As described above, with the above manufacturing method, a display device in which minute light-emitting elements are integrated can be obtained, and it is not necessary to conduct a pseudo improvement in resolution with a unique pixel arrangement such as a PenTile arrangement; therefore, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction.

Structure Example 7

Described in the above-described manufacturing method illustrated in FIG. 13A to FIG. 14F is a method for forming the pixel electrode 111 including the end portion substantially aligned with the end portion of the EL layer 112 by etching the conductive film 111*f* in the region not covered with the EL layer 112 after formation of the EL layer 112. However, the embodiment of the present invention is not limited thereto. The structure example 2 of the case where the pixel electrode 111R, the pixel electrode 111G, and the pixel electrode 111B are formed before the EL film 112Rf is formed and a manufacturing method thereof are described with reference to FIG. 15A to FIG. 15F.

First, as illustrated in FIG. 15A, the pixel electrode 111R, the pixel electrode 111G, and the pixel electrode 111B are formed. After that, as described with reference to FIG. 13A to FIG. 13F, the EL layer 112, the sacrificial layer 145, and the protective layer 147 which correspond to each of the light-emitting elements 110 are formed using a resist mask or the like (FIG. 15B). Then, the insulating film 130*f* and the insulating film 131*f* are formed (FIG. 15C).

Next, the insulating film 130*f* and the insulating film 131*f* are etched back as illustrated in FIG. 15D, and then the sacrificial layer 145 and the protective layer 147 are removed (FIG. 15E), whereby the display device 100 illustrated in FIG. 15F is obtained.

In each of the light-emitting elements 110 illustrated in FIG. 15F, the end portion of the pixel electrode 111 is positioned outside the end portion of the EL layer 112. In the top surface of the pixel electrode 111, the end portion and its vicinity are covered with the insulating layer 131.

In the structure example illustrated in FIG. 15A to FIG. 15F, the patterns of the pixel electrode 111R, the pixel electrode 111G, and the pixel electrode 111B are formed in advance, in which case damage to the EL layer 112 can be reduced in some cases compared with the case of forming a pattern of the conductive film after formation of the EL layer 112. While in the structure example 1 where the end portion of the EL layer 112 and the end portion of the pixel electrode 111 are aligned with each other, the width between adjacent light-emitting elements can be reduced and thus the aperture ratio can be improved. Furthermore, the number of masks for forming the pixel electrode 111 can be reduced, which enables an improvement in yield in manufacturing the display device and a reduction in cost.

Structure Example 8

Figure 16A:
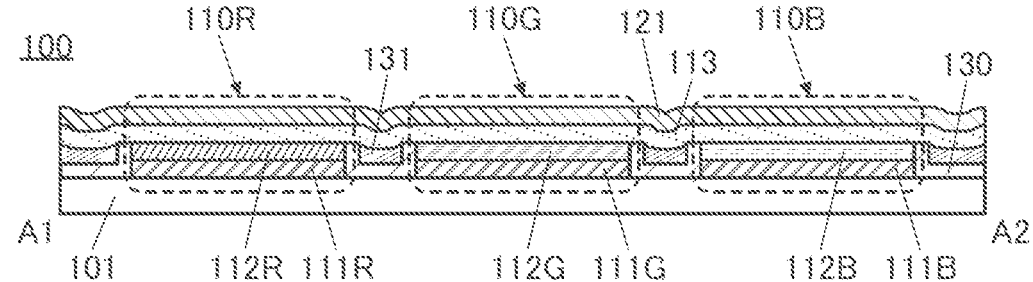
FIG. 16A and FIG. 16B are diagrams illustrating structure examples of the display device.

FIG. 16A illustrates another structure example of the display device 100 of this embodiment. FIG. 16A illustrates an embodiment including a region in which the top surface of the insulating layer 131 is closer to the substrate 101 than the top surface of the EL layer 112 is (put another way, lower in height than the top surface of the EL layer 112).

In FIG. 16A, a case where the top surface of the insulating layer 131 formed by etch back has a concave shape and the end portion of the insulating layer 131 is aligned with the top surface of the insulating layer 130 and/or the EL layer 112 in a cross-sectional view is illustrated as an example; however, the embodiment of the present invention is not limited thereto. A structure in which the top surface of the insulating layer 131 has a substantially flat shape and the top surface is positioned closer to the substrate 101 side than the top surface of the EL layer 112 is may be employed. Alternatively, the end portion of the insulating layer 131 may be in contact with the side surface of the insulating layer 130.

The insulating layer 131 is provided so that the top surface of the insulating layer 131 is positioned closer to the substrate 101 side than the top surface of the EL layer 112 is, whereby coverage of the top surface of the EL layer 112 with the common electrode 113 is improved in some cases.

Structure Example 9

Figure 16B:
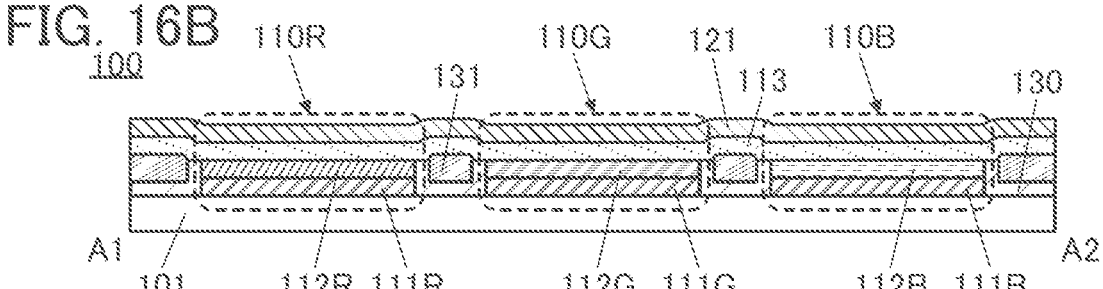

FIG. 16B illustrates another structure example of the display device 100 of this embodiment. FIG. 16B illustrates an embodiment including a region in which the top surface of the insulating layer 131 protrudes beyond the top surface of the EL layer 112.

In FIG. 16B, a case where the insulating layer 131 has a convex shape and the end portion of the insulating layer 131 is aligned with the top surface of the insulating layer 130 and/or the EL layer 112 in a cross-sectional view is illustrated as an example; however, the embodiment of the present invention is not limited thereto. A structure in which the top surface of the insulating layer 131 has a substantially flat shape and the top surface protrudes beyond the top surface of the EL layer 112 may be employed.

When the insulating layer 131 is provided so that the top surface of the insulating layer 131 is positioned closer to the substrate 101 side than the top surface of the EL layer 112 is, the common electrode 113 includes a region in contact with part of the side surface of the insulating layer 131. Note that in the manufacturing process, part of the insulating layer 131 may be etched by the removal of the protective layer 147 and the sacrificial layer 145 to change the shape of the insulating layer 131. For example, the thickness of the insulating layer 131 may be reduced. Furthermore, for example, a corner formed by the top surface and the side surface of the insulating layer 131 may be rounded. When the corner formed by the top surface and the side surface of the insulating layer 131 is rounded, coverage with the common electrode 113 is improved in some cases.

When the top surface of the insulating layer 131 protrudes beyond the top surface of the EL layer 112 as in the structure example 4, the side surface of the EL layer 112 can be protected also by the insulating layer 131, whereby damage to the EL layer 112 in removal of the protective layer 147 can be reduced.

Structure Example 10

Figure 17A:
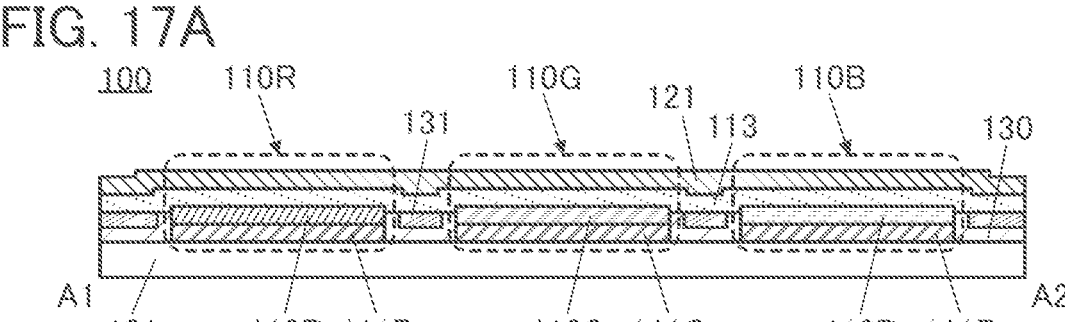
FIG. 17A to FIG. 17C are diagrams illustrating structure examples of the display device.

FIG. 17A illustrates another structure example of the display device 100 of this embodiment. FIG. 17A illustrates an embodiment including a region in which the top surface of the insulating layer 130 is closer to the substrate 101 than the top surface of the EL layer 112 is (put another way, lower than the top surface of the EL layer 112).

The insulating layer 131 is preferably in contact with at least the side surface of the light-emitting layer included in the EL layer 112. When the insulating layer 131 covers the side surface of the light-emitting layer, entry of oxygen, moisture, or constituent elements thereof from the side surface of the light-emitting layer into the inside can be inhibited, and thus a highly reliable display device can be obtained.

Structure Example 11

Figure 17B:
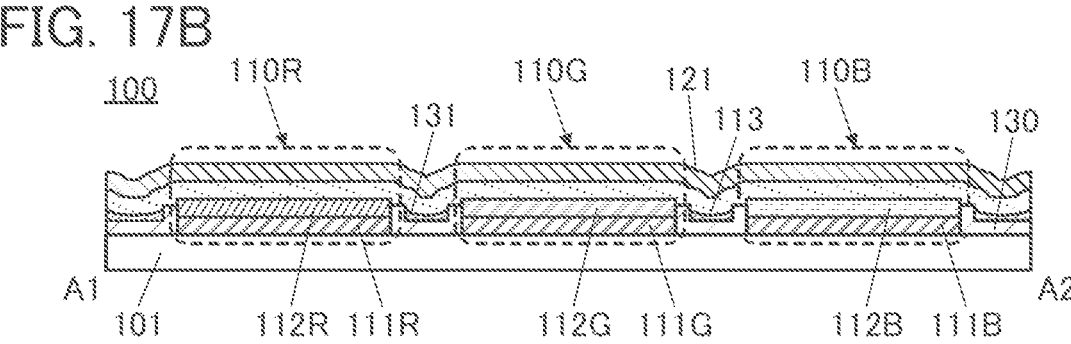

FIG. 17B illustrates another structure example of the display device 100 of this embodiment. FIG. 17B illustrates an embodiment including a region in which the top surface of the insulating layer 130 is closer to the substrate 101 than the top surface of the EL layer 112 is and a region in which the top surface of the insulating layer 131 is closer to the substrate 101 than the top surface of the insulating layer 130 is.

In FIG. 17B, a case where the top surface of the insulating layer 131 formed by etch back has a concave shape is illustrated as an example; however, the embodiment of the present invention is not limited thereto. A structure in which the top surface of the insulating layer 131 has a substantially flat shape and the top surface is positioned closer to the substrate 101 side than the top surface of the insulating layer 130 is may be employed.

With the embodiment in which the top surfaces of the insulating layer 130 and the insulating layer 131 are positioned closer to the substrate 101 side in a stepwise manner than the top surface of the EL layer 112 is, coverage of the top surface of the EL layer 112 with the common electrode 113 is improved in some cases.

Structure Example 12

Figure 17C:
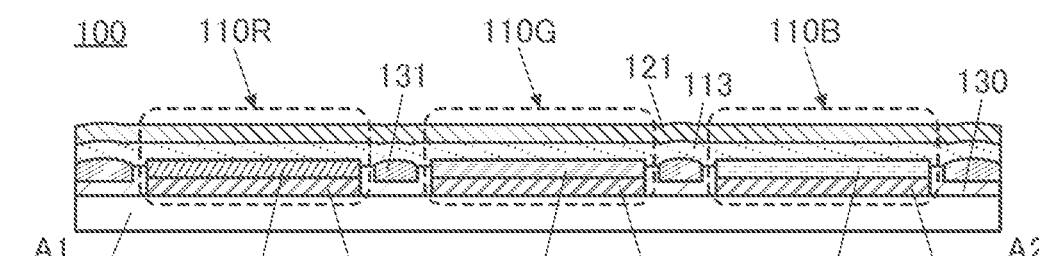

FIG. 17C illustrates another structure example of the display device 100 of this embodiment. FIG. 17C illustrates an embodiment including a region in which the top surface of the insulating layer 130 is closer to the substrate 101 than the top surface of the EL layer 112 is and a region in which the top surface of the insulating layer 131 protrudes beyond the top surface of the insulating layer 130. In the protruding region, the side surface of the insulating layer 131 is in contact with the common electrode 113.

In FIG. 17C, a case where the top surface of the insulating layer 131 has a convex shape is illustrated as an example; however, the embodiment of the present invention is not limited thereto. A structure in which the top surface of the insulating layer 131 has a substantially flat shape and the top surface protrudes beyond the top surface of the insulating layer 130 may be employed.

When the top surface of the insulating layer 131 protrudes beyond the top surface of the insulating layer 130, the side surface of the EL layer 112 in the region not covered with the insulating layer 130 can be protected by the insulating layer 131, whereby damage to the EL layer 112 in removal of the protective layer 147 can be reduced.

Structure Example 13

Figure 18A:
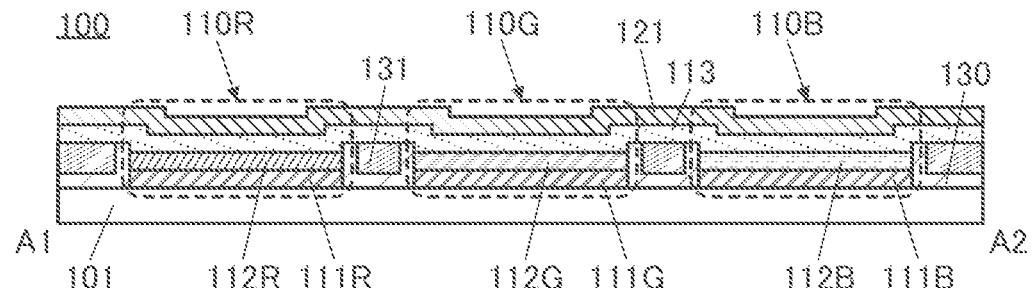
FIG. 18A to FIG. 18C are diagrams illustrating structure examples of the display device.

FIG. 18A illustrates another structure example of the display device 100 of this embodiment. FIG. 18A illustrates an embodiment including a region in which the top surface of the insulating layer 130 and the top surface of the insulating layer 131 protrude beyond the top surface of the EL layer 112 in a cross-sectional view. In the protruding region, the side surface of the insulating layer 130 is in contact with the common electrode 113.

When the top surface of the insulating layer 130 protrudes beyond the top surface of the EL layer 112 as illustrated in FIG. 18A, the side surface of the EL layer 112 can be protected by the insulating layer 130 more surely, improving the reliability of the display device. Moreover, when the top surface of the insulating layer 131 protrudes beyond the top surface of the EL layer 112 like the top surface of the insulating layer 130, the planarity of the formation surface of the common electrode 113 can be improved, improving coverage with the common electrode 113.

Structure Example 14

Figure 18B:
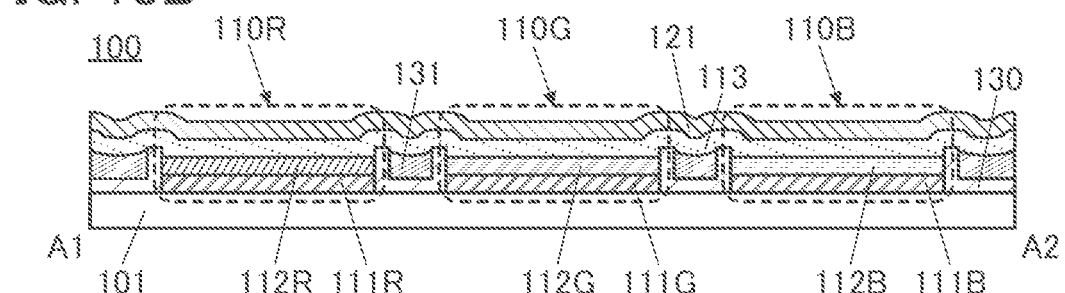

FIG. 18B illustrates another structure example of the display device 100 of this embodiment. The structure example illustrated in FIG. 18B is different from the structure example 13 described above in including a region in which the top surface of the insulating layer 131 is closer to the substrate 101 than the top surface of the insulating layer 130 is and is the same in the other points.

In FIG. 18B, a case where the top surface of the insulating layer 131 formed by etch back has a concave shape is illustrated as an example; however, the embodiment of the present invention is not limited thereto. A structure in which the top surface of the insulating layer 131 has a substantially flat shape and the top surface is positioned closer to the substrate 101 side than the top surface of the insulating layer 130 is may be employed.

Structure Example 15

Figure 18C:
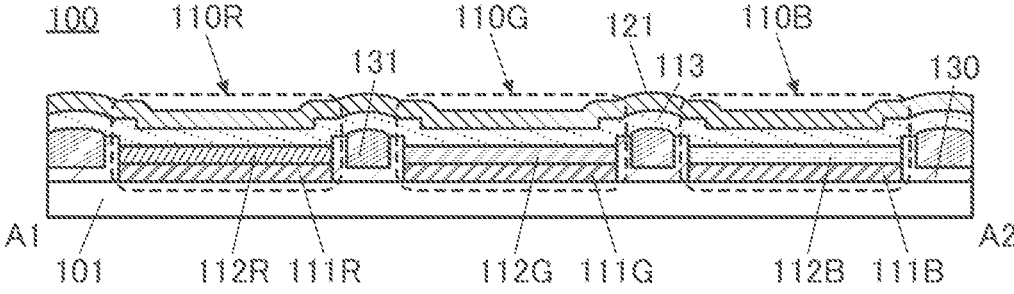

FIG. 18C illustrates another structure example of the display device 100 of this embodiment. The structure example illustrated in FIG. 18C is different from the structure example 13 described above in including a region in which the top surface of the insulating layer 131 protrudes beyond the top surface of the insulating layer 130 and is the same in the other points. In the region where the top surface of the insulating layer 131 protrudes beyond the top surface of the insulating layer 130, the side surface of the insulating layer 131 is in contact with the common electrode 113.

In FIG. 18C, a case where the insulating layer 131 has a convex shape is illustrated as an example; however, the embodiment of the present invention is not limited thereto. A structure in which the top surface of the insulating layer 131 has a substantially flat shape and the top surface protrudes beyond the top surface of the insulating layer 130 may be employed.

When the top surfaces of the insulating layer 130 and the insulating layer 131 protrude stepwise in a direction further away from the substrate 101 than the top surface of the EL layer 112, coverage of the top surface of the EL layer 112 with the common electrode 113 is improved in some cases.

Structure Example 16

FIG. 19A to FIG. 19D illustrate another structure example of this embodiment and a manufacturing method thereof. In FIG. 19, a case where a groove portion is formed by etching part of the substrate 101 at the time of forming the pixel electrode 111 is illustrated as an example.

Figure 19A:
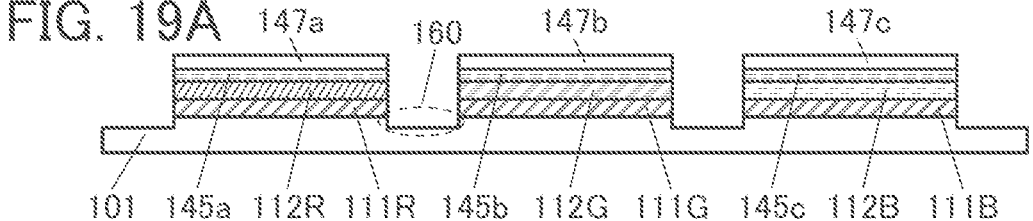
FIG. 19A to FIG. 19D are diagrams illustrating a structure example of the display device.

First, as illustrated in FIG. 19A, the pixel electrode 111R, the pixel electrode 111G, and the pixel electrode 111B are formed. Depending on etching conditions of the pixel electrode 111, part of the substrate 101 that is in the region not covered with the pixel electrode 111 might be etched to form a groove portion 160. In the case of using, as the substrate 101, a substrate on which a semiconductor circuit including a semiconductor element such as a transistor is formed, the groove portion 160 is formed in at least the uppermost insulating layer or conductive layer that is later in contact with the insulating layer 130.

Figure 19B:
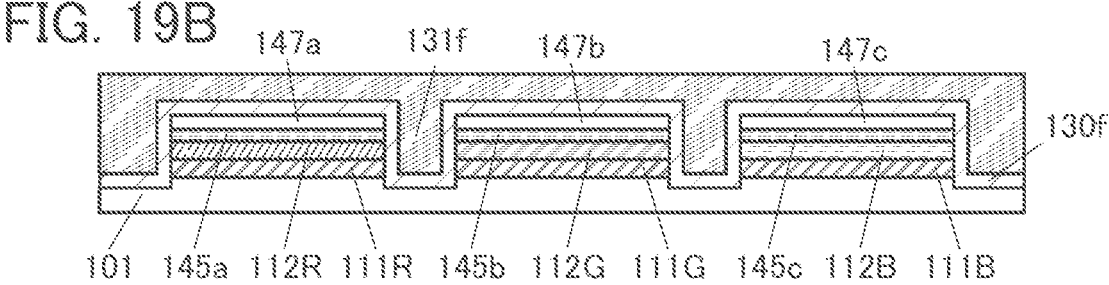

Then, the insulating film 130f covering the EL layer 112, the sacrificial layer 145, and the protective layer 147 and the insulating film 131f over the insulating film 130f are formed (FIG. 19B).

Figure 19C:
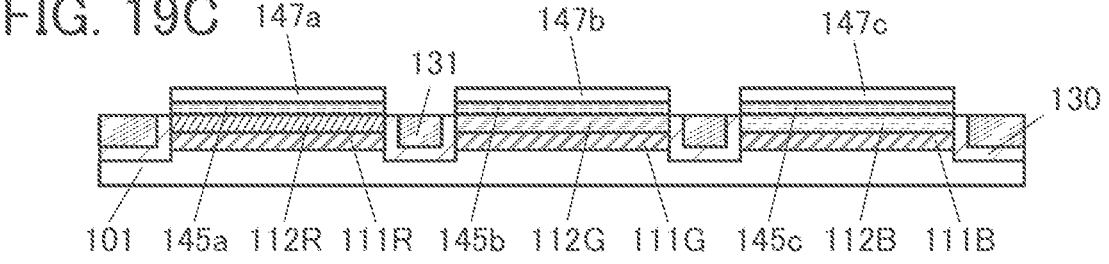
Figure 19D:
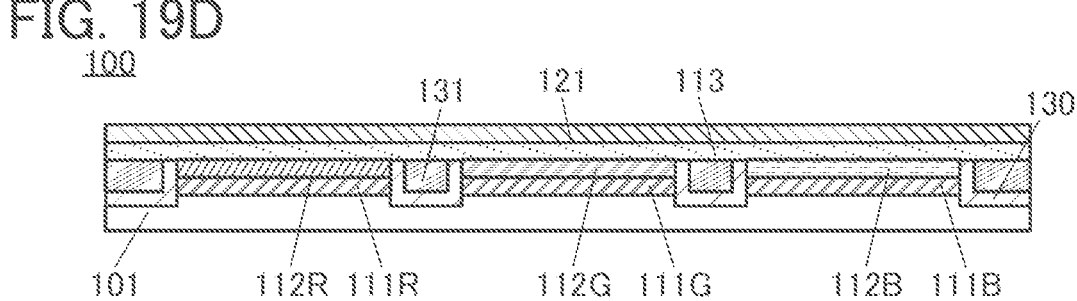

Next, the insulating film 130f and the insulating film 131f are etched back as illustrated in FIG. 19C. Then, the sacrificial layer 145 and the protective layer 147 are removed and the common electrode 113 and the protective layer 121 are formed, whereby the display device 100 illustrated in FIG. 19D is obtained.

With the structure example illustrated in FIG. 19A to FIG. 19D, the pixel electrode 111R, the pixel electrode 111G, and the pixel electrode 111B can be isolated from each other more reliably and the common electrode 113 can be formed with favorable coverage since unevenness due to the groove portion 160 is filled with the insulating layer 131. While in the structure examples 1 to 10 with the structure not including the groove portion 160, cycle time in a step of forming the pixel electrode 111 can be shortened and yield in manufacturing the display device can be improved.

At least part of this embodiment can be implemented in combination with the other embodiments described in this specification as appropriate.

Embodiment 2

In this embodiment, structure examples of display devices of one embodiment of the present invention will be described.

The display device in this embodiment can be a high-definition display device or a large-sized display device. Accordingly, the display device in this embodiment can be used for display portions of electronic devices such as a digital camera, a digital video camera, a digital photo frame, a mobile phone, a portable game machine, a smartphone, a watch-type terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Device 400A]

Figure 21:
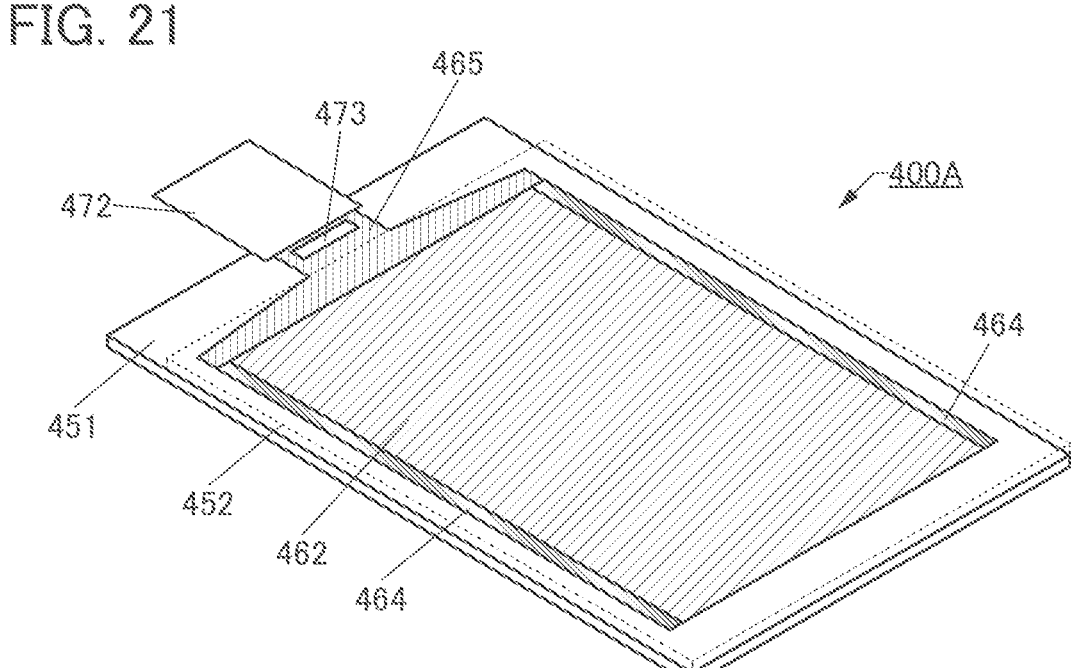
FIG. 21 is a perspective view illustrating an example of a display device.
Figure 22:
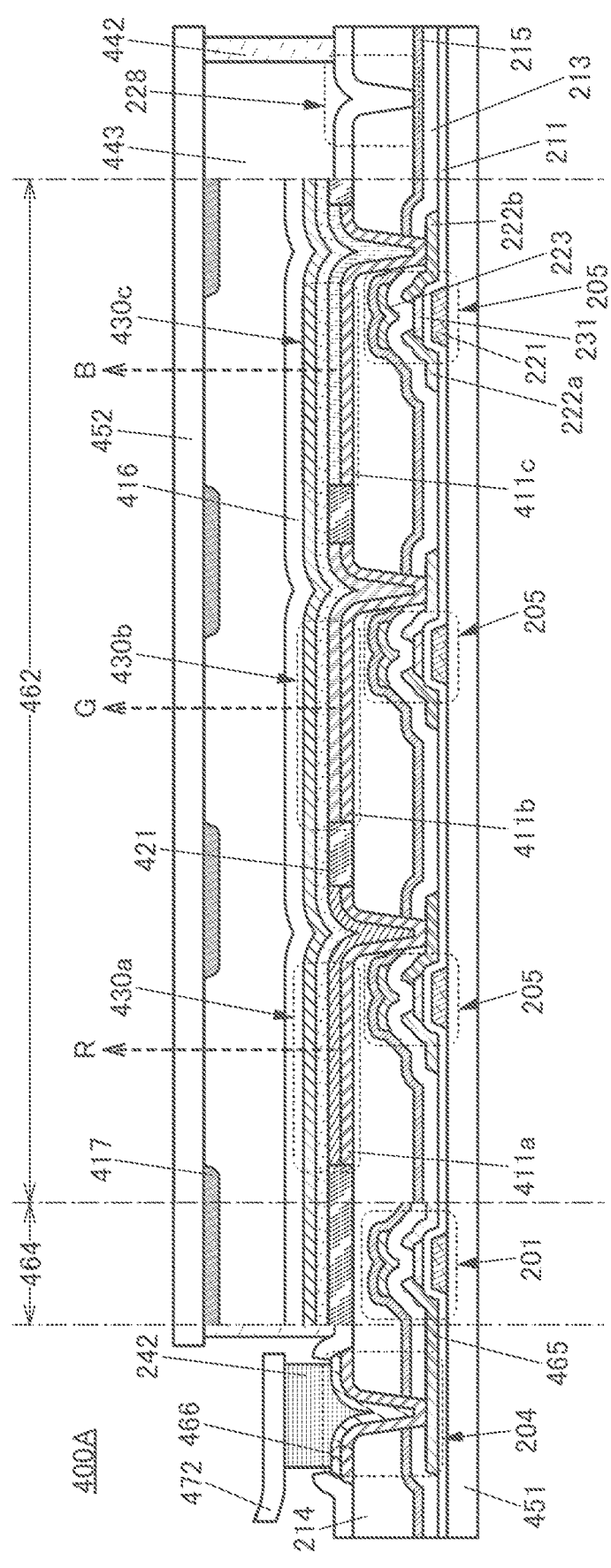
FIG. 22 is a cross-sectional view illustrating the example of the display device.

FIG. 21 is a perspective view of a display device 400A, and FIG. 22 is a cross-sectional view of the display device 400A.

The display device 400A has a structure in which a substrate 452 and a substrate 451 are bonded to each other. In FIG. 21, the substrate 452 is denoted by a dashed line.

The display device 400A includes a display portion 462, a circuit 464, a wiring 465, and the like. FIG. 21 illustrates an example in which an IC 473 and an FPC 472 are mounted on the display device 400A. Thus, the structure illustrated in FIG. 21 can be regarded as a display module including the display device 400A, the IC (integrated circuit), and the FPC.

As the circuit 464, a scan line driver circuit can be used, for example.

The wiring 465 has a function of supplying a signal and electric power to the display portion 462 and the circuit 464. The signal and electric power are input to the wiring 465 from the outside through the FPC 472 or from the IC 473.

FIG. 21 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display device 400A and the display module are not necessarily provided with an IC. The IC may be mounted on the FPC by a COF method or the like.

FIG. 22 illustrates an example of cross sections of part of a region including the FPC 472, part of the circuit 464, part of the display portion 462, and part of a region including an end portion of the display device 400A.

The display device 400A illustrated in FIG. 22 includes a transistor 201, a transistor 205, a light-emitting element 430a that emits red light, a light-emitting element 430b that emits green light, a light-emitting element 430c that emits blue light, and the like between the substrate 451 and the substrate 452.

The light-emitting element described in Embodiment 1 can be used as the light-emitting element 430a, the light-emitting element 430b, and the light-emitting element 430c.

In the case where a pixel of the display device includes three kinds of subpixels including light-emitting elements emitting different colors from each other, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

A protective layer 416 and the substrate 452 are bonded to each other with an adhesive layer 442. A solid sealing structure, a hollow sealing structure, or the like can be employed to seal the light-emitting elements. In FIG. 22, a hollow sealing structure is employed in which a space 443 surrounded by the substrate 452, the adhesive layer 442, and the substrate 451 is filled with an inert gas (e.g., nitrogen or argon). The adhesive layer 442 may be provided to overlap with the light-emitting element. The space 443 surrounded by the substrate 452, the adhesive layer 442, and the substrate 451 may be filled with a resin different from that of the adhesive layer 442.

A pixel electrode 411*a*, a pixel electrode 411*b*, and, a pixel electrode 411*c* are each connected to a conductive layer 222*b* included in the transistor 205 through an opening provided in an insulating layer 214. The pixel electrodes contain a material that reflects visible light, and a counter electrode contains a material that transmits visible light.

An insulating layer 421 is provided between the light-emitting element 430*a* and the light-emitting element 430*b* and between the light-emitting element 430*b* and the light-emitting element 430*c*. As the insulating layer 421, the insulating layer 131 described in the above embodiment can be used, for example.

Light from the light-emitting element is emitted toward the substrate 452 side. For the substrate 452, a material having a high visible-light-transmitting property is preferably used.

The transistor 201 and the transistor 205 are formed over the substrate 451. These transistors can be fabricated using the same material in the same step.

An insulating layer 211, an insulating layer 213, an insulating layer 215, and the insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of the end portion of the display device 400A. This can inhibit entry of impurities from the end portion of the display device 400A through the organic insulating film. Alternatively, the organic insulating film may be formed such that its end portion is positioned inward from the end portion of the display device 400A, to prevent the organic insulating film from being exposed at the end portion of the display device 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 22, an opening is formed in the insulating layer 214. This can inhibit entry of impurities into the display portion 462 from the outside through the insulating layer 214 even when an organic insulating film is used as the insulating layer 214. Consequently, the reliability of the display device 400A can be increased.

Figure 23:
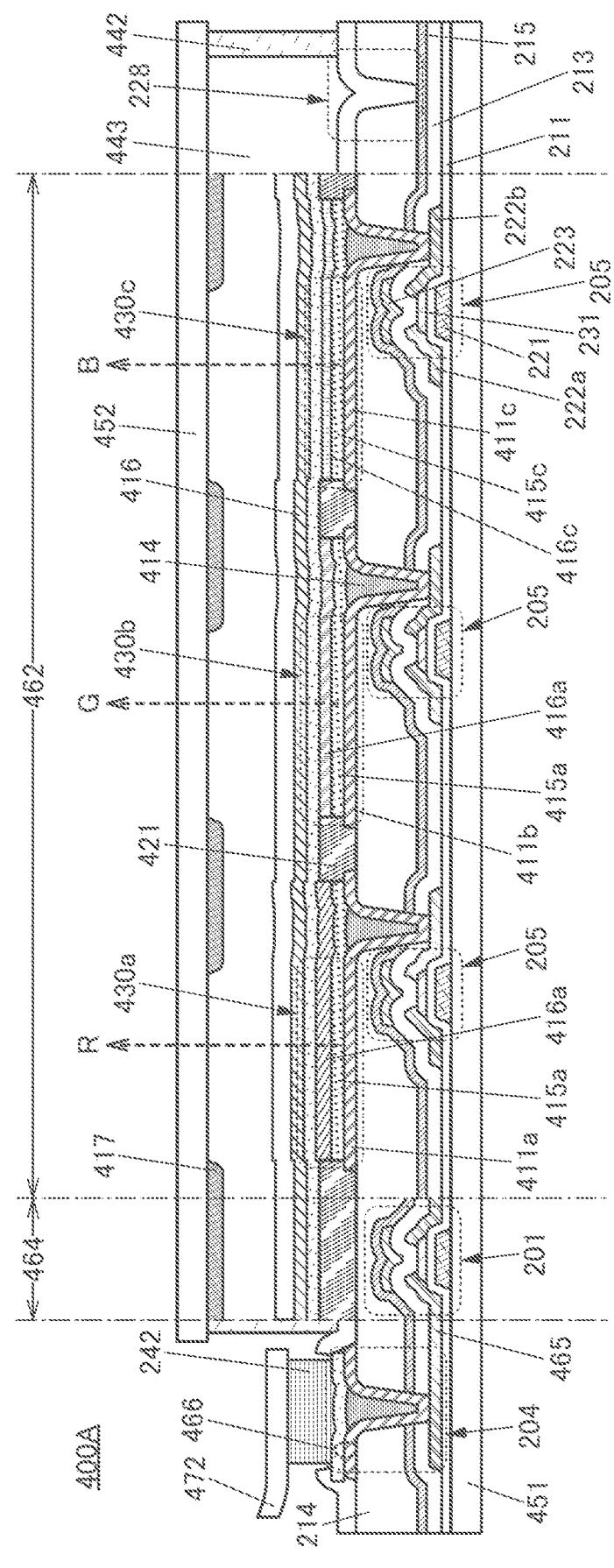
FIG. 23 is a cross-sectional view illustrating an example of the display device.

Note that as illustrated in FIG. 23, after the pixel electrodes 411*a*, 411*b*, and 411*c* are formed in the opening portions provided in the insulating layer 214, a layer 414 may be provided so as to fill the depression portions formed to cover the opening portions. With the layer 414, unevenness on formation surfaces of an optical adjustment layer 415*a*, an optical adjustment layer 415*b*, an optical adjustment layer 415*c*, an EL layer 416*a*, an EL layer 416*b*, and an EL layer 416*c* can be reduced to improve coverage.

The layer 414 is preferably an insulating layer. Alternatively, the layer 414 may be a conductive layer.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as agate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device in this embodiment. For example, a planar transistor, a staggered transistor, or an inverted staggered transistor can be used. A top-gate or bottom-gate transistor structure can be used. Alternatively, gates may be provided above and below a semiconductor layer where a channel is formed.

The structure in which the semiconductor layer where a channel is formed is provided between two gates is used for the transistor 201 and the transistor 205. The two gates may be connected to each other and supplied with the same signal to operate the transistor. Alternatively, the threshold voltage of the transistor may be controlled by supplying a potential for controlling the threshold voltage to one of the two gates and a potential for driving to the other.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, a single crystal semiconductor, or a semiconductor partly including crystal regions) may be used. It is preferable to use a semiconductor having crystallinity, in which case deterioration of the transistor characteristics can be inhibited.

It is preferable that a semiconductor layer of a transistor contain a metal oxide (also referred to as an oxide semiconductor). That is, a transistor using a metal oxide in its channel formation region (hereinafter, an OS transistor) is preferably used for the display device in this embodiment. Alternatively, a semiconductor layer of a transistor may contain silicon. Examples of silicon include amorphous silicon and crystalline silicon (e.g., low-temperature poly-silicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 that does not overlap with the substrate 452. In the connection portion 204, the wiring 465 is electrically connected to the FPC 472 through a conductive layer 466 and a connection layer 242. An example is illustrated in which the conductive layer 466 has a stacked-layer structure of a conductive film obtained by processing the same conductive film as the pixel electrode and a conductive film obtained by processing the same conductive film as the optical adjustment layer. On the top surface of the connection portion 204, the conductive layer 466 is exposed. Thus, the connection portion 204 and the FPC 472 can be electrically connected to each other through the connection layer 242.

A light-blocking layer 417 is preferably provided on the surface of the substrate 452 on the substrate 451 side. A variety of optical members can be arranged on the outer side of the substrate 452. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided on the outer side of the substrate 452.

Providing the protective layer 416 covering the light-emitting elements inhibits entry of impurities such as water into the light-emitting elements; as a result, the reliability of the light-emitting elements can be increased.

In the region 228 in the vicinity of the end portion of the display device 400A, the insulating layer 215 and the protective layer 416 are preferably in contact with each other through an opening in the insulating layer 214. In particular, the inorganic insulating film included in the insulating layer 215 and the inorganic insulating film included in the protective layer 416 are preferably in contact with each other. This can inhibit entry of impurities into the display portion 462 from the outside through the organic insulating film. Consequently, the reliability of the display device 400A can be increased.

For each of the substrate 451 and the substrate 452, glass, quartz, ceramics, sapphire, a resin, a metal, an alloy, a semiconductor, or the like can be used. The substrate on the side from which light from the light-emitting element is extracted is formed using a material that transmits the light. When the substrate 451 and the substrate 452 are formed using a flexible material, the flexibility of the display device can be increased. Furthermore, a polarizing plate may be used as the substrate 451 or the substrate 452.

For each of the substrate 451 and the substrate 452, it is possible to use a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like. Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, an indium tin oxide, an indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of an indium tin oxide and an alloy of silver and magnesium is preferably used because conductivity can be increased. They can also be used for conductive layers such as a variety of wirings and electrodes included in the display device, and conductive layers (e.g., conductive layers functioning as the pixel electrode and the common electrode) included in the light-emitting element.

Examples of insulating materials that can be used for the insulating layers include resins such as an acrylic resin and an epoxy resin, and inorganic insulating materials such as silicon oxide, silicon oxynitride, silicon nitride oxide, silicon nitride, and aluminum oxide.

[Display Device 400A-2]

Figure 24:
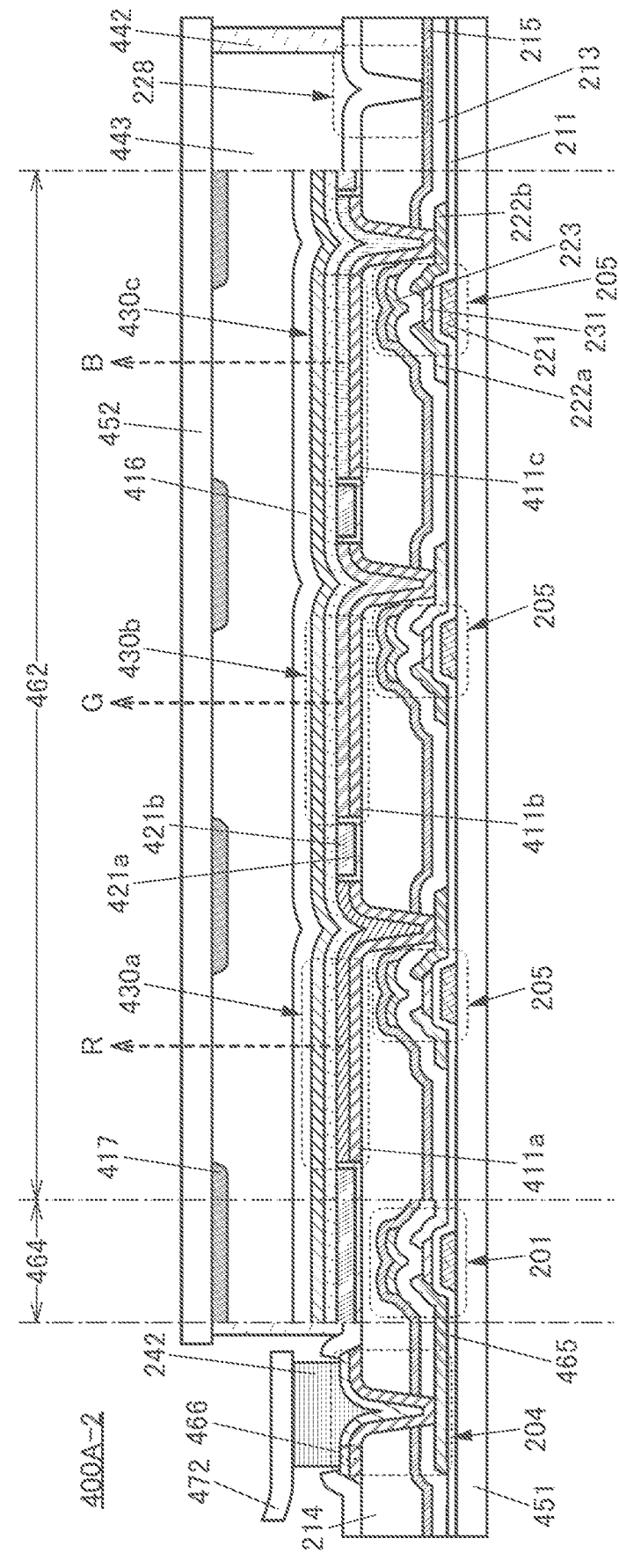
FIG. 24 is a cross-sectional view illustrating an example of the display device.

FIG. 24 illustrates an example of cross sections of part of a region including the FPC 472, part of the circuit 464, part of the display portion 462, and part of a region including an end portion of a display device 400A-2. A perspective view of the display device 400A-2 is similar to that of the display device 400A (FIG. 21). Note that portions similar to those of the display device 400A are not described in some cases.

The display device 400A-2 illustrated in FIG. 24 is different from the display device in FIG. 22 in including, instead of the insulating layer 421, an insulating layer 421a and an insulating layer 421b as the insulating layers provided between the light-emitting element 430a and the light-emitting element 430b and between the light-emitting element 430b and the light-emitting element 430c.

The display device 400A-2 illustrated in FIG. 24 includes the transistor 201, the transistor 205, the light-emitting element 430a that emits red light, the light-emitting element 430b that emits green light, the light-emitting element 430c that emits blue light, and the like between the substrate 451 and the substrate 452.

The light-emitting element described in Embodiment 1 as an example can be used as the light-emitting element 430a, the light-emitting element 430b, and the light-emitting element 430c.

The protective layer 416 and the substrate 452 are bonded to each other with the adhesive layer 442.

The pixel electrodes 411a, 411b, and 411c are each connected to the conductive layer 222b included in the transistor 205 through an opening provided in the insulating layer 214. The pixel electrodes contains a material that reflects visible light, and the counter electrode contains a material that transmits visible light.

The insulating layer 421a and the insulating layer 421b are provided between the light-emitting element 430a and the light-emitting element 430b and between the light-emitting element 430b and the light-emitting element 430c. As the insulating layer 421a and the insulating layer 421b, the insulating layer 130 and the insulating layer 131 provided to fill the depression portion of the insulating layer 130, which are illustrated in FIG. 11A, FIG. 12A, or the like in the above embodiment, can be respectively used, for example.

Light emitted from the light-emitting element is emitted toward the substrate 452 side.

The transistor 201 and the transistors 205 are each formed over the substrate 451.

The insulating layer 211, the insulating layer 213, the insulating layer 215, and the insulating layer 214 are provided in this order over the substrate 451.

In the region 228 illustrated in FIG. 24, an opening is formed in the insulating layer 214.

Figure 25:
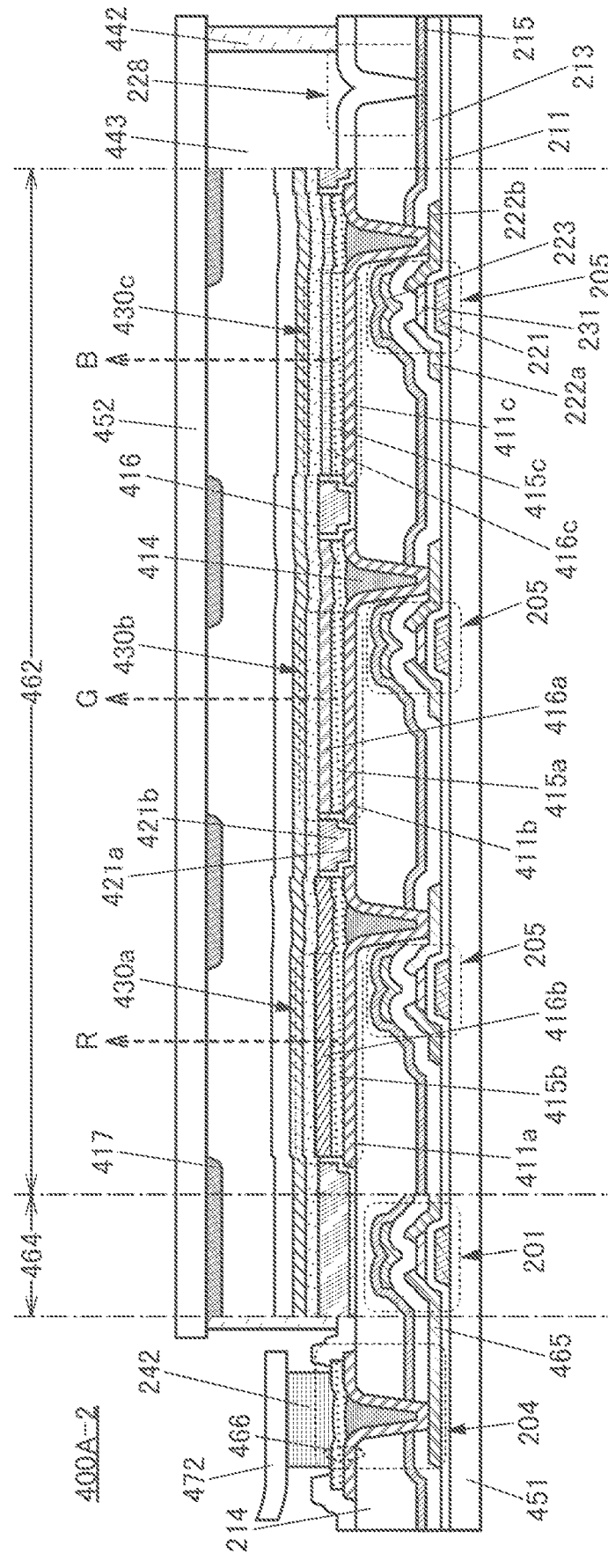
FIG. 25 is a cross-sectional view illustrating an example of the display device.

Note that as illustrated in FIG. 25, after the pixel electrodes 411a, 411b, and 411c are formed in the opening portions provided in the insulating layer 214, the layer 414 may be provided so as to fill the depression portions formed to cover the opening portions. With the layer 414, unevenness on the formation surfaces of the optical adjustment layers 415a, 415b, and 415c and the EL layers 416a, 416b, and 416c can be reduced to improve coverage. Note that in FIG. 25, portions similar to those of the display device 400A are not described in some cases.

[Display Device 400B]

Figures 26A, 26B:
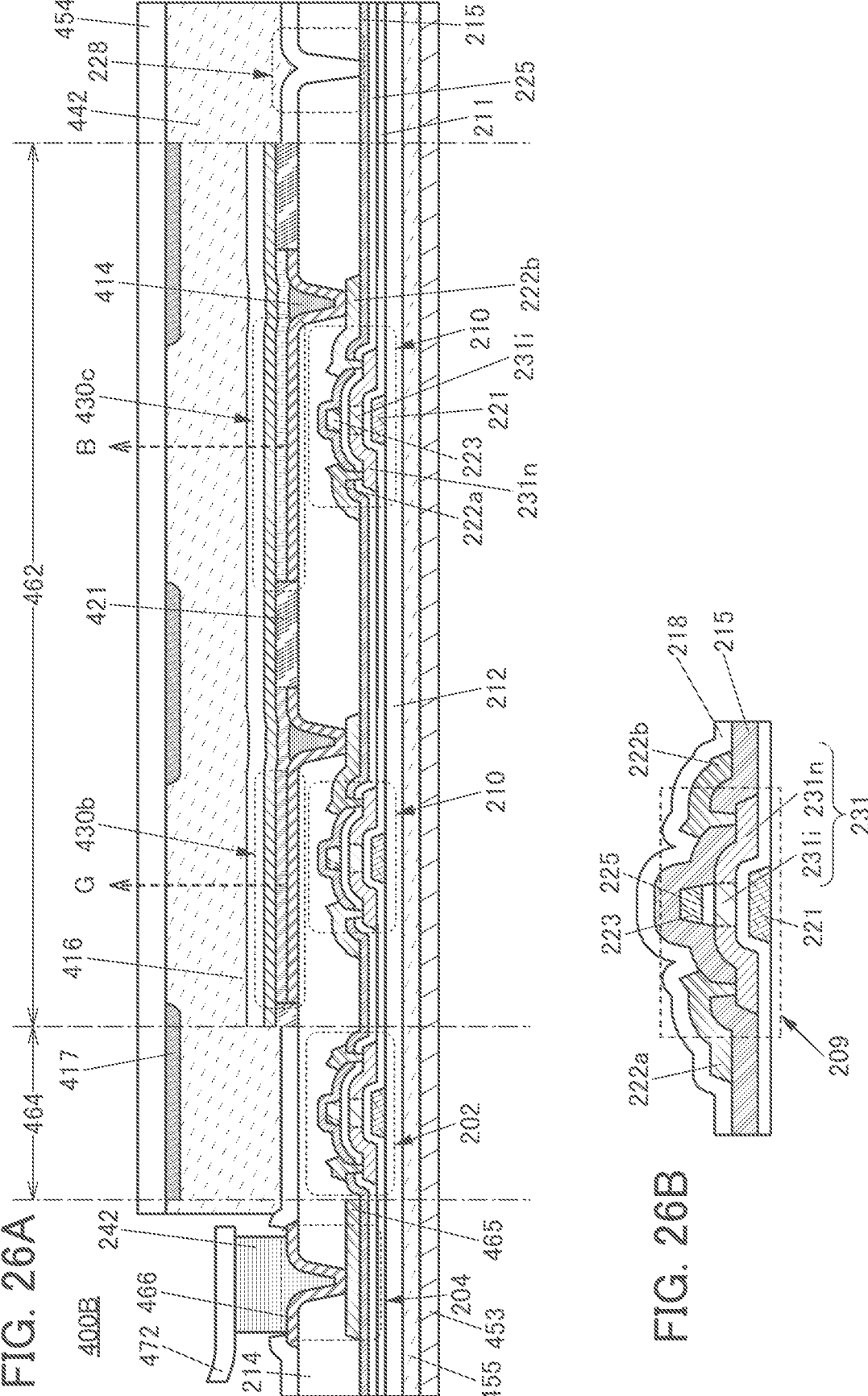
FIG. 26A is a cross-sectional view illustrating an example of the display device.
FIG. 26B is a cross-sectional view illustrating an example of a transistor.

FIG. 26A is a cross-sectional view of a display device 400B. A perspective view of the display device 400B is similar to that of the display device 400A (FIG. 21). FIG. 26A illustrates an example of cross sections of part of a region including the FPC 472, part of the circuit 464, and part of the display portion 462 in the display device 400B. FIG. 26A specifically illustrates an example of a cross section of a region including the light-emitting element 430b emitting green light and the light-emitting element 430c emitting blue light in the display portion 462. Note that portions similar to those in the display device 400A are not described in some cases.

The display device 400B illustrated in FIG. 26A includes a transistor 202, transistors 210, the light-emitting element 430b, the light-emitting element 430c, and the like between a substrate 453 and a substrate 454.

The substrate 454 and the protective layer 416 are bonded to each other with the adhesive layer 442. The adhesive layer 442 is provided to overlap with the light-emitting element 430b and the light-emitting element 430c, and the display device 400B employs a solid sealing structure.

The substrate 453 and an insulating layer 212 are bonded to each other with an adhesive layer 455.

As a method for manufacturing the display device 400B, first, a manufacture substrate provided with the insulating layer 212, the transistors, the light-emitting elements, and the like and the substrate 454 provided with the light-blocking layer 417 are bonded to each other with the adhesive layer 442. Then, the substrate 453 is attached to a surface exposed by separation of the manufacture substrate, whereby the components formed over the manufacture substrate are transferred to the substrate 453. The substrate 453 and the substrate 454 are preferably flexible. Accordingly, the display device 400B can be highly flexible.

The inorganic insulating film that can be used as the insulating layer 211, the insulating layer 213, and the insulating layer 215 can be used as the insulating layer 212.

The pixel electrode is connected to the conductive layer 222b included in the transistor 210 through the opening provided in the insulating layer 214. The conductive layer 222b is connected to a low-resistance region 231n through an opening provided in the insulating layer 215 and an insulating layer 225. The transistor 210 has a function of controlling the driving of the light-emitting element.

The insulating layer 421 is provided between the light-emitting element 430b and the light-emitting element 430c.

Light from the light-emitting elements 430b and 430c is emitted toward the substrate 454 side. For the substrate 454, a material having a high visible-light-transmitting property is preferably used.

The connection portion 204 is provided in a region of the substrate 453 that does not overlap with the substrate 454. In the connection portion 204, the wiring 465 is electrically connected to the FPC 472 through the conductive layer 466 and the connection layer 242. The conductive layer 466 can be obtained by processing the same conductive film as the pixel electrode. Thus, the connection portion 204 and the FPC 472 can be electrically connected to each other through the connection layer 242.

The transistor 202 and the transistor 210 each include the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 215. One of the conductive layer 222a and the conductive layer 222b functions as a source, and the other functions as a drain.

FIG. 26A illustrates an example in which the insulating layer 225 covers the top surface and the side surface of the semiconductor layer. The conductive layer 222a and the conductive layer 222b are connected to the corresponding low-resistance regions 231n through openings provided in the insulating layer 225 and the insulating layer 215.

In a transistor 209 illustrated in FIG. 26B, the insulating layer 225 overlaps with the channel formation region 231i of the semiconductor layer 231 and does not overlap with the low-resistance regions 231n. The structure illustrated in FIG. 26B is obtained by processing the insulating layer 225 with the conductive layer 223 as a mask, for example. In FIG. 26B, the insulating layer 215 is provided to cover the insulating layer 225 and the conductive layer 223, and the conductive layer 222a and the conductive layer 222b are connected to the corresponding low-resistance regions 231n through the openings in the insulating layer 215. Furthermore, an insulating layer 218 covering the transistor may be provided.

Instead of the transistor 210 and the transistor 202, the transistor 209 illustrated in FIG. 26B may be used.
[Display Device 400B-2]

Figure 27:
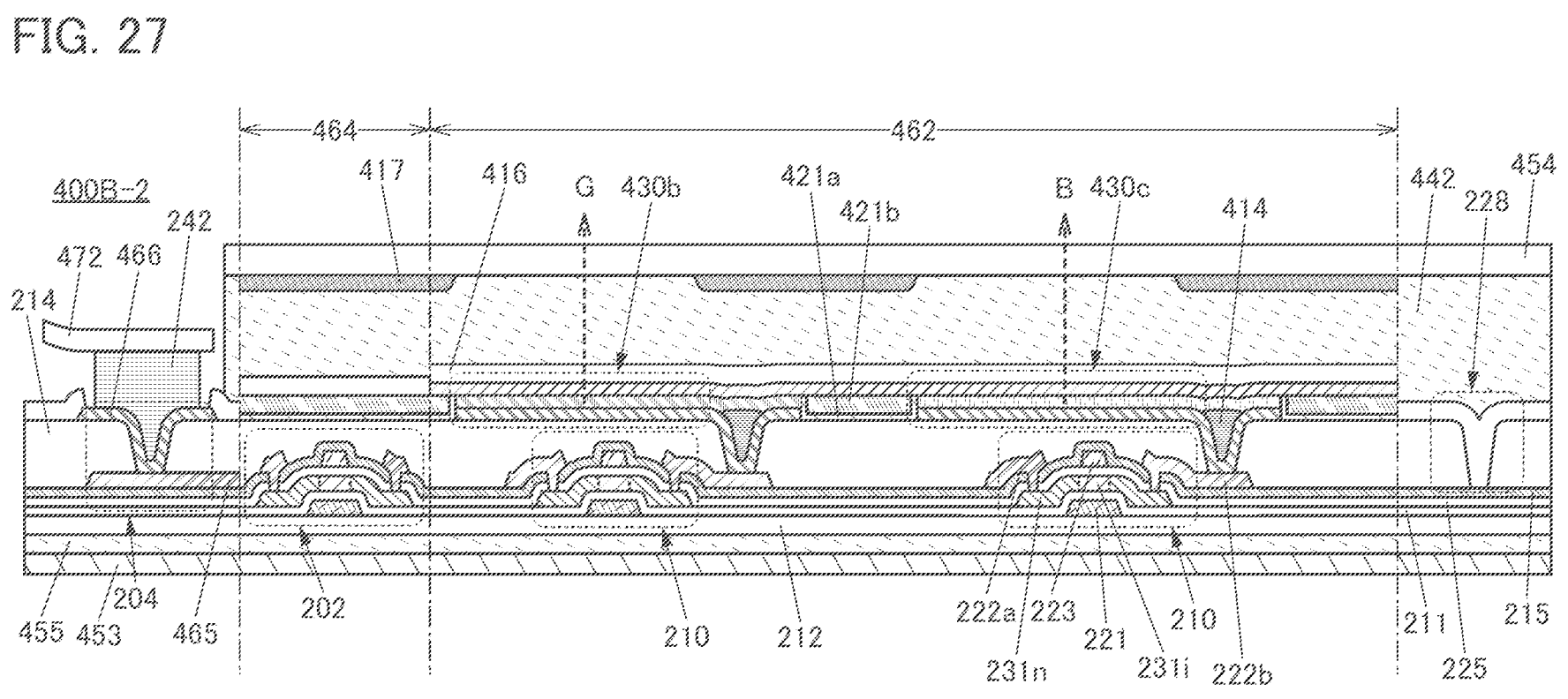

FIG. 27 is a cross-sectional view of a display device 400B-2. A perspective view of the display device 400B-2 is similar to that of the display device 400A (FIG. 21). FIG. 27 illustrates an example of cross sections of part of a region including the FPC 472, part of the circuit 464, and part of the display portion 462 in the display device 400B-2. FIG. 27 specifically illustrates an example of a cross section of a region including the light-emitting element 430b emitting green light and the light-emitting element 430c emitting blue light in the display portion 462.

The display device 400B-2 illustrated in FIG. 27 is different from the display device in FIG. 22 in including, instead of the insulating layer 421, the insulating layer 421a and the insulating layer 421b as the insulating layers provided between the light-emitting element 430b and the light-emitting element 430c. Note that portions similar to those of the display device 400B are not described in some cases.

The display device 400B-2 illustrated in FIG. 27 includes the transistor 202, the transistors 210, the light-emitting element 430b, the light-emitting element 430c, and the like between the substrate 453 and the substrate 454.

The substrate 454 and the protective layer 416 are bonded to each other with the adhesive layer 442. The adhesive layer 442 is provided to overlap with the light-emitting element 430b and the light-emitting element 430c, and the display device 400B employs a solid sealing structure.

The substrate 453 and the insulating layer 212 are bonded to each other with the adhesive layer 455.

As a method for manufacturing the display device 400B-2, first, a manufacture substrate provided with the insulating layer 212, the transistors, the light-emitting elements, and the like and the substrate 454 provided with the light-blocking layer 417 are bonded to each other with the adhesive layer 442. Then, the substrate 453 is attached to a surface exposed by separation of the manufacture substrate, whereby the components formed over the manufacture substrate are transferred to the substrate 453. The substrate 453 and the substrate 454 are preferably flexible. This can increase the flexibility of the display device 400B.

The pixel electrode is connected to the conductive layer 222b included in the transistor 210 through the opening provided in the insulating layer 214. The conductive layer 222b is connected to the low-resistance region 231n through an opening provided in the insulating layer 215 and the insulating layer 225. The transistor 210 has a function of controlling the driving of the light-emitting element.

The insulating layer 421a and the insulating layer 421b are provided between the light-emitting element 430b and the light-emitting element 430c.

Light emitted by the light-emitting elements 430b and 430c is emitted toward the substrate 454 side. For the substrate 454, a material having a high visible-light-transmitting property is preferably used.

The connection portion 204 is provided in a region of the substrate 453 that does not overlap with the substrate 454. In the connection portion 204, the wiring 465 is electrically connected to the FPC 472 through the conductive layer 466 and the connection layer 242.

At least part of the structure examples, the drawings corresponding thereto, and the like described in this embodiment as an example can be combined with the other structure examples, the other drawings, and the like as appropriate.

Embodiment 3

In this embodiment, a structure example of a display device different from those described above will be described.

The display device in this embodiment can be a high-resolution display device. Accordingly, the display device in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

Figure 28A:
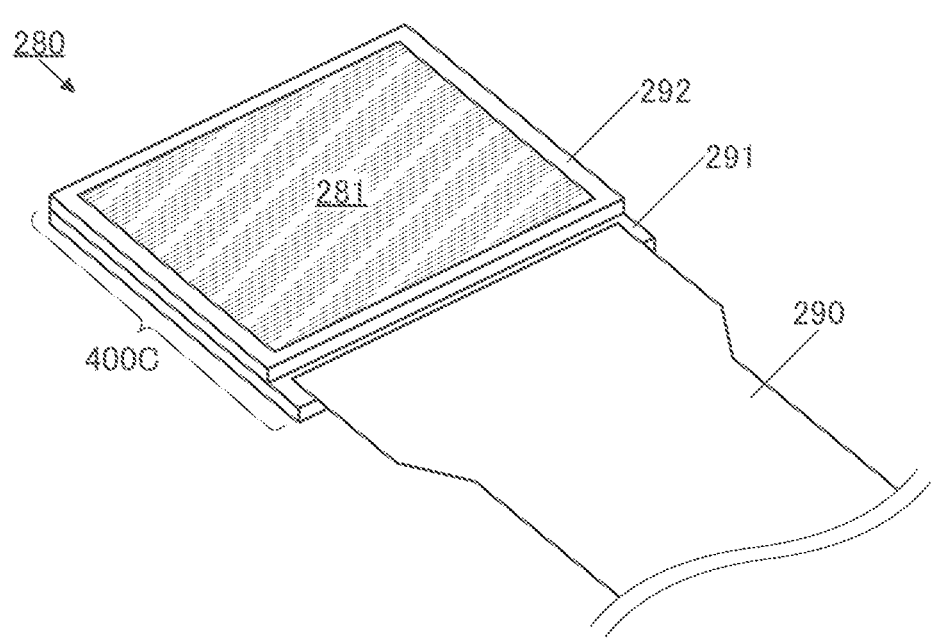
FIG. 28A and FIG. 28B are perspective views illustrating an example of a display module.

FIG. 28A is a perspective view of a display module 280. The display module 280 includes a display device 400C and an FPC 290. Note that the display device included in the display module 280 is not limited to the display device 400C and may be a display device 400D or a display device 400E described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 28B:
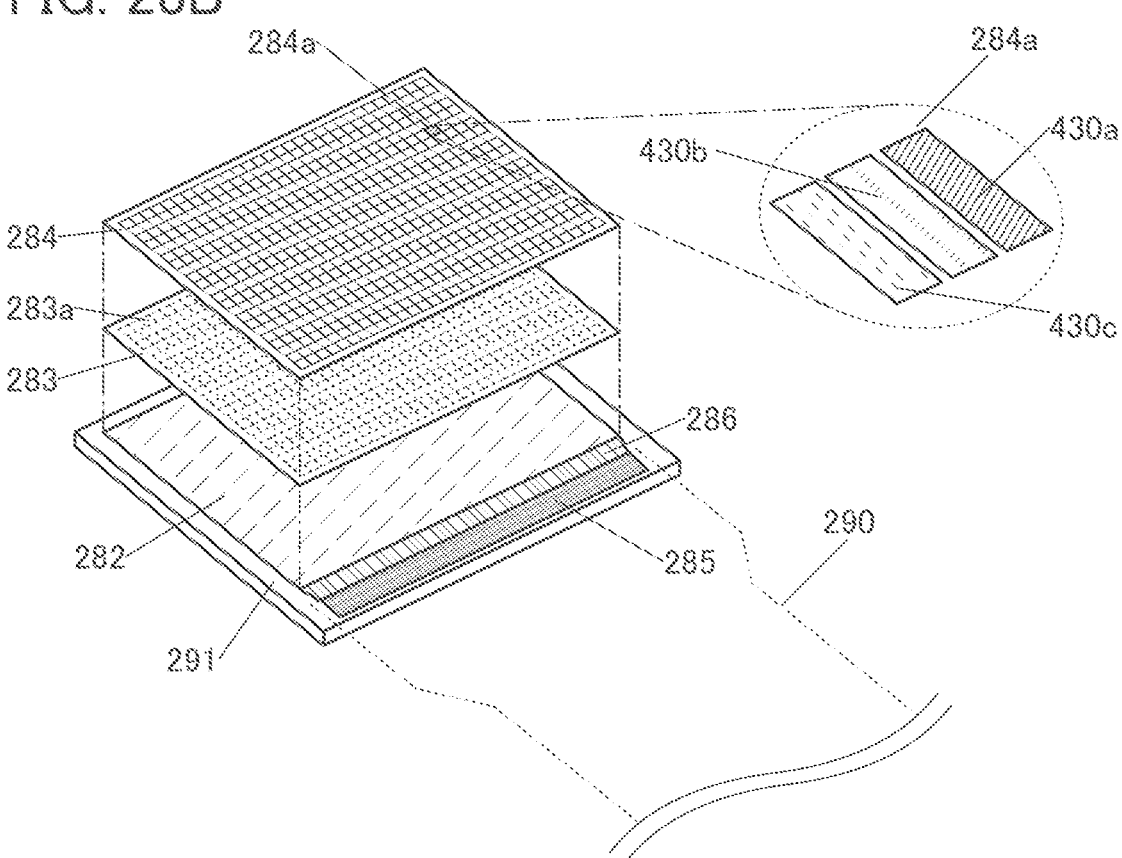

FIG. 28B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion that is over the substrate 291 and does not overlap with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side of FIG. 28B. The pixel 284a includes the light-emitting elements 430a, 430b, and 430c that emit light of different colors from each other. The plurality of light-emitting elements are preferably arranged in a stripe pattern as illustrated in FIG. 28B. With the stripe pattern that enables high-density arrangement of the light-emitting elements of one embodiment of the present invention or pixel circuits, a high-resolution display device can be provided. Alternatively, a variety of arrangement methods, such as delta arrangement and pentile arrangement, can be employed.

The pixel circuit portion 283 includes a plurality of pixel circuits 283a arranged periodically.

One pixel circuit 283a is a circuit that controls light emission of three light-emitting elements included in one pixel 284a. One pixel circuit 283a may be provided with three circuits each of which controls light emission of one light-emitting element. For example, the pixel circuit 283a can include at least one selection transistor, one current control transistor (driving transistor), and a capacitor for one light-emitting element. In this case, a gate signal is input to a gate of the selection transistor, and a source signal is input to one of a source and a drain of the selection transistor. Thus, an active-matrix display device is achieved.

The circuit portion 282 includes a circuit for driving the pixel circuits 283a in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have extremely high resolution. For example, the pixels 284a are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head-mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be suitably used in a display portion of a wearable electronic device such as a wrist watch.

[Display Device 400C]

Figure 29:
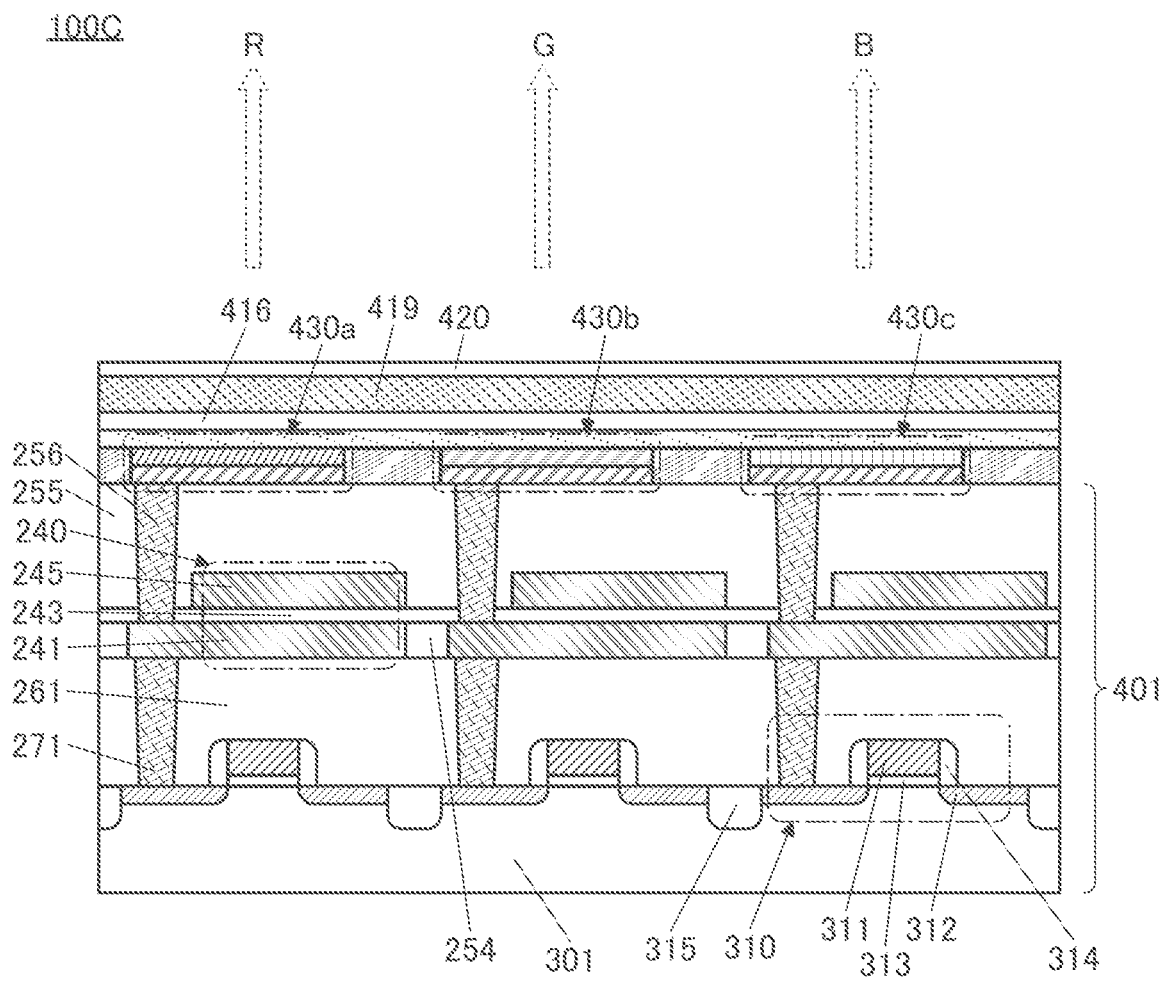
FIG. 29 is a cross-sectional view illustrating an example of a display device.

The display device 400C illustrated in FIG. 29 includes a substrate 301, the light-emitting elements 430a, 430b, and 430c, a capacitor 240, and a transistor 310.

The substrate 301 corresponds to the substrate 291 illustrated in FIG. 28A and FIG. 28B. A stacked-layer structure including the substrate 301 and the components thereover up to an insulating layer 255 corresponds to the substrate in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover the side surface of the conductive layer 311 and functions as an insulating layer.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255 is provided to cover the capacitor 240, and the light-emitting elements 430a, 430b, and 430c and the like are provided over the insulating layer 255. The protective layer 416 is provided over the light-emitting elements 430a, 430b, and 430c, and a substrate 420 is bonded to the top surface of the protective layer 416 with a resin layer 419. The substrate 420 corresponds to the substrate 292 illustrated in FIG. 28A.

The pixel electrode of the light-emitting element is electrically connected to one of the source and the drain of the transistor 310 through a plug 256 embedded in the insulating layer 255, the conductive layer 241 embedded in the insulating layer 254, and the plug 271 embedded in the insulating layer 261.

The structure described in Embodiment 1 can be used for the light-emitting element 430a, the light-emitting element 430b, the light-emitting element 430c, and the insulating layers between the light-emitting elements. Although an example of using the structure illustrated in FIG. 1B is described here, the structure that can be used is not limited thereto.

[Display Device 400C-2]

Figure 30:
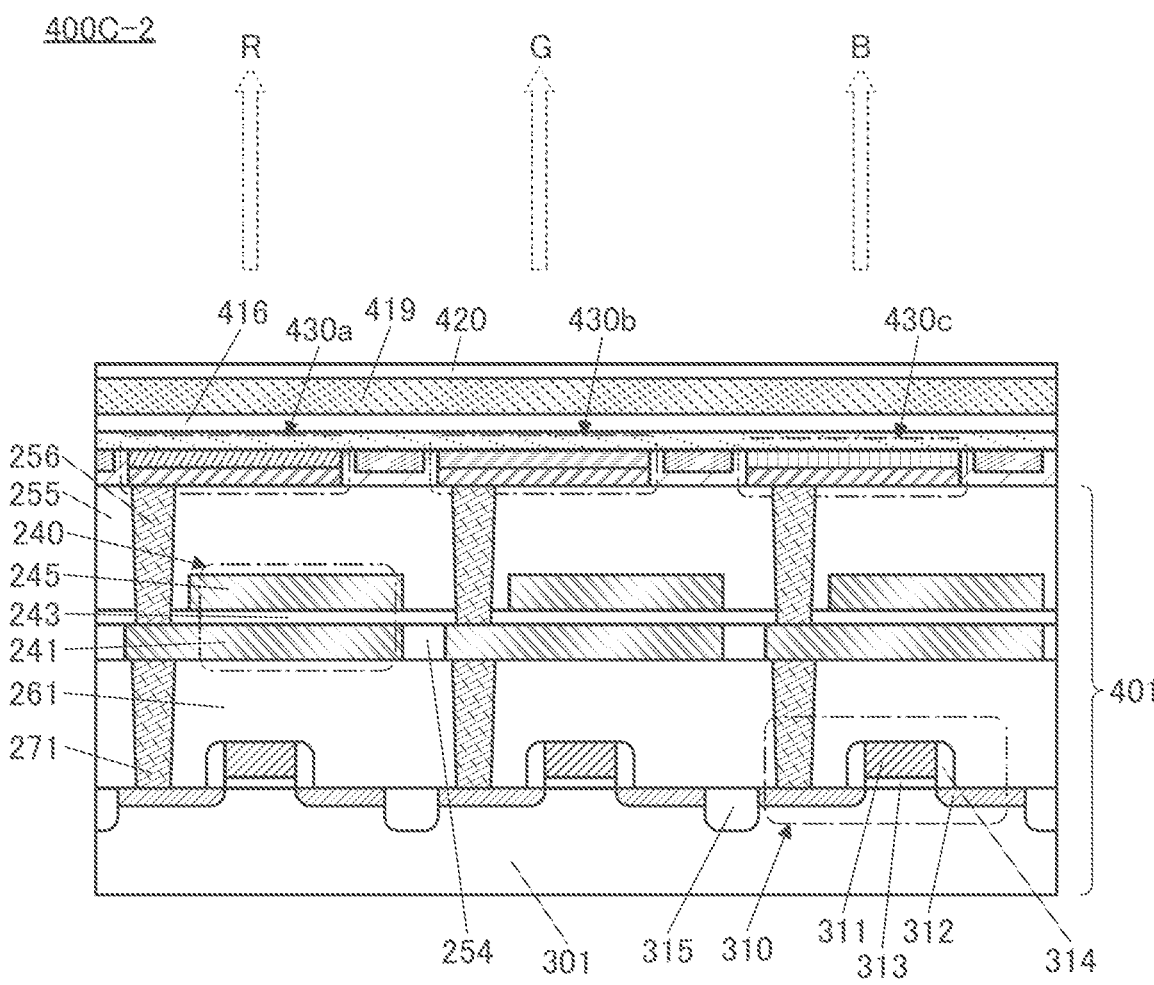
FIG. 30 is a cross-sectional view illustrating an example of the display device.

A display device 400C-2 illustrated in FIG. 30 is different from the display device 400C illustrated in FIG. 29 in, for example, using the structure including the insulating layer 130, which is described in Embodiment 1, as the insulating layers between the light-emitting elements. In the example illustrated in FIG. 30, the structure illustrated in FIG. 10A is used for the light-emitting element 430a, the light-emitting element 430b, the light-emitting element 430c, and the insulating layers between the light-emitting elements.

The display device 400C-2 illustrated in FIG. 30 includes the substrate 301, the light-emitting elements 430a, 430b, and 430c, the capacitor 240, and the transistor 310.

The element isolation layer 315 is provided between the two adjacent transistors 310 to be embedded in the substrate 301.

The insulating layer 261 is provided to cover the transistor 310, and the capacitor 240 is provided over the insulating layer 261.

The capacitor 240 includes the conductive layer 241, the conductive layer 245, and the insulating layer 243 positioned therebetween. The conductive layer 241 functions as one electrode of the capacitor 240, the conductive layer 245 functions as the other electrode of the capacitor 240, and the insulating layer 243 functions as the dielectric of the capacitor 240.

The conductive layer 241 is provided over the insulating layer 261 and is embedded in the insulating layer 254. The conductive layer 241 is electrically connected to one of the source and the drain of the transistor 310 through the plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255 is provided to cover the capacitor 240, and the light-emitting elements 430a, 430b, and 430c and the like are provided over the insulating layer 255. The protective layer 416 is provided over the light-emitting elements 430a, 430b, and 430c, and the substrate 420 is bonded to the top surface of the protective layer 416 with the resin layer 419. The substrate 420 corresponds to the substrate 292 illustrated in FIG. 28A.

The pixel electrode of the light-emitting element is electrically connected to one of the source and the drain of the transistor 310 through the plug 256 embedded in the insulating layer 255, the conductive layer 241 embedded in the insulating layer 254, and the plug 271 embedded in the insulating layer 261.

[Display Device 400D]

Figure 31:
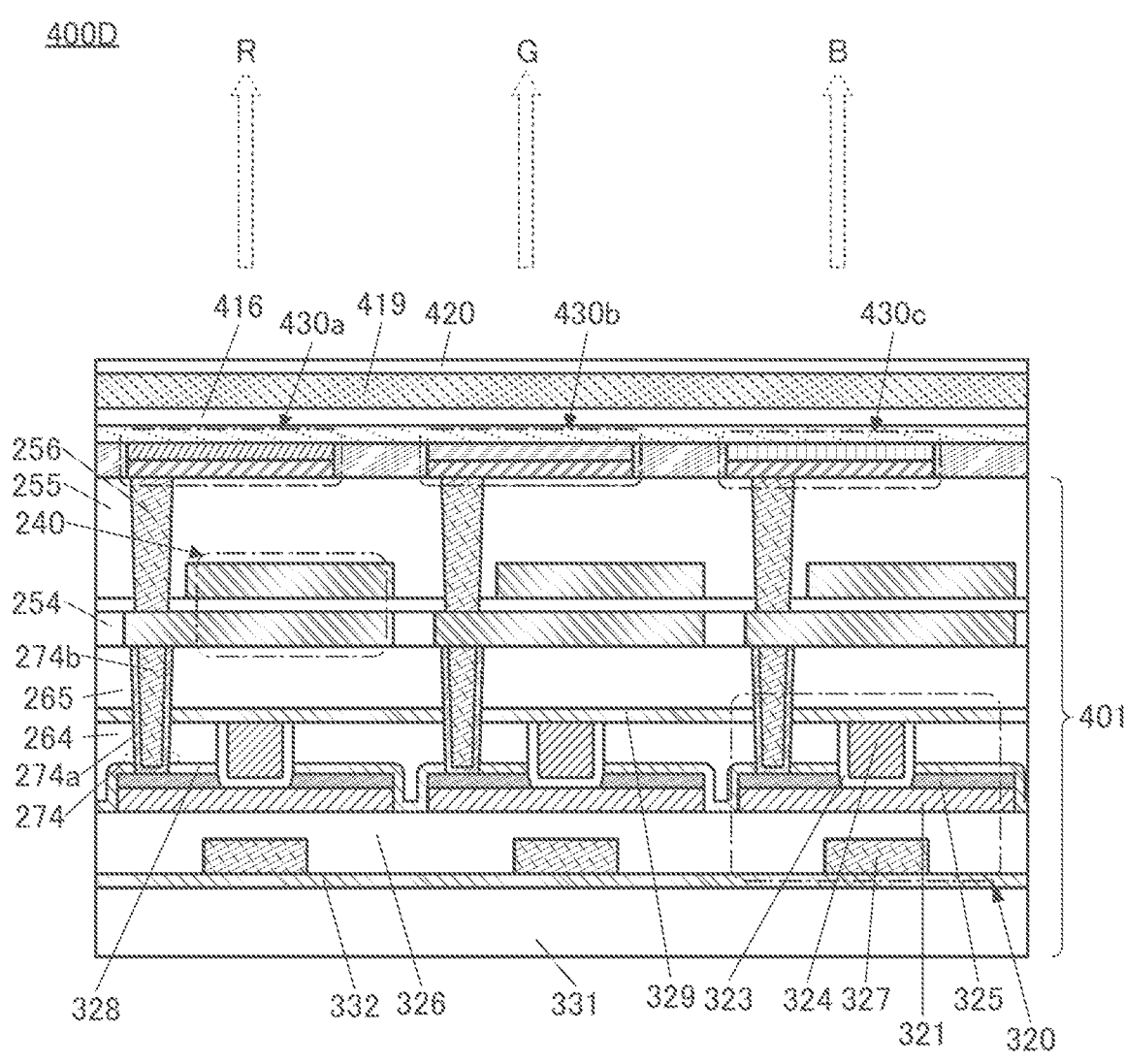
FIG. 31 is a cross-sectional view illustrating an example of the display device.

The display device 400D illustrated in FIG. 31 is different from the display device 400C mainly in the structure of the transistors. Note that portions similar to those in the display device 400C are not described in some cases.

A transistor 320 is a transistor that contains a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 28A and FIG. 28B. The stacked-layer structure including the substrate 331 and the components thereover up to the insulating layer 255 corresponds to a layer 401 including a transistor in Embodiment 2. As the substrate 331, an insulating substrate or a semiconductor substrate can be used.

An insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film through which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. A material that can be suitably used for the semiconductor layer 321 will be described in detail later.

The pair of conductive layers 325 are provided over and in contact with the semiconductor layer 321 and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that their heights are substantially equal to each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274a that covers the side surface of an opening in the insulating layer 265, the insulating layer 329, the insulating layer 264, and the insulating layer 328 and part of the top surface of the conductive layer 325, and a conductive layer 274b in contact with the top surface of the conductive layer 274a. In this case, a conductive material through which hydrogen and oxygen are less likely to diffuse is preferably used for the conductive layer 274a.

The structures of the insulating layer 254 and the components thereover up to the substrate 420 in the display device 400D are similar to those in the display device 400C.

[Display Device 400D-2]

Figure 32:
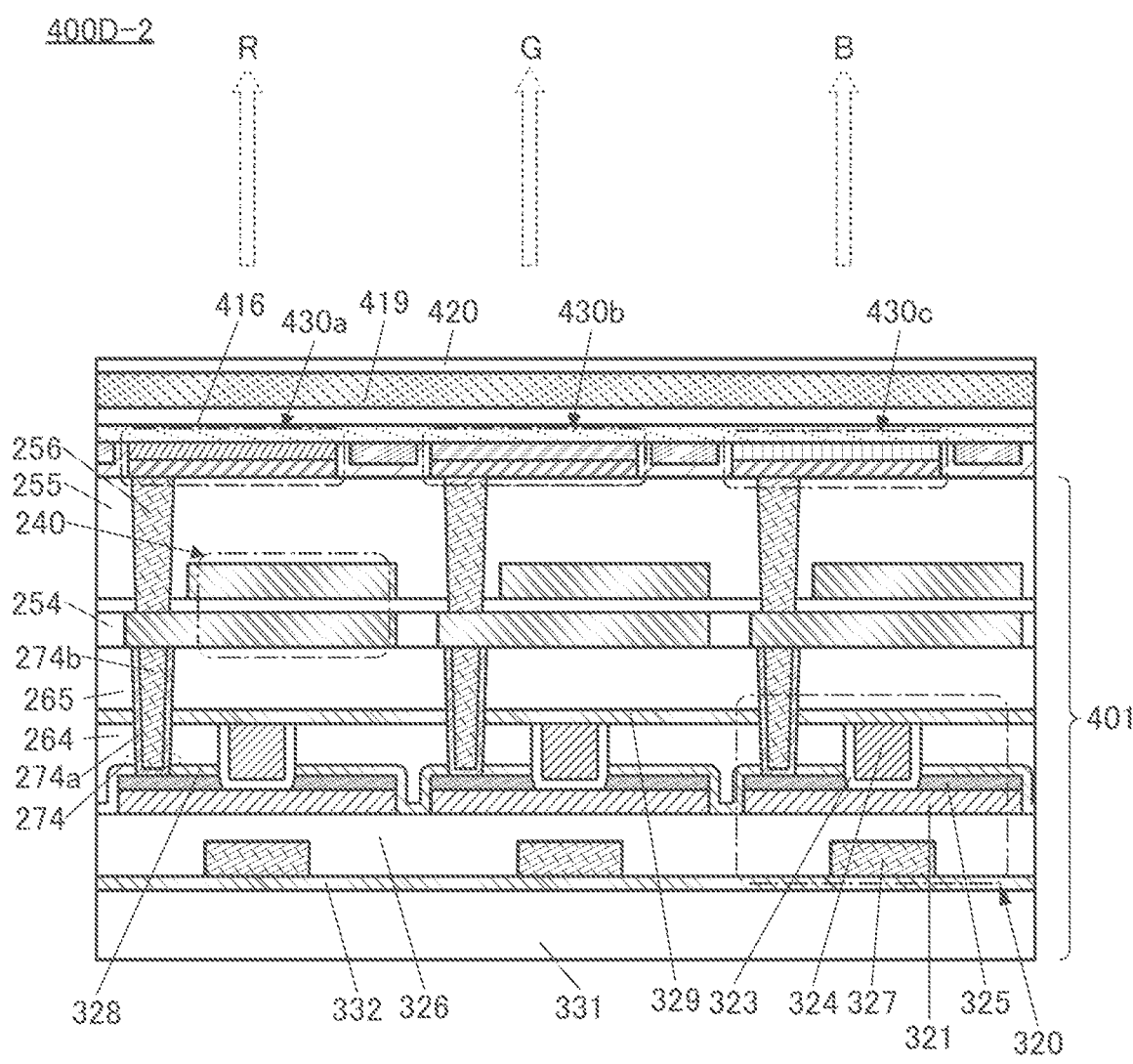
FIG. 32 is a cross-sectional view illustrating an example of the display device.

A display device 400D-2 illustrated in FIG. 32 is mainly different from the display device 400C-2 in the structure of the transistors. In addition, the display device 400D-2 is different from the display device 400D illustrated in FIG. 28 in using the structure including the insulating layer 130, which is described in Embodiment 1. Note that portions similar to those in the display device 400C and the display devices 400C-2 and 400D are not described in some cases.

The transistor 320 is a transistor that contains a metal oxide (also referred to as an oxide semiconductor) in a semiconductor layer where a channel is formed.

The transistor 320 includes the semiconductor layer 321, the insulating layer 323, the conductive layer 324, the pair of conductive layers 325, the insulating layer 326, and the conductive layer 327.

The insulating layer 332 is provided over the substrate 331.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics.

The pair of conductive layers 325 are provided over and in contact with the semiconductor layer 321 and function as a source electrode and a drain electrode.

The insulating layer 328 is provided to cover the top surface and side surface of the pair of conductive layers 325, the side surface of the semiconductor layer 321, and the like, and the insulating layer 264 is provided over the insulating layer 328.

The opening reaching the semiconductor layer 321 is provided in the insulating layer 328 and the insulating layer 264. The insulating layer 323 that is in contact with the side surfaces of the insulating layer 264, the insulating layer 328, and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that their heights are substantially equal to each other, and the insulating layer 329 and the insulating layer 265 are provided to cover these layers.

The plug 274 electrically connected to one of the pair of conductive layers 325 is provided to be embedded in the insulating layer 265, the insulating layer 329, and the insulating layer 264.

The structures of the insulating layer 254 and the components thereover up to the substrate 420 in the display device 400D-2 are similar to those in the display device 400C-2.

[Display Device 400E]

Figure 33:
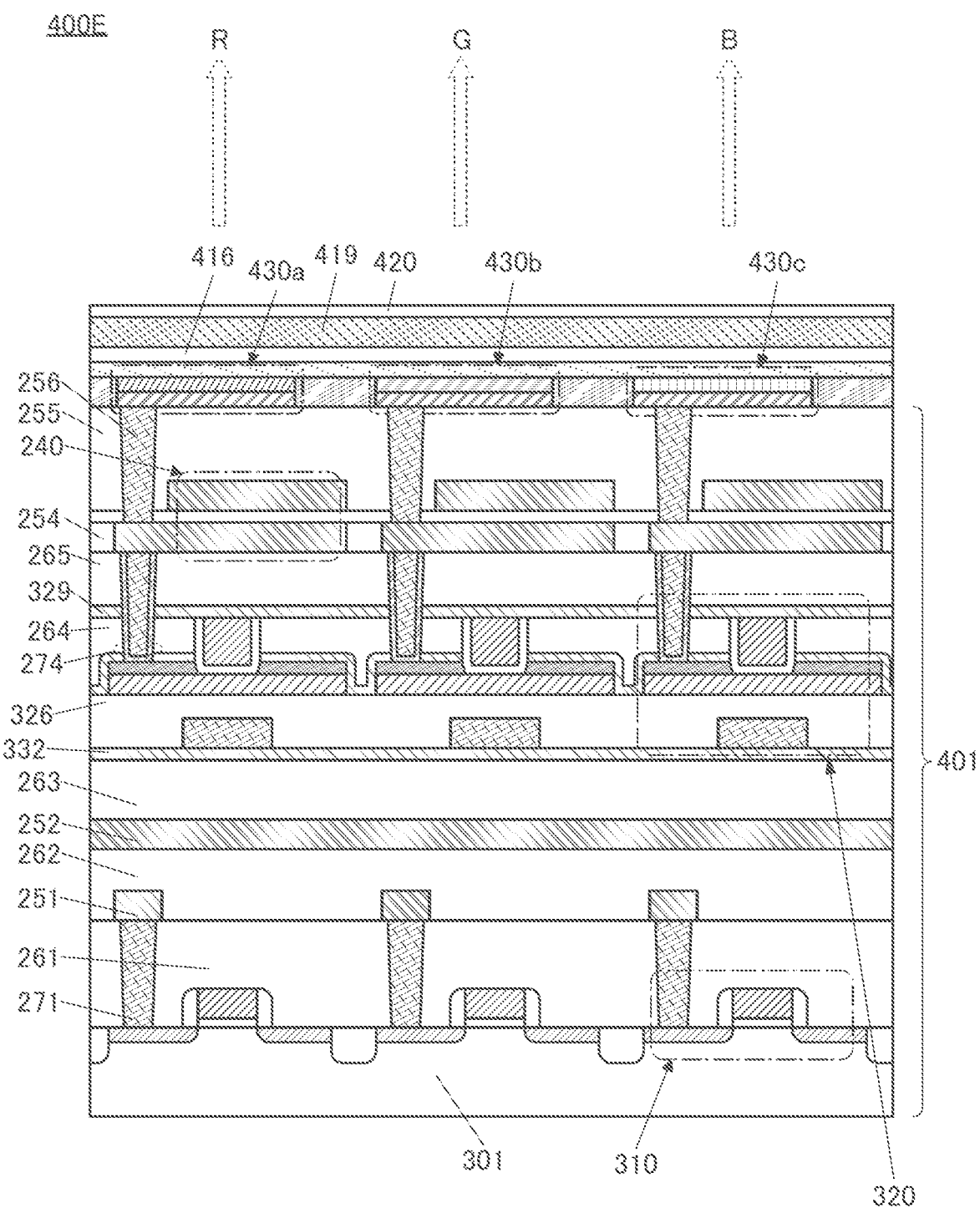
FIG. 33 is a cross-sectional view illustrating an example of the display device.

The display device 400E illustrated in FIG. 33 has a structure in which the transistor 310 whose channel is formed in the substrate 301 and the transistor 320 including a metal oxide in the semiconductor layer where the channel is formed are stacked. Note that portions similar to those in the display devices 400C and 400D are not described in some cases.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting elements; thus, the display device can be downsized as compared with the case where a driver circuit is provided around a display region.

[Display Device 400E-2]

Figure 34:
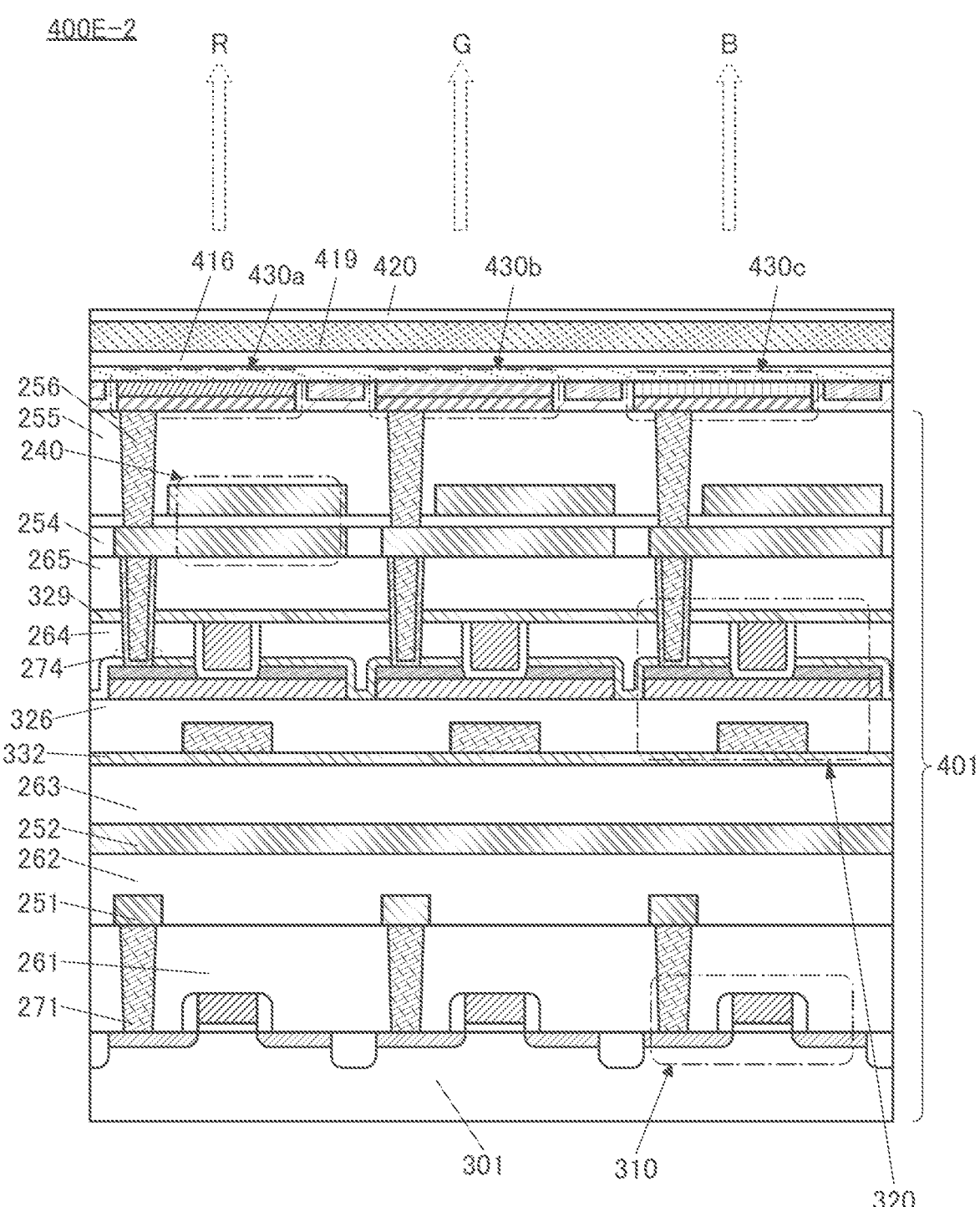
FIG. 34 is a cross-sectional view illustrating an example of the display device.

A display device 400E-2 illustrated in FIG. 34 has a structure in which the transistor 310 whose channel is formed in the substrate 301 and the transistor 320 including a metal oxide in the semiconductor layer where the channel is formed are stacked. The display device 400E-2 illustrated in FIG. 34 is different from the display device 400E illustrated in FIG. 33 in using the structure including the insulating layer 130, which is described in Embodiment 1. Note that portions similar to those in the display devices 400C, 400D, 400C-2, 400D-2, and 400E are not described in some cases.

The insulating layer 261 is provided to cover the transistor 310, and the conductive layer 251 is provided over the insulating layer 261. The insulating layer 262 is provided to cover the conductive layer 251, and the conductive layer 252 is provided over the insulating layer 262. The conductive layer 251 and the conductive layer 252 each function as a wiring. The insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

At least part of the structure examples, the drawings corresponding thereto, and the like described in this embodiment as an example can be combined with the other structure examples, the other drawings, and the like as appropriate.

Embodiment 4

In this embodiment, light-emitting elements (also referred to as light-emitting devices) that can be used in a display device that is one embodiment of the present invention will be described.

<Structure Example of Light-Emitting Element>

Figure 35A:
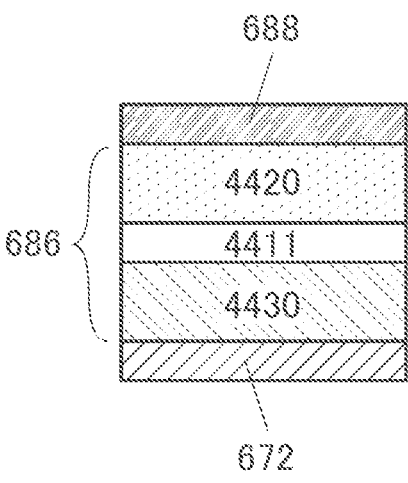
FIG. 35A to FIG. 35D are diagrams illustrating structure examples of a light-emitting element.

As shown in FIG. 35A, the light-emitting element includes an EL layer 686 between a pair of electrodes (a lower electrode 672 and an upper electrode 688). The EL layer 686 can be formed of a plurality of layers, e.g., a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can serve as a single light-emitting unit, and the structure in FIG. 35A is referred to as a single structure in this specification.

Figure 35B:
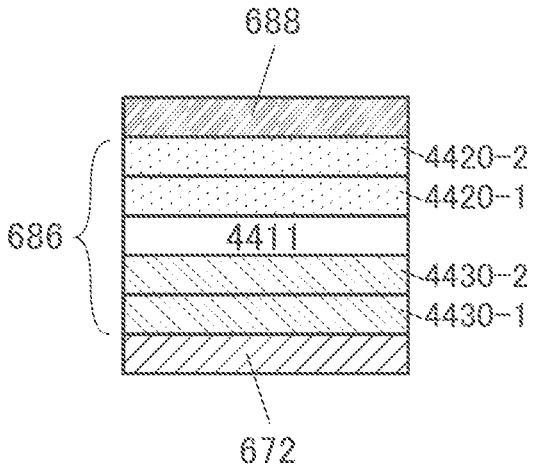

FIG. 35B shows a modification example of the EL layer 686 included in the light-emitting element shown in FIG. 35A. Specifically, the light-emitting element shown in FIG. 35B includes a layer 4430-1 over the lower electrode 672, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 688 over the layer 4420-2. For example, when the lower electrode 672 functions as an anode and the upper electrode 688 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 672 functions as a cathode and the upper electrode 688 functions as an anode, the layer 4430-1 functions as an electron-injection layer, the layer 4430-2 functions as an electron-transport layer, the layer 4420-1 functions as a hole-transport layer, and the layer 4420-2 functions as the hole-injection layer. With such a layer structure, carriers can be efficiently injected to the light-emitting layer 4411, and the efficiency of the recombination of carriers in the light-emitting layer 4411 can be enhanced.

Figure 35C:
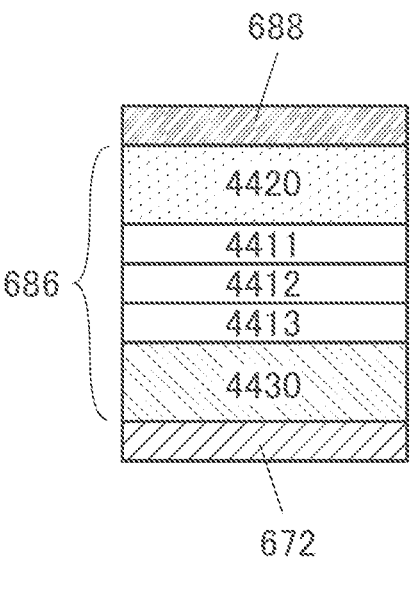

Note that the structure in which a plurality of light-emitting layers (a light-emitting layer 4411, a light-emitting layer 4412, and a light-emitting layer 4413) is provided between the layer 4420 and the layer 4430 as shown in FIG. 35C is another variation of the single structure.

Figure 35D:
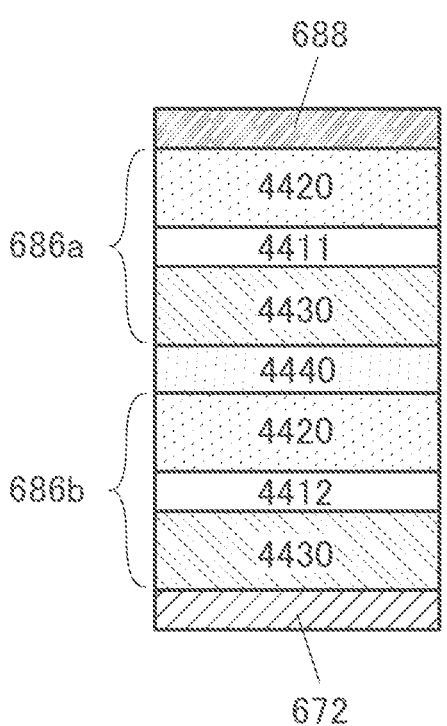

The structure in which a plurality of light-emitting units (an EL layer 686a and an EL layer 686b) is connected in series with an intermediate layer (charge-generation layer) 4440 therebetween as shown in FIG. 35D is referred to as a tandem structure in this specification. In this specification and the like, the structure shown in FIG. 35D is referred to as a tandem structure; however, without being limited to this, a tandem structure may be referred to as a stack structure, for example. The tandem structure enables a light-emitting element capable of high luminance light emission.

In FIG. 35C and FIG. 35D, the layer 4420 and the layer 4430 may each have a stacked-layer structure of two or more layers as in FIG. 35B.

In the case where the single structure and the tandem structure described above and an SBS structure describe later are compared with each other, the SBS structure, the tandem structure, and the single structure have lower consumption in this order. To reduce power consumption, the SBS structure is preferably employed. Meanwhile, the single structure and the tandem structure are preferable in terms of lower manufacturing cost or higher manufacturing yield because the manufacturing processes of the single structure and the tandem structure are simpler than that of the SBS structure.

The emission color of the light-emitting element can be red, green, blue, cyan, magenta, yellow, white, or the like depending on the material that constitutes the EL layer 686. Furthermore, the color purity can be further increased when the light-emitting element has a microcavity structure.

The light-emitting element that emits white light preferably contains two or more kinds of light-emitting substances in the light-emitting layer. To obtain white light emission, two or more kinds of light-emitting substances are selected such that their emission colors are complementary. For example, when the emission color of a first light-emitting layer and the emission color of a second light-emitting layer have a relationship of complementary colors, it is possible to obtain the light-emitting element which emits white light as a whole. This can be applied to a light-emitting element including three or more light-emitting layers.

The light-emitting layer preferably contains two or more selected from light-emitting substances that emit light of red (R), green (G), blue (B), yellow (Y), orange (O), and the like. A light-emitting substance that emits light of violet, bluish violet, yellowish blue, near infrared, and the like may be included. Alternatively, the light-emitting layer preferably contains two or more light-emitting substances that emit light containing two or more of color spectral components of red, green, and blue.

At least part of the structure examples, the drawings corresponding thereto, and the like described in this embodiment as an example can be combined with the other structure examples, the other drawings, and the like as appropriate.

Embodiment 5

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, and the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, or the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[Nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS and an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS contains avoid or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$), and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1 \times 10^{18}$ atoms/cm$^3$, preferably lower than or equal to $2 \times 10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 6

In this embodiment, electronic devices of one embodiment of the present invention are described with reference to FIG. 36A to FIG. 39F.

An electronic device in this embodiment includes the display device of one embodiment of the present invention. For the display device of one embodiment of the present invention, increases in resolution, definition, and sizes are easily achieved. Thus, the display device of one embodiment of the present invention can be used for display portions of a variety of electronic devices.

The display device of one embodiment of the present invention can be manufactured at low cost, which leads to a reduction in manufacturing cost of an electronic device.

Examples of electronic devices include electronic devices with a relatively large screen, such as a television device, a desktop or laptop personal computer, a monitor of a computer or the like, digital signage, and a large game machine (e.g., a pachinko machine); a camera such as a digital camera or a digital video camera; a digital photo frame; a mobile phone; a portable game console; a portable information terminal; and an audio reproducing device.

In particular, a display device of one embodiment of the present invention can have a high resolution, and thus can be favorably used for an electronic device having a relatively small display portion. As such an electronic device, a watch-type or bracelet-type information terminal device (wearable device); and a wearable device worn on a head, such as a device for VR such as a head mounted display and a glasses-type device for AR can be given, for example. Examples of wearable devices include a device for SR and a device for MR.

The resolution of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, resolution of 4K2K, 8K4K, or higher is preferable. Furthermore, the pixel density (definition) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With such a display device with high resolution and high definition, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, the electronic device can display an image, information, and the like on a display portion. When the electronic device includes an antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 36A:
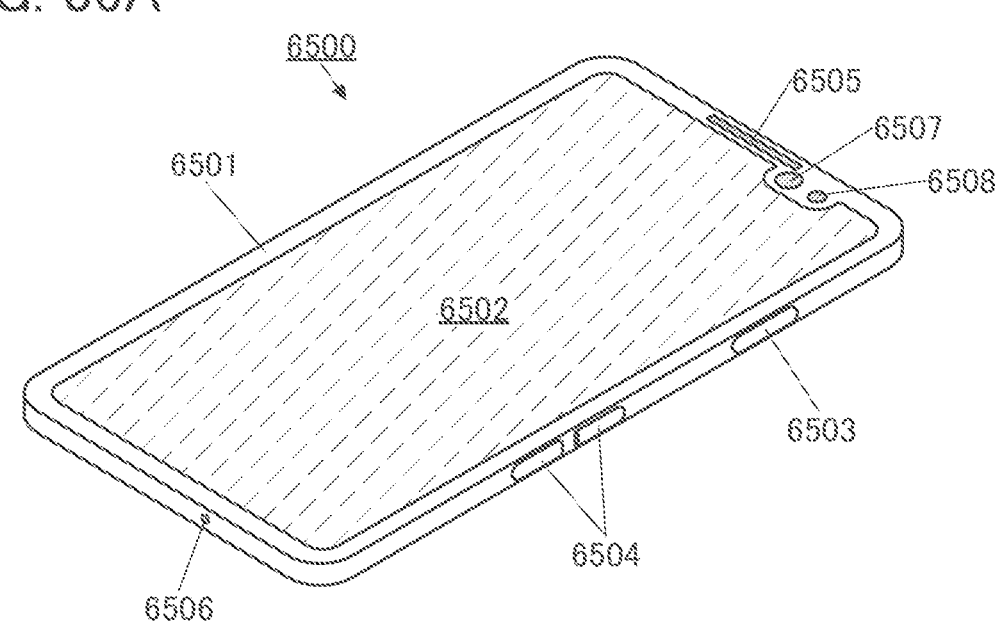
FIG. 36A and FIG. 36B are diagrams illustrating an examples of an electronic device.

An electronic device 6500 in FIG. 36A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 36B:
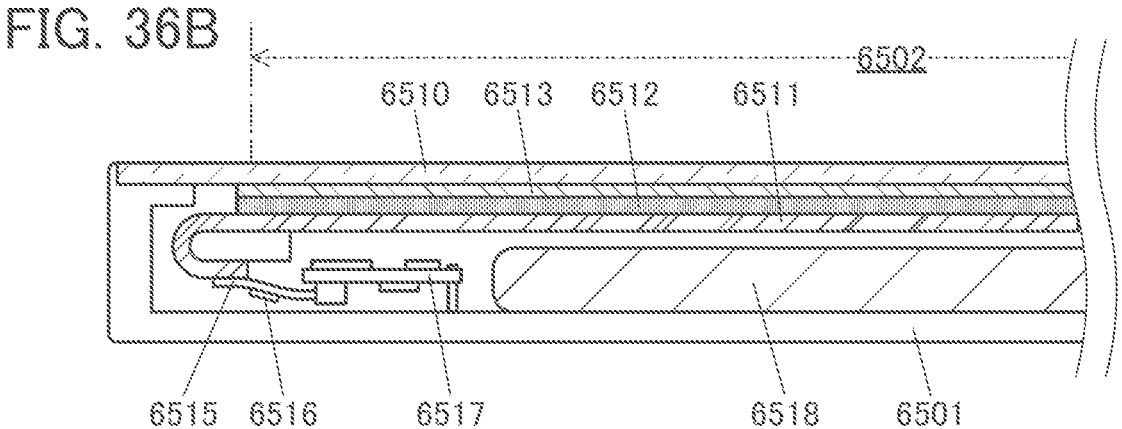

FIG. 36B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is controlled. Moreover, part of the display panel 6511 is folded back so that a connection portion with the FPC 6515 is provided on the back side of the pixel portion, whereby an electronic device with a narrow bezel can be achieved.

FIG. 37A illustrates an example of a television device. In a television device 7100, a display portion 7000 is incorporated in a housing 7101. Here, the housing 7101 is supported by a stand 7103.

The display device of one embodiment of the present invention can be used for the display portion 7000.

Operation of the television device 7100 illustrated in FIG. 37A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 37B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

FIG. 37C and FIG. 37D illustrate examples of digital signage.

A digital signage 7300 illustrated in FIG. 37C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 37D illustrates a digital signage 7400 mounted on a cylindrical pillar 7401. The digital signage 7400 includes the display portion 7000 provided along a curved surface of the pillar 7401.

The display device of one embodiment of the present invention can be used in the display portion 7000 illustrated in each of FIG. 37C and FIG. 37D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 37C and FIG. 37D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

FIG. 38A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video received from the camera 8000 and the like on the display portion 8102.

The button 8103 functions as a power supply button or the like.

A display device of one embodiment of the present invention can be used in the display portion 8002 of the camera 8000 and the display portion 8102 of the finder 8100. Note that a finder may be incorporated in the camera 8000.

FIG. 38B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing in the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

A display device of one embodiment of the present invention can be used in the display portion 8204.

FIG. 38C to FIG. 38E are external views of a head-mounted display 8300. The head-mounted display 8300 includes the housing 8301, the display portion 8302, the band-like fixing member 8304, and a pair of lenses 8305.

A user can see display on the display portion 8302 through the lenses 8305. The display portion 8302 is preferably curved so that the user can feel high realistic sensation. Another image displayed in another region of the display portion 8302 is viewed through the lenses 8305, so that three-dimensional display using parallax or the like can be performed. Note that the structure is not limited to the structure in which one display portion 8302 is provided; two display portions 8302 may be provided and one display portion may be provided per eye of the user.

The display device of one embodiment of the present invention can be used for the display portion 8302. The display device of one embodiment of the present invention achieves extremely high resolution. For example, a pixel is not easily seen by the user even when the user sees display that is magnified by the use of the lenses 8305 as illustrated in FIG. 38E. In other words, a video with a strong sense of reality can be seen by the user with use of the display portion 8302.

FIG. 38F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy images and sounds only when wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable in order to easily perform cleaning or replacement.

Electronic devices illustrated in FIG. 39A to FIG. 39F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 39A to FIG. 39F have a variety of functions. For example, the electronic device can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display device of one embodiment of the present invention can be used for the display portion 9001.

The electronic devices illustrated in FIG. 39A to FIG. 39F will be described in detail below.

Figure 39A:
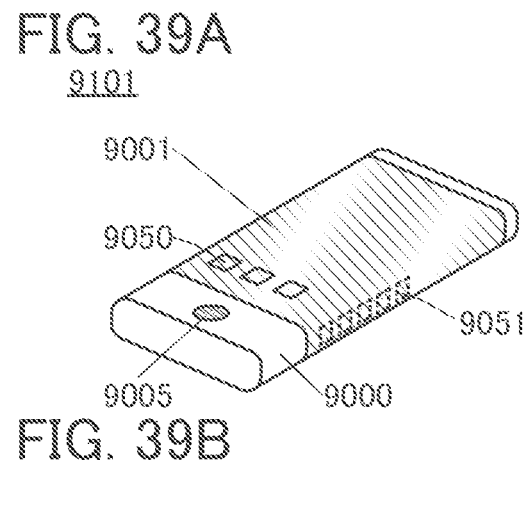
FIG. 39A to FIG. 39F are diagrams illustrating examples of electronic devices.

FIG. 39A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 39A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed at the position where the information 9051 is displayed.

Figure 39B:
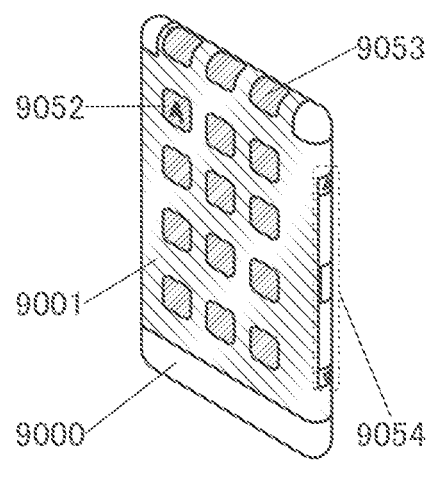

FIG. 39B is a perspective view showing a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 39C:
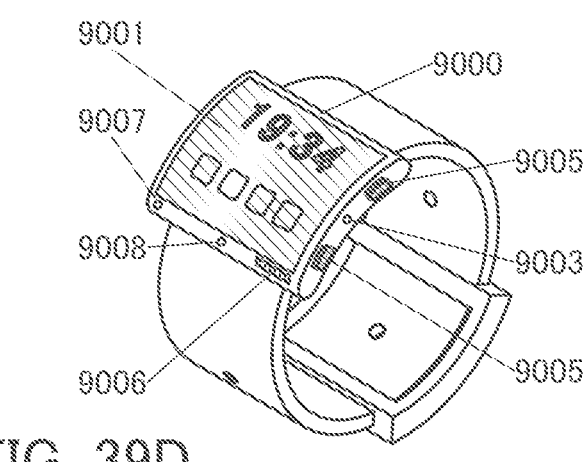

FIG. 39C is a perspective view illustrating a watch-type portable information terminal 9200. For example, the portable information terminal 9200 can be used as a Smart-watch (registered trademark). The display surface of the display portion 9001 is curved, and an image can be displayed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 39D:
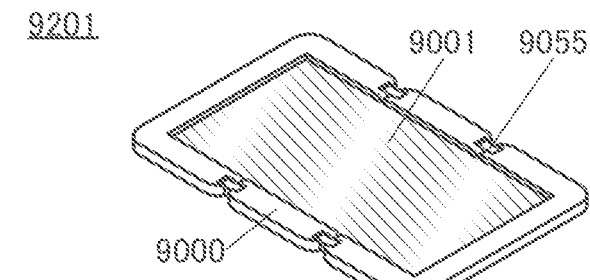
Figure 39E:
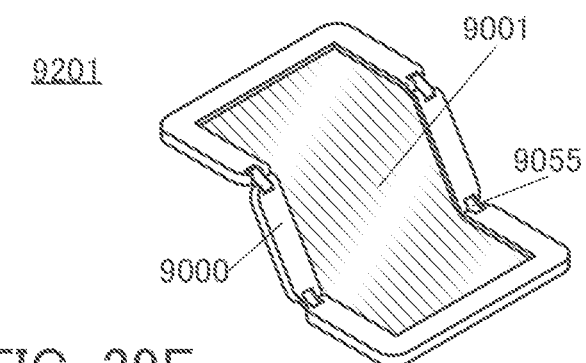
Figure 39F:
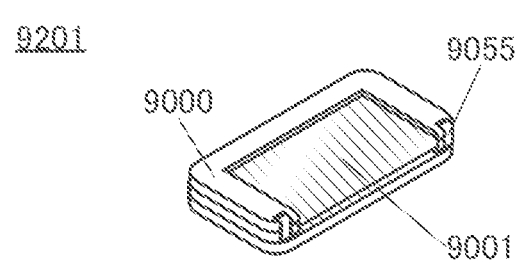

FIG. 39D to FIG. 39F are perspective views illustrating a foldable portable information terminal 9201. FIG. 39D is a perspective view of an opened state of the portable information terminal 9201, FIG. 39F is a perspective view of a folded state thereof, and FIG. 39E is a perspective view of a state in the middle of change from one of FIG. 39D and FIG. 39F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

REFERENCE NUMERALS

100: display device, 100A: display device, 100B: display device, 100C: display device, 101: substrate, 110: light-emitting element, 110B: light-emitting element, 110G: light-emitting element, 110R: light-emitting element, 111: pixel electrode, 111B: pixel electrode, 111f: conductive film, 111G: pixel electrode, 111R: pixel electrode, 112: EL layer, 112B: EL layer, 112Bf: EL film, 112G: EL layer, 112Gf: EL film, 112R: EL layer, 112Rf EL film, 113: common electrode, 114: common layer, 115: optical adjustment layer, 115B: optical adjustment layer, 115G: optical adjustment layer, 115R: optical adjustment layer, 121: protective layer, 130: insulating layer, 130f: insulating film, 131: insulating layer, 131f: insulating film, 143a: resist mask, 143b: resist mask, 143c: resist mask, 144a: sacrificial film, 144b: sacrificial film, 144c: sacrificial film, 145: sacrificial layer, 145a: sacrificial layer, 145b: sacrificial layer, 145c: sacrificial layer, 146a: protective film, 146b: protective film, 146c: protective film, 147: protective layer, 147a: protective layer, 147b: protective layer, 147c: protective layer, 201: transistor, 202: transistor, 204: connection portion, 205: transistor, 209: transistor, 210: transistor, 211: insulating layer, 212: insulating layer, 213: insulating layer, 214: insulating layer, 215: insulating layer, 218: insulating layer, 221: conductive layer, 222a: conductive layer, 222b: conductive layer, 223: conductive layer, 225: insulating layer, 228: region, 231: semiconductor layer, 231i: channel formation region, 231n: low-resistance region, 240: capacitor, 241: conductive layer, 242: connection layer, 243: insulating layer, 245: conductive layer, 251: conductive layer, 252: conductive layer, 254: insulating layer, 255: insulating layer, 256: plug, 261: insulating layer, 262: insulating layer, 263: insulating layer, 264: insulating layer, 265: insulating layer, 271: plug, 274: plug, 274a: conductive layer, 274b: conductive layer, 280: display module, 281: display portion, 282: circuit portion, 283: pixel circuit portion, 283a: pixel circuit, 284: pixel portion, 284a: pixel, 285: terminal portion, 286: wiring portion, 290: FPC, 291: substrate, 292: substrate, 301: substrate, 310: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 400A: display device, 400A-2: display device, 400B: display device, 400B-2: display device, 400C: display device, 400C-2: display device, 400D: display device, 400D-2: display device, 400E: display device, 400E-2: display device, 401: layer, 411a: pixel electrode, 411b: pixel electrode, 411c: pixel electrode, 414: layer, 415a: optical adjustment layer, 415b: optical adjustment layer, 415c: optical adjustment layer, 416: protective layer, 416a: EL layer, 416b: EL layer, 416c: EL layer, 417: light-blocking layer, 419: resin layer, 420: substrate, 421: insulating layer, 421a: insulating layer, 421b: insulating layer, 430a: light-emitting element, 430b: light-emitting element, 430c: light-emitting element, 442: adhesive layer, 443: space, 451: substrate, 452: substrate, 453: substrate, 454: substrate, 455: adhesive layer, 462: display portion, 464: circuit, 465: wiring, 466: conductive layer, 472: FPC, 473: IC, 672: electrode, 686: EL layer, 686a: EL layer, 686b: EL layer, 688: electrode, 4411: light-emitting layer, 4412: light-emitting layer, 4413: light-emitting layer, 4420: layer, 4420-1: layer, 4420-2: layer, 4430: layer, 4430-1: layer, 4430-2: layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200:

head-mounted display, 8201: mounting portion, 8202: lens, 8203: main body, 8204: display portion, 8205: cable, 8206: battery, 8300: head-mounted display, 8301: housing, 8302: display portion, 8304: fixing member, 8305: lens, 8400: head-mounted display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:

an insulating layer;

a first lower electrode;

a first EL layer over the first lower electrode;

a second lower electrode;

a second EL layer over the second lower electrode; and an upper electrode over the first EL layer, the second EL layer, and the insulating layer, wherein the first EL layer comprises a first light-emitting layer, wherein the second EL layer comprises a second light-emitting layer, wherein the first EL layer and the second EL layer are adjacent to each other, wherein an end portion of the first EL layer and an end portion of the first lower electrode are aligned with each other, wherein an end portion of the second EL layer and an end portion of the second lower electrode are aligned with each other, wherein the insulating layer comprises one of a resin and a precursor of the resin, and wherein the insulating layer comprises a region sandwiched between a first end face of the first EL layer and a second end face of the second EL layer.

2. The display device according to claim 1, wherein the resin comprises one or more selected from an acrylic resin, a polyimide resin, an epoxy resin, a polyamide resin, a polyimide-amide resin, a siloxane resin, a benzocyclobutene-based resin, and a phenol resin.

3. The display device according to claim 1, wherein the insulating layer is in contact with the first end face and the second end face.

4. The display device according to claim 1, wherein a top surface of the first EL layer, a top surface of the second EL layer, and a top surface of the insulating layer are aligned.

5. The display device according to claim 1, wherein a part of a top surface of the insulating layer is lower in height than a top surface of the first EL layer and a top surface of the second EL layer.

6. The display device according to claim 5, wherein the top surface of the insulating layer comprises a concave.

7. The display device according to claim 1, wherein a top surface of the insulating layer comprises a convex.

8. The display device according to claim 1, further comprising:

a common layer comprising an electron-injection layer or a hole-injection layer, wherein the common layer is in contact with a top surface of the first EL layer, a top surface of the second EL layer, and a top surface of the insulating layer.

9. The display device according to claim 1, further comprising:

a common layer comprising an electron-injection layer, wherein the first EL layer comprises a first electron-transport layer sandwiched between the first light-emitting layer and the common layer, wherein the second EL layer comprises a second electron-transport layer sandwiched between the second light-emitting layer and the common layer, and wherein the common layer is in contact with a top surface of the first EL layer, a top surface of the second EL layer, and a top surface of the insulating layer.

10. The display device according to claim 1, further comprising:

a common layer comprising an electron-injection layer and an electron-transport layer, wherein the common layer is in contact with a top surface of the first EL layer, a top surface of the second EL layer, and a top surface of the insulating layer.

11. The display device according to claim 1, wherein the first light-emitting layer comprises a first light-emitting substance that emits light of a first color selected from blue, purple, bluish purple, green, yellowish green, yellow, orange, and red, and wherein the second light-emitting layer comprises a second light-emitting substance that emits light of a second color which is selected from blue, purple, bluish purple, green, yellowish green, yellow, orange, and red and is different from the first color.

12. The display device according to claim 1, wherein the insulating layer comprises a first layer comprising an inorganic material and a second layer comprising the one of the resin and the precursor of the resin, wherein the first layer is in contact with the first end face of the first EL layer, a first end face of the first lower electrode, a second end face of the second lower electrode, and the second end face of the second EL layer, and wherein the second layer is provided over and in contact with the first layer and positioned below the upper electrode.

13. A display device comprising:

a first pixel; and a second pixel positioned adjacent to the first pixel with an insulating layer provided therebetween, wherein the first pixel comprises a first light-emitting element comprising a first pixel electrode, a first EL layer over the first pixel electrode, and a common electrode over the first EL layer, wherein the second pixel comprises a second light-emitting element comprising a second pixel electrode, a second EL layer over the second pixel electrode, and the common electrode over the second EL layer, wherein an end portion of the first EL layer and an end portion of the first pixel electrode are aligned with each other, wherein an end portion of the second EL layer and an end portion of the second pixel electrode are aligned with each other, wherein the insulating layer comprises a first layer and a second layer provided over the first layer, wherein a side surface of the first pixel electrode, a side surface of the first EL layer, a side surface of the second pixel electrode, and a side surface of the second EL layer are in contact with the first layer, wherein the second layer is provided in contact with the first layer and positioned below the common electrode, wherein the first layer comprises an inorganic material, and wherein the second layer comprises one of a resin and a precursor of the resin.

14. The display device according to claim 13, wherein a top surface of the first EL layer, a top surface of the second EL layer, a top surface of the first layer, and a top surface of the second layer are in contact with the common electrode.

15. A display device comprising:

a first pixel; and a second pixel positioned adjacent to the first pixel with an insulating layer provided therebetween, wherein the first pixel comprises a first light-emitting element comprising a first pixel electrode, a first EL layer over the first pixel electrode, a common layer over the first EL layer, and a common electrode over the common layer, wherein the second pixel comprises a second light-emitting element comprising a second pixel electrode, a second EL layer over the second pixel electrode, the common layer over the second EL layer, and the common electrode over the common layer, wherein an end portion of the first EL layer and an end portion of the first pixel electrode are aligned with each other, wherein an end portion of the second EL layer and an end portion of the second pixel electrode are aligned with each other, wherein the insulating layer comprises a first layer and a second layer provided over the first layer, wherein a side surface of the first pixel electrode, a side surface of the first EL layer, a side surface of the second pixel electrode, and a side surface of the second EL layer are in contact with the first layer, wherein the second layer is provided in contact with the first layer and positioned below the common electrode, wherein the first layer comprises an inorganic material, wherein the second layer comprises one of a resin and a precursor of the resin, and wherein a top surface of the first EL layer, a top surface of the second EL layer, a top surface of the first layer, and a top surface of the second layer are in contact with the common layer.

16. The display device according to claim 13, wherein in a cross-sectional view of the display device, the first layer comprises a region protruding above at least one of a top surface of the first EL layer and a top surface of the second EL layer.

17. The display device according to claim 13, wherein in a cross-sectional view of the display device, at least one of the first EL layer and the second EL layer comprises a region protruding above a top surface of the first layer.

18. The display device according to claim 13, wherein in a cross-sectional view of the display device, a top surface of the second layer has a concave shape.

19. The display device according to claim 13, wherein in a cross-sectional view of the display device, a top surface of the second layer has a convex shape.

20. The display device according to claim 13, wherein the resin comprises one or more selected from an acrylic resin, a polyimide resin, an epoxy resin, a polyamide resin, a polyimide-amide resin, a siloxane resin, a benzocyclobutene-based resin, and a phenol resin.

\* \* \* \* \*